(12) United States Patent
Seo et al.

(10) Patent No.: US 9,252,380 B2
(45) Date of Patent: Feb. 2, 2016

(54) LIGHT-EMITTING DEVICE AND LIGHTING DEVICE

(75) Inventors: Satoshi Seo, Kanagawa (JP); Takahiro Ushikubo, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 724 days.

(21) Appl. No.: 13/425,954

(22) Filed: Mar. 21, 2012

(65) Prior Publication Data

US 2012/0241794 A1  Sep. 27, 2012

(30) Foreign Application Priority Data

Mar. 23, 2011 (JP) ................................. 2011-063867

(51) Int. Cl.
*H05B 33/00* (2006.01)
*H01L 51/50* (2006.01)
*H01L 51/00* (2006.01)

(52) U.S. Cl.
CPC ............ *H01L 51/5044* (2013.01); *H01L 51/006* (2013.01); *H01L 51/0061* (2013.01); *H01L 51/0074* (2013.01); *H01L 51/0085* (2013.01); *H01L 2251/5376* (2013.01); *H01L 2251/558* (2013.01)

(58) Field of Classification Search
CPC .............. H01L 51/5044; H01L 51/006; H01L 51/0061; H01L 51/0074
USPC ......................................................... 313/504
See application file for complete search history.

(56) References Cited

U.S. PATENT DOCUMENTS

| 7,560,862 B2 | 7/2009 | Liao et al. |
| 7,663,140 B2 | 2/2010 | Yamazaki et al. |
| 8,076,671 B2 | 12/2011 | Yamazaki et al. |

(Continued)

FOREIGN PATENT DOCUMENTS

| CN | 101924123 | 12/2010 |
| JP | 2006-12793 | 1/2006 |

(Continued)

OTHER PUBLICATIONS

Matsumoto, T. et al, "27.5L: Late-News Paper: Multiphoton Organic EL Device Having Charge Generation Layer," SID Digest '03: SID International Symposium Digest of Technical Papers, vol. 34, 2003, pp. 979-981.

(Continued)

*Primary Examiner* — Andrew Coughlin
(74) *Attorney, Agent, or Firm* — Husch Blackwell LLP

(57) ABSTRACT

To improve power efficiency of a light-emitting element for white emission even when light in a wavelength range of low luminosity is utilized. As a light-emitting element for white emission, three light-emitting layers are stacked. In such a light-emitting element, the three light-emitting layers are included between a light-transmitting electrode and a light-reflecting electrode, and light emitted from each light-emitting layer is reflected on the light-reflecting electrode and is transmitted through the light-transmitting electrode. In addition, the light-emitting layer closer to the light-reflecting electrode has a shorter optical path length. Thus, the position of each light-emitting layer is limited depending on the distance from the light-reflective electrode, and the optical path length of each light-emitting layer is adjusted; therefore the light-emitting element with high power efficiency can be provided.

25 Claims, 15 Drawing Sheets

(56) References Cited

U.S. PATENT DOCUMENTS

| | | | | |
|---|---|---|---|---|
| 2003/0189401 A1* | 10/2003 | Kido et al. | ............... | 313/504 |
| 2007/0176161 A1 | 8/2007 | Seo et al. | | |
| 2009/0026917 A1* | 1/2009 | Ikeda et al. | ............... | 313/503 |
| 2009/0051273 A1 | 2/2009 | Tsuji et al. | | |
| 2009/0261360 A1 | 10/2009 | Yasukawa et al. | | |
| 2010/0090243 A1* | 4/2010 | Cho et al. | ............... | 257/98 |
| 2010/0140645 A1 | 6/2010 | Shibata | | |
| 2010/0314636 A1 | 12/2010 | Matsunami et al. | | |
| 2011/0291088 A1 | 12/2011 | Seo et al. | | |

FOREIGN PATENT DOCUMENTS

| | | |
|---|---|---|
| JP | 2006-228712 | 8/2006 |
| JP | 2007 012369 | 1/2007 |
| JP | 2008-518400 | 5/2008 |
| JP | 2009-181755 | 8/2009 |
| JP | 2009-301731 | 12/2009 |
| JP | 2010-161071 | 7/2010 |
| JP | 2010-287484 | 12/2010 |
| KR | 10-2007-0094864 | 9/2007 |
| KR | 10-2010-0133890 | 12/2010 |
| WO | WO 2006/078005 A1 | 7/2006 |
| WO | WO 2006/093007 A1 | 9/2006 |

OTHER PUBLICATIONS

International Search Report for WO application PCT/JP2012/056800, mailing date Jun. 19, 2012.

Written Opinion of the International Searching Authority for WO application PCT/JP2012/056800, mailing date Jun. 19, 2012.

* cited by examiner

LIGHT-EMITTING DEVICE AND LIGHTING DEVICE

TECHNICAL FIELD

One embodiment of the present invention relates to light-emitting elements that utilize electroluminescence. Further, one embodiment of the present invention relates to light-emitting devices or lighting devices which includes the light-emitting elements.

BACKGROUND ART

In recent years, research and development have been actively conducted on light-emitting elements utilizing electroluminescence. In a basic structure of the light-emitting element utilizing electroluminescence, a layer containing a light-emitting substance (hereinafter, the layer is referred to as a "light-emitting layer") is sandwiched between a pair of electrodes. By applying voltage between the electrodes of the light-emitting element, light can be emitted from the light-emitting substance.

Among light-emitting elements utilizing electroluminescence, a light-emitting element in which an organic compound is used as a light-emitting substance can be formed by stacking thin films. Thus, the thickness and weight of the light-emitting element can be reduced and the area thereof can be easily made larger. For that reason, the light-emitting element is expected to be used for an area light source. Further, the light-emitting element is expected to exhibit emission efficiency higher than that of an incandescent lamp or a fluorescent lamp, and thus has attracted attentions as a light-emitting element suitable for lighting devices.

The light-emitting element can emit light with a variety of colors depending on the kind of light-emitting substance. In particular, in consideration of application to a lighting device, a light-emitting element which can emit white light or light of color close to white with high efficiency has been expected.

As a light-emitting element which can emit white light, for example, a white light-emitting element in which a plurality of light-emitting units having emission peaks in the red, green, and blue wavelength ranges are stacked has been proposed (e.g., Patent Document 1). In addition, a white light-emitting element in which two light-emitting layers having emission peaks in the wavelength ranges of complementary colors (e.g., blue and yellow) are stacked has been proposed (e.g., Patent Document 2).

REFERENCE

Patent Document 1: Japanese Translation of PCT International Application No. 2008-518400
Patent Document 2: Japanese Published Patent Application No. 2006-12793

DISCLOSURE OF INVENTION

The above white light-emitting element in which the plurality of light-emitting layers having emission peaks in the red, green, and blue wavelength ranges are stacked can emit white light because the wavelength ranges of red and blue of low luminosity are used.

Further, in the light-emitting element described above in which the two light-emitting layers which have emission peaks in the wavelength ranges of complementary colors (e.g., blue and yellow) are stacked, the amount of light of low luminosity color (e.g., blue) is made larger than that of the other color, whereby the light-emitting element can emit white light.

As described above, the previously-proposed light-emitting elements which can emit white light had to use a certain amount of light in a wavelength range of low luminosity. For that reason, there was a limit to improvement in power efficiency. That is because the luminous flux [lm] included in the unit of power efficiency [lm/W] is the physical quantity considering the luminosity.

In addition, the light-emitting element that exhibits white emission has problems of an increase in the amount of organic materials used in light-emitting layers and an increase of evaporation time spent for formation of the light-emitting layers, because a plurality of light-emitting layers are stacked.

In view of such problems, it is an object of one embodiment of the present invention to improve power efficiency of a light-emitting element, even when light in a wavelength range of low luminosity is utilized for the light-emitting element that exhibits white emission. Further, it is another object of one embodiment of the present invention to reduce the amount of organic materials used for light-emitting layers so as to reduce a manufacturing cost. Furthermore, it is another object of one embodiment of the present invention to provide a lighting device including the light-emitting element as a light source.

One embodiment of the present invention relates to a light-emitting element in which three light-emitting layers are stacked, as a light-emitting element which can emit white light. In such a light-emitting element, three light-emitting layers are included between a light-transmitting electrode and a light-reflecting electrode, and light emitted from each light-emitting layer is reflected on the light-reflecting electrode and is transmitted through the light-transmitting electrode. For this reason, the wavelength of light emitted from each light-emitting layer is decided, and thus the stack order of the three light-emitting layers is limited. In addition, an optical path length between a light-reflecting electrode and each light-emitting layer is decided, and thereby a light-emitting element with high power efficiency can be provided. In addition, a light-emitting element is provided, in which the amount of organic materials used for light-emitting layers is reduced. Details thereof will be described below.

One embodiment of the present invention is a light-emitting element including a light-transmitting electrode and a light-reflecting electrode; and a first light-emitting layer, a second light-emitting layer, a third light-emitting layer, a first intermediate layer, and a second intermediate layer between the light-transmitting electrode and the light-reflecting electrode, and in the light-emitting element, the first light-emitting layer is formed between the light-transmitting electrode and the first intermediate layer; the second light-emitting layer is formed between the first intermediate layer and the second intermediate layer; the third light-emitting layer is formed between the second intermediate layer and the light-reflecting electrode; a peak of a spectrum of light emitted from the first light-emitting layer is located on a longer wavelength side as compared to a peak of a spectrum of light emitted from the second light-emitting layer and a peak of a spectrum of light emitted from the third light-emitting layer; and the peak of the spectrum of the light emitted from the second light-emitting layer is located on a shorter wavelength side as compared to the peak of the spectrum of the light emitted from the first light-emitting layer and the peak of the spectrum of the light emitted from the third light-emitting layer. Note that in this specification, a peak of an emission spectrum refers to the highest emission intensity peak of a plurality of peaks in an emission spectrum.

Another embodiment of the present invention is a light-emitting element including a light-transmitting electrode and a light-reflecting electrode; a first light-emitting layer, a second light-emitting layer, a third light-emitting layer, a first intermediate layer, and a second intermediate layer between the light-transmitting electrode and the light-reflecting electrode, and in the light-emitting element, the first light-emitting layer is formed between the light-transmitting electrode and the first intermediate layer; the second light-emitting layer is formed between the first intermediate layer and the second intermediate layer; the third light-emitting layer is formed between the second intermediate layer and the light-reflecting electrode; a peak of a spectrum of light emitted from the first light-emitting layer is located on a longer wavelength side as compared to a peak of a spectrum of light emitted from the second light-emitting layer and a peak of a spectrum of light emitted from the third light-emitting layer; the peak of the spectrum of the light emitted from the second light-emitting layer is located on a shorter wavelength side as compared to the peak of the spectrum of the light emitted from the first light-emitting layer and the peak of the spectrum of the light emitted from the third light-emitting layer; an optical path length between the light-reflecting electrode and the first light-emitting layer is three fourths of a peak wavelength of the light emitted from the first light-emitting layer; an optical path length between the light-reflecting electrode and the second light-emitting layer is three fourths of a peak wavelength of the light emitted from the second light-emitting layer; and an optical path length between the light-reflecting electrode and the third light-emitting layer is one fourth of a peak wavelength of the light emitted from the third light-emitting layer. Note that in this specification, a peak wavelength of an emission spectrum refers to a wavelength of the highest emission intensity peak of a plurality of peaks in an emission spectrum.

Note that the optical path length (also referred to as optical distance) is expressed as a product of an actual distance and a refractive index, and in this specification and the like, is a product of an actual thickness and n (refractive index), that is, an optical path length=actual thickness×n.

In each structure described above, the first light-emitting layer includes a light-emitting substance with an emission peak in a wavelength range (560 nm or more and less than 620 nm) of yellow to orange light, and the light-emitting substance may be a phosphorescent compound. The power efficiency in the case of using a phosphorescent compound is three to four times as high as that in the case of using a fluorescent compound. In addition, the lifetime of an element in which a phosphorescent compound which emits yellow or orange light is used is easily increased as compared to an element in which a phosphorescent compound which emits blue light is used.

In each structure described above, the second light-emitting layer includes a light-emitting substance with an emission peak in a wavelength range (400 nm or more and less than 480 nm) of blue light, and the light-emitting substance may be a fluorescent compound. The use of a fluorescent compound as the substance which emits blue light makes it possible to obtain a light-emitting element which has a longer lifetime than a light-emitting element in which a phosphorescent compound is used as the substance which emits blue light.

In each structure described above, the third light-emitting layer includes a light-emitting substance, and light emitted from the light-emitting substance may have a wavelength shorter than or equal to that of light emitted from the first light-emitting layer.

In each structure described above, the total thickness of the first light-emitting layer, the second light-emitting layer, the third light-emitting layer, the first intermediate layer, and the second intermediate layer may be 400 nm or less. In addition, the light-reflecting electrode may be a cathode. By reducing the total thickness of the first light-emitting layer, the second light-emitting layer, the third light-emitting layer, the first intermediate layer, and the second intermediate layer to 400 nm or less, the amount of organic materials used in the light-emitting layers can be reduced. Thus, a thinned light-emitting element can be obtained.

In addition, another embodiment of the present invention is a lighting device including the light-emitting element having any of the above-described structures.

In the specification and the like, a light-emitting layer includes at least a light-emitting substance. The light-emitting layer may include a functional layer or the like in addition to the light-emitting substance.

In accordance with one embodiment of the present invention, a light-emitting element that exhibits white emission, in which three light-emitting layers are stacked, can achieve high power efficiency. Further, a light-emitting element in which the amount of organic materials used for the light-emitting layers is reduced can be provided.

Furthermore, since the light-emitting element has high power efficiency, it can be used as light sources of indoor lighting devices and outdoor lighting devices. The use of such a light-emitting element makes it possible to provide lighting devices which have high power efficiency and consume less power.

BEST MODE FOR CARRYING OUT THE INVENTION (Embodiment 1)

In this embodiment, an example of a structure of a light-emitting element will be described with reference to FIG. 1.

Figure 1:
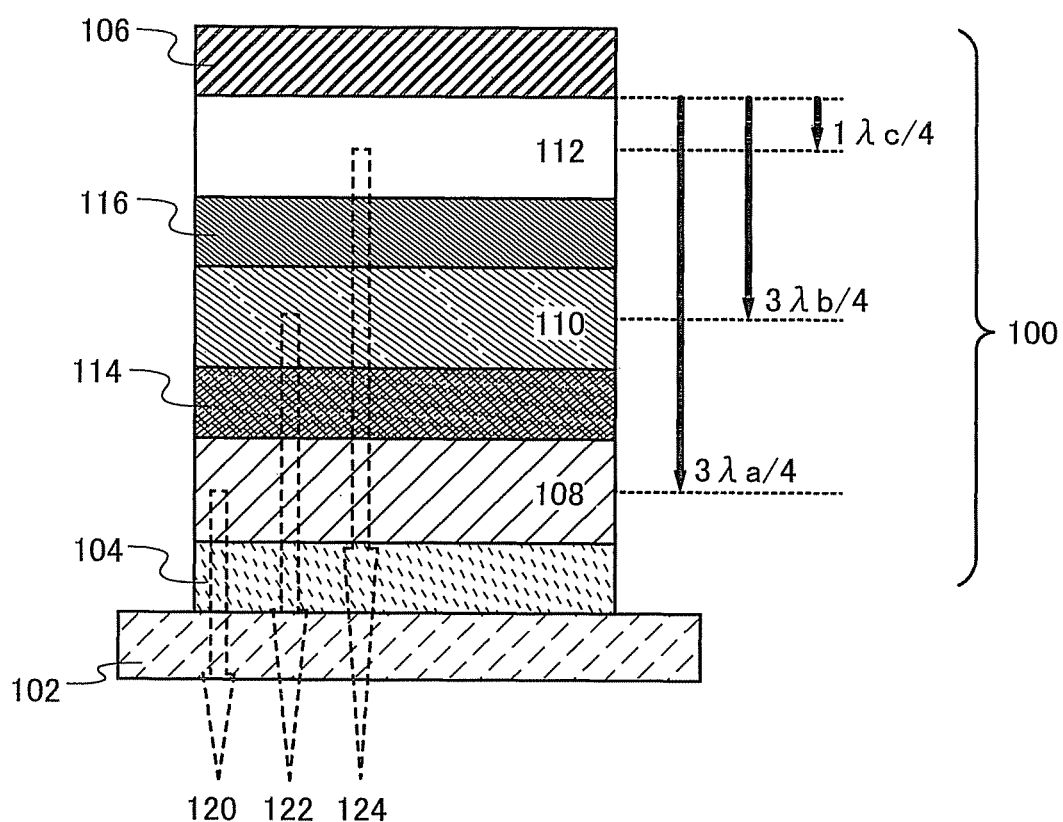
FIG. 1 illustrates an example of a light-emitting element in accordance with one embodiment of the present invention.

A light-emitting element 100 illustrated in FIG. 1 includes a light-transmitting electrode 104 and a light-reflecting electrode 106, and further a first light-emitting layer 108, a second light-emitting layer 110, a third light-emitting layer 112, a first intermediate layer 114, and a second intermediate layer 116 between the light-transmitting electrode 104 and the light-reflecting electrode 106. The first light-emitting layer 108 is located between the light-transmitting electrode 104 and the first intermediate layer 114. The second light-emitting layer 110 is located between the first intermediate layer 114 and the second intermediate layer 116. The third light-emitting layer 112 is located between the second intermediate layer 116 and the light-reflecting electrode 106. Note that the first light-emitting layer 108, the second light-emitting layer 110, and the third light-emitting layer 112 are stacked and connected in series with the first intermediate layer 114 and the second intermediate layer 116 therebetween. In this manner, the light-emitting element includes a stacked-layer of the first light-emitting layer 108, the second light-emitting layer 110, and the third light-emitting layer 112 and thus is referred to as a stack-type light-emitting element. In addition, the light-transmitting electrode can serve as an anode, while the light-reflecting electrode can serve as a cathode.

Light emitted from the first light-emitting layer 108 has the longest peak wavelength, as compared with light emitted from the second light-emitting layer 110 and the third light-emitting layer 112. Light emitted from the second light-emitting layer 110 has the shortest peak wavelength, as compared with light emitted from the first light-emitting layer 108 and the third light-emitting layer 112. In addition, light emitted from the third light-emitting layer 112 may have a wavelength shorter than or equal to the wavelength of light emitted from the first light emitting layer 108.

Such a structure in which light emitted from the first light-emitting layer 108 has the longest peak wavelength and light emitted from the second light-emitting layer 110 has the shortest peak wavelength enables the optical path length of each light-emitting layer (i.e., the thickness of each light-emitting layer) to be optimized. By the optimization of the optical path length of each light-emitting layer (i.e., the thickness of each light-emitting layer), a light-emitting element with high power efficiency can be provided.

Concretely, the optical path length between the light-reflecting electrode 106 and the first light-emitting layer 108 is three fourths of the peak wavelength of light emitted from the first light-emitting layer 108, the optical path length between the light-reflecting electrode 106 and the second light-emitting layer 110 is three fourths of the peak wavelength of light emitted from the second light-emitting layer 110, and the optical path length between the light-reflecting electrode 106 and the third light-emitting layer 112 is one fourth of the peak wavelength of light emitted from the third light-emitting layer 112.

In the illustrated example of FIG. 1, the optical path length between the light-reflecting electrode 106 and the first light-emitting layer 108 is set to $3\lambda a/4$, the optical path length between the light-reflecting electrode 106 and the second light-emitting layer 110 is set to $3\lambda b/4$, and the optical path length between the light-reflecting electrode 106 and the third light-emitting layer 112 is set to $1\lambda c/4$. In addition, $\lambda a$ means a wavelength of light emitted from the first light-emitting layer 108, $\lambda b$ means a wavelength of light emitted from the second light-emitting layer 110, and $\lambda c$ means a wavelength of light emitted from the third light-emitting layer 112.

In addition, in the light-emitting element 100 illustrated in FIG. 1, current flows due to a potential difference between the light-transmitting electrode 104 and the light-reflecting electrode 106, and holes and electrons are recombined in the first light-emitting layer 108, the second light-emitting layer 110, and the third light-emitting layer 112 so that the light-emitting element 100 emits light. In other words, light-emitting regions are formed inside the first light-emitting layer 108, the second light-emitting layer 110, and the third light-emitting layer 112. In summary, in the specification and the like, the optical Oath length between the light-reflecting electrode 106 and each of the first to third light-emitting layers is preferably an optical path length between the light-reflecting electrode 106 and the light-emitting region in each of the first to third light-emitting layers.

Further, the optical path length between the light-reflecting electrode 106 and each light-emitting layer is set to $m\lambda x/4$ (m is an odd number and $\lambda x$ is a wavelength of light emitted from each light-emitting layer) of light emitted from the light-emitting layer, thereby increasing power efficiency. In addition, from an optical viewpoint, each light-emitting layer preferably has a small thickness because light loss such as light absorption is caused inside the light-emitting layer when the light-emitting layer has a large thickness.

However, a structure in which the optical path length between the light-reflecting electrode 106 and the first light-emitting layer 108 is one fourth of the peak wavelength of light emitted from the first light-emitting layer 108, the optical path length between the light-reflecting electrode 106 and the second light-emitting layer 110 is one fourth of the peak wavelength of light emitted from the second light-emitting layer 110, and the optical path length between the light-reflecting electrode 106 and the third light-emitting layer 112 is one fourth of the peak wavelength of light emitted from the third light-emitting layer 112 can achieve a maximum power efficiency in theory; however, it is actually difficult to form a light-emitting element with such a structure, because the optical path length (or thickness) of each light-emitting layer and each intermediate layer needs to be made short (or thin) to the utmost.

For that reason, a conventional element employs a structure in which the optical path length between the light-reflecting electrode 106 and the first light-emitting layer 108 is five fourths (5/4) of a peak wavelength of light emitted from the first light-emitting layer 108, the optical path length between the light-reflecting electrode 106 and the second light-emitting layer 110 is three fourths (3/4) of a peak wavelength of light emitted from the second light-emitting layer 110, and the optical path length between the light-reflecting electrode 106 and the third light-emitting layer 112 is one fourth (1/4) of a peak wavelength of light emitted from the third light-emitting layer 112. However, in this structure, the thickness of a light-emitting layer is large, and thus light loss such as light absorption inside the light-emitting layer is not negligible.

In contrast, in the light-emitting element 100 described in this embodiment, the optical path length between the light-reflecting electrode 106 and the first light-emitting layer 108 can be set to three fourths (¾) of the peak wavelength of light emitted from the first light-emitting layer 108. In other words, even in the first light-emitting layer 108 furthest from the light-reflecting electrode 106, the optical path length can be set to be shorter than that of a conventional element (that is, 5/4 of a peak Wavelength of light emitted from the first light-emitting layer 108). Moreover, a peak of a spectrum of light emitted from the first light-emitting layer 108 is located on a longer wavelength side as compared to a peak of spectrum of light emitted from the second light-emitting layer and a peak of spectrum of light emitted from the third light-emitting layer, and the peak of the spectrum of the light emitted from the second light-emitting layer 110 is located on a shorter wavelength side as compared to the peak of the spectrum of the light emitted from the first light-emitting layer and the peak of the spectrum of the light emitted from the third light-emitting layer, and thus the first light-emitting layer 108 and the second light-emitting layer 110 can have thicknesses large enough that the layers can formed.

For example, a structure is assumed, in which the wavelength (λa) of light emitted from the first light-emitting layer 108 lies in a red region of 620 nm, the wavelength (λb) of light emitted from the second light-emitting layer 110 lies in a blue region of 460 nm, and a refractive index (n) is 1.8. In this structure; if the optical path length between the light-reflecting electrode 106 and the first light-emitting layer 108 and the optical path length between the light-reflecting electrode 106 and the second light-emitting layer 110 are each one fourth (¼) of the peak wavelength of light emitted from the light-emitting layer, the difference in the optical path lengths of the first light-emitting layer 108 and the second light-emitting layer 110 is about 22 nm, which is a value to cause difficulty in forming a light-emitting element. However, when the optical path length between the light-reflecting electrode 106 and the first light-emitting layer 108 and the optical path length between the light-reflecting electrode 106 and the second light-emitting layer 110 are each three fourths (¾) of the peak wavelength of light emitted from the light-emitting layer, the difference in the optical path lengths of the first light-emitting layer 108 and the second light-emitting layer 110 is about 67 nm, so that a light-emitting element can be formed.

Further, a structure is assumed, in which the wavelength (λa) of light emitted from the first light-emitting layer 108 lies in a blue region of 460 nm, the wavelength (λb) of light emitted from the second light-emitting layer 110 lies in a red region of 620 nm, and a refractive index (n) is 1.8. In this structure, if the optical path length between the light-reflecting electrode 106 and the first light-emitting layer 108 and the optical path length between the light-reflecting electrode 106 and the second light-emitting layer 110 are each three fourths (¾) of the peak wavelength of light emitted from the light-emitting layer, the optical path length of the second light-emitting layer 110 is longer than that of the first light-emitting layer 108; therefore, a light-emitting element cannot be formed.

Accordingly, in the light-emitting element 100 described in this embodiment, the wavelengths of light emitted from the first to third light-emitting layers are decided, and the stack order of the three light-emitting layers is limited. In addition, by the decision of the optical path length between the light-reflecting electrode 106 and each light-emitting layer, a light-emitting element with high power efficiency can be provided.

For example, a light-emitting substance which emits light having a peak in a wavelength range of yellow to orange light can be used for the first light-emitting layer 108. For example, an organometallic complex in which an arylpyrimidine derivative serves as a ligand can be used as the light-emitting substance which emits light having a peak in a yellow to orange wavelength range. Alternatively, the light-emitting layer can be formed by dispersing a light-emitting substance (a guest material) in another substance (a host material). A phosphorescent compound can be used as the light-emitting substance which emits light having a peak in a yellow to orange wavelength range. The power efficiency in the case of using a phosphorescent compound is three to four times as high as that in the case of using a fluorescent compound. The organometallic complex in which an arylpyrimidine derivative serves as a ligand is a phosphorescent compound, has high emission efficiency, and easily emits light in the yellow to orange wavelength range, and thus is preferable for the present invention.

In addition, a light-emitting substance which emits light having a peak in a blue wavelength range can be used for the second light-emitting layer 110. For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound as the substance which emits blue light makes it possible to obtain a light-emitting element which has a longer lifetime than a light-emitting element in which a phosphorescent compound is used as the substance which emits blue light. The pyrene diamine derivative is a fluorescent compound, can provide an extremely high quantum yield, and has a long lifetime, which is preferable for the present invention.

In addition, a light-emitting substance which emits light having a peak in a yellow to orange wavelength range can be used for the third light-emitting layer 112, as for the first light-emitting layer 108. Note that the material of the third light-emitting layer 112 is not limited to such a light-emitting substance, and any light-emitting substance which emits light having a peak at a wavelength shorter than or equal to a wavelength of light emitted from the first light-emitting layer 108 can be used. For example, a light-emitting substance which emits light having a peak in a blue wavelength range can be used, as for the second light-emitting layer 110. Alternatively, a light-emitting substance which emits light having a peak in a green wavelength range that is between blue light and orange light, can be used.

Here, a case is considered, in which a light-emitting layer of yellow to orange light is used for the first light-emitting layer 108, a light-emitting layer of blue light is used for the second light-emitting layer 110, and a light-emitting layer of yellow to orange light is used for the third light-emitting layer 112, and the three light-emitting layers are stacked. In this case, the intensity ratio of mixed light (yellow to orange light) of light emission 120 from the first light-emitting layer 108 and light emission 124 from the third light-emitting layer 112 to light emission 122 from the second light-emitting layer 110 is about 8:1 to 6:1. Thus, the light-emitting element 100 has a structure in which the two light-emitting layers of yellow to orange light are formed using phosphorescent compounds, and one light-emitting layer of blue light is formed using a fluorescent compound, and the three light-emitting layers are stacked, and thus the light-emitting element 100 can emit light with white color close to incandescent color or warm white color. In addition, two light-emitting layers which emit light of color ranging from yellow to orange of high luminosity are used and phosphorescent compounds are used as the light-emitting substances of these light-emitting layers; thus, the power efficiency is increased.

Further, as the first light-emitting layer 108, a light-emitting layer of yellow to orange light is used, and the optical path length between the light-reflecting electrode 106 and the first light-emitting layer 108 is three fourths of the peak wavelength of light emitted from the first light-emitting layer. In addition, as the second light-emitting layer 110, a light-emitting layer of blue light is used, and the optical path length between the light-reflecting electrode 106 and the second light-emitting layer 110 is three fourths of the peak wavelength of light emitted from the second light-emitting layer. In addition, the optical path length between the light-reflecting electrode 106 and the third light-emitting layer 112 is one fourth of the peak wavelength of light emitted from the third light-emitting layer. As described above, by deciding each optical path length between the light-reflecting electrode 106 and the first to third light-emitting layers, each light-emitting layer and each intermediate layer can be thinned. The total thickness of the first light-emitting layer, the second light-emitting layer, the third light-emitting layer, the first intermediate layer, and the second intermediate layer is preferably 400 nm or less, more preferably 350 nm or less. In this manner, the thickness of each light-emitting layer and each intermediate layer is made small, so that light loss such as light absorption inside the light-emitting layers can be inhibited. Accordingly, the power efficiency of the light-emitting element 100 can be more increased.

Further, with the use of the thinned light-emitting layers, the amount of organic materials used for the light-emitting layers can be reduced. Therefore, the amount of a material used for each light-emitting layer can be reduced and the time spent for evaporation and the like can be shortened, which results in advantageous manufacturing costs.

As described above, the light-emitting element described in this embodiment, in which three light-emitting layers are stacked as the light-emitting element that exhibits white emission, includes a light-emitting layer having an emission peak in a wavelength range of yellow to orange of high luminosity as the first light-emitting layer, a light-emitting layer having an emission peak in a blue wavelength range as the second light-emitting layer, and a light-emitting layer having an emission peak in a wavelength range of yellow to orange of high luminosity as the third light-emitting layer, and the stack order of the three light-emitting layers is decided, and each light-emitting layer is thinned, so that the power efficiency of the entire light-emitting element can be increased. Further, as a result of thinning of each light-emitting layer, a light-emitting element in which the amount of organic materials used for the light-emitting layers is reduced can be provided.

Further, the light-emitting element described above has high power efficiency, and thus can be used as a light source of an indoor lighting device or an outdoor lighting device. The use of the light-emitting element described above makes it possible to provide lighting devices which have high power efficiency and consume less power.

Furthermore, the light-emitting element described in this embodiment emits light with white color close to incandescent color or warm white color, and thus can be used as a light source of an indoor lighting device or an outdoor lighting device. The use of the light-emitting element described in this embodiment enables manufacture of a lighting device which has high power efficiency and consumes less power.

This embodiment can be implemented in combination with any of the other embodiments or examples as appropriate.
(Embodiment 2)

In this embodiment, an example of a structure of a light-emitting element will be described with reference to FIG. 1.

In this embodiment, a specific structure of the light-emitting element 100 illustrated in FIG. 1 and described in Embodiment 1 will be described.

As described in Embodiment 1, the light-emitting element 100 illustrated in FIG. 1 is provided over a substrate 102, includes the light-transmitting electrode 104 and the light-reflecting electrode 106, and includes the first light-emitting layer 108, the second light-emitting layer 110, the third light-emitting layer 112, the first intermediate layer 114, and the second intermediate layer 116 between the light-transmitting electrode 104 and the light-reflecting electrode 106. The first light-emitting layer 108 is provided between the light-transmitting electrode 104 and the first intermediate layer 114. The second light-emitting layer 110 is provided between the first intermediate layer 114 and the second intermediate layer 116. The third light-emitting layer 112 is provided between the second intermediate layer 116 and the light-reflecting electrode 106. Note that the first light-emitting layer 108, the second light-emitting layer 110, and the third light-emitting layer 112 are stacked and connected in series with the first intermediate layer 114 and the second intermediate layer 116 therebetween. Such a stacked-structure of the first light-emitting layer 108, the second light-emitting layer 110, and the third light-emitting layer 112 is referred to as a stack-type light-emitting element. In addition, in FIG. 1, the light-transmitting electrode 104 serves as an anode, while the light-reflecting electrode 106 serves as a cathode.

The first light-emitting layer 108 and the third light-emitting layer 112 each includes a light-emitting substance which emits light having a peak in the yellow to orange wavelength. As a light-emitting substance which emits light having a peak in the yellow to orange wavelength, the following can be used: rubrene; (2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ijU]quinolizin-9-yl)ethenyl]-4H-pyran-4-ylidene}propanedinitrile (abbreviation: DCM2); bis[2-(2-thienyl)pyridinato]iridium acetylacetonate (abbreviation: $Ir(thp)_2(acac)$); bis(2-phenylquinolinato)iridium acetylacetonate (abbreviation: $Ir(pq)_2(acac)$); tris(2-phenylquinolinato-N,$C^{2'}$)iridium(III) (abbreviation: $Ir(pq)_3$); bis(2-phenylbenzothiazolato-N,$C^{2'}$)iridium(III) acetylacetonate (abbreviation: $Ir(bt)_2(acac)$); (acetylacetonato)bis[2,3-bis(4-fluorophenyl)-5-methylpyrazinato]iridium(III) (abbreviation: $Ir(Fdppr-Me)_2(acac)$); (acetylacetonato)bis{2-(4-methoxyphenyl)-3,5-dimethylpyrazinato}iridium(III) (abbreviation: $Ir(dmmoppr)_2(acac)$); (acetylacetonato)bis(3,5-dimethyl-2-phenylpyrazinato)iridium(III) (abbreviation: $Ir(mppr-Me)_2(acac)$); (acetylacetonato)bis(5-isopropyl-3-methyl-2-phenylpyrazinato)iridium(III) (abbreviation: $Ir(mppr-iPr)_2(acac)$); (acetylacetonato)bis(4,6-diphenylpyrimidinato)iridium(III) (abbreviation: $Ir(dppm)_2(acac)$; or the like.

In addition, the following phosphorescent compounds are preferable as the light-emitting substance which emits light having a peak in the yellow to orange wavelength range: $Ir(thp)_2(acac)$, $Ir(pq)_2(acac)$, $Ir(pq)_3$, $Ir(bt)_2(acac)$, $Ir(Fdppr-Me)_2(acac)$, $Ir(dmmoppr)_2(acac)$, $Ir(mppr-Me)_2(acac)$, $Ir(mppr-iPr)_2(acac)$, and $Ir(dppm)_2(acac)$. In particular, organometallic complexes in which a pyrazine derivative serves as a ligand, such as $Ir(Fdppr-Me)_2(acac)$, $Ir(dmmoppr)_2(acac)$, $Ir(mppr-Me)_2(acac)$, and $Ir(mppr-iPr)_2(acac)$, and organometallic complexes, in which an arylpyrimidine derivative serves as a ligand, such as $Ir(dppm)_2(acac)$, are preferable because they have high efficiency.

In addition, any of these light-emitting substances (a guest material) may be dispersed into another substance (a host material) to form the light-emitting layer. As a host material in that case, the following compounds are preferable: aromatic amine compounds such as 4,4'-bis[N-(1-naphthyl)-N-phenylamino]biphenyl (abbreviation: NPB) and 4-(9H-carbazol-9-yl)-4'-(10-phenyl-9-anthryl)triphenylamine (abbreviation: YGAPA); and heterocyclic compounds such as 2-[4-(9H-carbazol-9-yl)phenyl]-3-phenylquinoxaline (abbreviation: Cz1PQ), 2-[4-(3,6-diphenyl-9H-carbazol-9-yl)phenyl]-3-phenylquinoxaline (abbreviation: Cz1PQ-III), 2-[4-(3,6-diphenyl-9H-carbazol-9-yl)phenyl]dibenzo[f,h]quinoxaline (abbreviation: 2CzPDBq-III), and 2-[3-(dibenzothiophen-4-yl)phenyl]dibenzo[f,h]quinoxaline (abbreviation: 2mDBTP-DBq-II). Further alternatively, a polymer, such as poly(2,5-dialkoxy-1,4-phenylenevinylene) may be used.

The second light-emitting layer 110 includes a light-emitting substance which emits light having a peak in the blue wavelength range. As a light-emitting substance which emits light having a peak in the blue wavelength range, perylene; 2,5,8,11-tetra(tert-butyl)perylene (abbreviation: TBP); or the like can be used. A styrylarylene derivative such as 4,4'-bis(2,2-diphenylvinyl)biphenyl (abbreviation: DPVBi), or an anthracene derivative such as 9,10-diphenylanthracene, 9,10-di(2-naphthyl)anthracene (abbreviation: DNA), or 9,10-bis(2-naphthyl)-2-tert-butylanthracene (abbreviation: t-BuDNA) can be used. A polymer such as poly(9,9-dioctylfluorene) can be used. A styrylamine derivative such as N,N'-bis[4-(9H-carbazol-9-yl)phenyl]-N,N'-diphenylstilbene-4,4'-diamine (abbreviation: YGA2S) or N,N'-diphenyl-N,N'-bis(9-phenyl-9H-carbazol-3-yl)stilbene-4,4'-diamine (PCA2S) can be used. In addition, a pyrenediamine derivative such as N,N'-bis[4-(9-phenyl-9H-fluoren-9-yl)phenyl]-N,N'-diphenylpyrene-1,6-diamine (abbreviation: 1,6FLPA-Prn), N,N-bis[4-(9-phenyl-9H-fluoren-9-yl)phenyl]-N,N'-bis(4-tert-butylphenyl)pyrene-1,6-diamine (abbreviation:1, 6tBu-FLPAPrn), or N,N'-bis(3-methylphenyl)-N,N'-bis[3-(9-phenyl-9H-fluoren-9-yl)phenyl]pyrene-1,6-diamine (abbreviation: 1,6mMemFLPAPrn) can be used.

In particular, a pyrenediamine derivative such as 1,6-FLPAPrn, 1,6tBu-FLPAPrn, or 1,6mMemFLPAPr are preferable because it has a peak at a wavelength of around 460 nm, has an extremely high quantum yield, and has a long lifetime.

In addition, any of these light-emitting substances (a guest material) may be dispersed into another substance (a host material) to form the light-emitting layer. As a host material in that case, an anthracene derivative is preferable, examples of which are 9,10-bis(2-naphthyl)-2-tert-butylanthracene (abbreviation: t-BuDNA), 9-[4-(10-phenyl-9-anthryl)phenyl]-9H-carbazole (abbreviation: CzPA), and 9-phenyl-3-[4-(10-phenyl-9-anthryl)phenyl]-9H-carbazole (abbreviation: PCzPA). In particular, CzPA and PCzPA are preferable because they are electrochemically stable.

Note that the emission colors of the light-emitting substances given above may change to some extent depending on the host material or the element structure.

In FIG. 1, the substrate 102 serves as a support of the light-emitting element. As the substrate 102, glass, plastic or the like can be used, for example. Note that materials other than glass and plastic may be used as long as they can function as a support of a light-emitting element.

As the light-transmitting electrode 104, a material having at least a light-transmitting property can be used, and various metals, alloys, other conductive materials, and mixture of such materials can be used. For example, it is possible to use a film of conductive metal oxide such as indium oxide-tin oxide (ITO: indium tin oxide), indium oxide-tin oxide containing silicon or silicon oxide (ITO-SiO$_2$), indium oxide-zinc oxide, or indium oxide containing tungsten oxide and zinc oxide (IWZO), which has a high work function. Such metal oxide films can be formed by a sputtering method. For example, indium oxide-zinc oxide (IZO) can be formed by a sputtering method using indium oxide into which zinc oxide of 1 to 20 wt % is added, as a target. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included.

As the light-reflecting electrode 106, a metal material having a high light-reflective property is preferably used, for example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride (TiN)), or the like can be used. Alternatively, any of elements belonging to Group 1 and 2 of the periodic table, which have a low work function, that is, alkali metals such a lithium (Li) and cesium (Cs); alkaline earth metals such as calcium (Ca) and strontium (Sr); magnesium (Mg); or alloys containing these metals (e.g., an alloy of magnesium and silver or an alloy of aluminum and lithium) can be used. Further alternatively, a rare earth metal such as europium (Eu), ytterbium (Yb), or the like, an alloy of any of these metals, or the like may be used. Alternatively, aluminum (Al), silver (Ag), an alloy containing aluminum (AlSi), or the like can be used. A film of an alkali metal, an alkaline earth metal, or an alloy thereof can be formed by a vacuum evaporation method. Further, a film formed of an alloy of an alkali metal or an alkaline earth metal can be formed by a sputtering method. Further, each electrode can be formed to have not only a single layer but also stacked layers.

It is to be noted that a material with a high work function is preferably used for light-transmitting electrode (i.e., anode) in consideration of a carrier injection barrier. In addition, a material with a low work function is preferably used for the light-reflecting electrode (i.e., cathode).

The first intermediate layer 114 has a function of injecting electrons to the first light-emitting layer 108, and injecting holes to the second light-emitting layer 110. The second intermediate layer 116 has a function of injecting electrons to the second light-emitting layer 110, and injecting holes to the third light-emitting layer 112. Thus, a stacked-film in which at least a layer having a function of injecting holes and a layer having a function of injecting electrons are stacked can be employed for each of the first intermediate layer 114 and the second intermediate layer 116.

Further, the first intermediate layer 114 and the second intermediate layer 116 are positioned inside the light-emitting element, and thus are preferably formed using light-transmitting materials in terms of light extraction efficiency. In addition, a part of each of the first intermediate layer 114 and the second intermediate layer 116 can be formed using the same material as any of those used in the light-transmitting electrode 104 and the light-reflecting electrode 106. Alternatively, the first intermediate layer 114 and the second intermediate layer 116 can each be formed using a material with lower conductivity than those of the light-transmitting electrode 104 and the light-reflecting electrode 106.

The layers which have a function of injecting electrons in the first intermediate layer 114 and the second intermediate layer 116 can be formed using, for example, insulators or semiconductors, such as lithium oxide, lithium fluoride, or cesium carbonate. Alternatively, the layers can be formed using materials in which a donor substance is added to a substance with a high electron-transport property.

As a substance with a high electron-transport property, the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato) (4-phenylphenolato)aluminum (abbreviation: BAlq); or the like. Alternatively, a metal complex having an oxazole-based or thiazole-based ligand, such as bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), or the like, can be used. In addition to such metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly substances having an electron mobility of $10^{-6}$ cm$^2$/Vs or more. Note that any substance other than the above substances may be used as long as the substance has an electron-transport property higher than a hole-transport property.

A donor substance is added to a substance with a high electron-transport property, whereby an electron-injection property can be enhanced. Thus, the driving voltage of a light-emitting element can be reduced. As the donor substance, an alkali metal, an alkaline earth metal, a rare earth metal, a metal that belongs to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance.

The layers which have a function of injecting holes in the first intermediate layer 114 and the second intermediate layer 116 can be formed using, for example, semiconductors or insulators, such as molybdenum oxide, vanadium oxide, rhenium oxide, or ruthenium oxide. A material in which an acceptor substance is added to a substance with a high hole-transport property can be used. Alternatively, a layer formed of an acceptor substance may be used.

As a substance with a high hole-transport property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]-1,1'-biphenyl (abbreviation: BSPB), or the like. The substances given here are mainly substances having a hole mobility of $10^{-6}$ cm$^2$/Vs or more. However, any substance other than the above substances may be used as long as it has a hole-transport property higher than an electron-transport property. Alternatively, any of the above-described host materials may be used.

An acceptor substance is added to a substance with a high hole-transport property, whereby the hole-injection property can be enhanced. Thus, the driving voltage of a light-emitting element can be reduced. As an acceptor substance, 7,7,8,8-tetracyano-2,3,5,6-tetrafluoroquinodimethane (abbreviation: F$_4$-TCNQ), chloranil, or the like can be used. Alternatively, a transition metal oxide can be used. Alternatively, an oxide of a metal belonging to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

Further, with use of one of the structure in which an accepter substance is added to a substance with a high hole-transport property and the structure in which a donor substance is added to a substance with a high electron-transport property, or both thereof, an increase in the drive voltage can suppressed even in the case of increasing the thicknesses of the first intermediate layer 114 and the second intermediate layer 116. When the thicknesses of the first intermediate layer 114 and the second intermediate layer 116 are increased, a short circuit caused by a minute foreign object, impact, or the like can be prevented; thus, a highly reliable light-emitting element can be obtained. Note that the increased thicknesses of the first intermediate layer 114 and the second intermediate layer 116 may cause light loss such as light absorption inside light-emitting layers, which is not negligible, and thus the appropriate thicknesses of the first intermediate layer 114 and the second intermediate layer 116 can be set suitably by a practitioner.

Note that, if needed, another layer may be provided between the layer which has a function of injecting holes and the layer which has a function of injecting electrons in the first intermediate layer 114 or the second intermediate layer 116. For example, a conductive layer formed of ITO or the like or an electron-relay layer may be provided. An electron-relay layer has a function of reducing the loss of voltage generated between the layer which has a function of injecting holes and the layer which has a function of injecting electrons. Specifically, a material with a LUMO level of −5.0 eV or more is preferably used, and a material with a LUMO from −5.0 eV to −3.0 eV is more preferably used. For example, 3,4,9,10-perylenetetracarboxylicdianhydride (abbreviation: PTCDA), 3,4,9,10-perylenetetracarboxylic-bis-benzimidazole (abbreviation: PTCBI), or the like can be used.

When voltage is applied to the light-emitting element 100 so that the light-transmitting electrode 104 is positively charged and the light-reflecting electrode 106 is negatively charged, current with current density J flows through the light-emitting element 100. At this time, holes are injected into the first light-emitting layer 108 from the light-transmitting electrode 104 and electrons are injected into the first light-emitting layer 108 from the first intermediate layer 114, and when the electrons and the holes are recombined, light can be emitted from the first light-emitting layer 108. In addition, holes are injected into the second light-emitting layer 110 from the first intermediate layer 114 and electrons are injected into the second light-emitting layer 110 from the second intermediate layer 116, and when the electrons and the holes are recombined, light can be emitted from the second light-emitting layer 110. In addition, holes are injected into the third light-emitting layer 112 from the second intermediate layer 116 and electrons are injected into the third light-emitting layer 112 from the light-reflecting electrode 106, and when the electrons and the holes are recombined, light can be emitted from the third light-emitting layer 112.

It is to be noted that in an equivalent circuit, the common current with the current density J flows through the first light-emitting layer 108, the second light-emitting layer 110, and the third light-emitting layer 112, and each layer emits light with a luminance which corresponds to the current density J. Here, light-transmitting materials are used for the first intermediate layer 114, the second intermediate layer 116, and the light-transmitting electrode 104, whereby light emitted from the first light-emitting layer 108, light emitted from the second light-emitting first light-emitting layer 110, and light emitted from the third light-emitting layer 112 can all be output. In addition, light can be reflected on the light-reflecting electrode 106 and thus, extracted efficiently on the side through which light is output.

Further, in FIG. 1, the light-transmitting electrode is formed on the substrate side; however, the light-reflecting electrode may be provided on the substrate side.

Moreover, the optical path length between the light-reflecting electrode 106 and the first light-emitting layer 108 is three fourths of the peak wavelength of light emitted from the first light-emitting layer 108, and can be adjusted by controlling each thickness of the first light-emitting layer 108, the first intermediate layer 114, the second light-emitting layer 110, the second intermediate layer 116, and the third light-emitting layer 112. In addition, the optical path length between the light-reflecting electrode 106 and the second light-emitting layer 110 is three fourths of the peak wavelength of light emitted from the second light-emitting layer 110, and can be adjusted by controlling each thickness of the second light-emitting layer 110, the second intermediate layer 116, and the third light-emitting layer 112. In addition, the optical path length between the light-reflecting electrode 106 and the third light-emitting layer 112 is one fourth of the peak wavelength of light emitted from the third light-emitting layer 112, and can be adjusted by controlling the thickness of the third light-emitting layer 112.

As described above, by controlling of each thickness of the first light-emitting layer 108, the first intermediate layer 114, the second light-emitting layer 110, the second intermediate layer 116, and the third light-emitting layer 112, the optical path length between the light-reflecting electrode 106 and each of the first to third light-emitting layers is decided. Note that the total thickness of the first light-emitting layer 108, the second light-emitting layer 110, the third light-emitting layer 112, the first intermediate layer 114, and the second intermediate layer 116 is preferably 400 nm or less, more preferably 350 nm or less.

As described above, the light-emitting element described in this embodiment, in which three light-emitting layers are stacked as the light-emitting element that exhibits white emission, a light-emitting layer having a peak of light in a wavelength range of color ranging from yellow to orange of high luminosity as the first light-emitting layer 108, and a light-emitting layer having a peak of light in a wavelength range of blue as the second light-emitting layer 110, and a light-emitting layer having a peak of light in a wavelength range of color ranging from yellow to orange of high luminosity as the third light-emitting layer 112, the stack order of the three light-emitting layers is decided, and the thickness of each light-emitting layer is adjusted to be thinned, so that the light-emitting can emit light with white color close to incandescent color or warm white color. With such a structure, the power efficiency of the whole light-emitting element can be increased. Further, as a result of thinning of each light-emitting layer, a light-emitting element in which the use amount of organic materials used for the light-emitting layers is reduced can be provided.

Further, the light-emitting element described above has high power efficiency, and thus can be used as a light source of an indoor lighting device or an outdoor lighting device. The use of the light-emitting element described above makes it possible to provide lighting devices which have high power efficiency and consume less power.

Further more, the light-emitting element described in this embodiment emits light with white color close to incandescent color or warm white color, and thus can be used as a light source of an indoor lighting device or an outdoor lighting device. The use of the light-emitting element described in this embodiment enables manufacture of a lighting device which has high power efficiency and consumes less power.

This embodiment can be implemented in combination with any of the other embodiments or examples as appropriate.

(Embodiment 3)

In this embodiment, a light-emitting element having a different structure from that of the light-emitting element in Embodiment 1 and Embodiment 2 will now be described with reference to FIG. 2.

Figure 2:
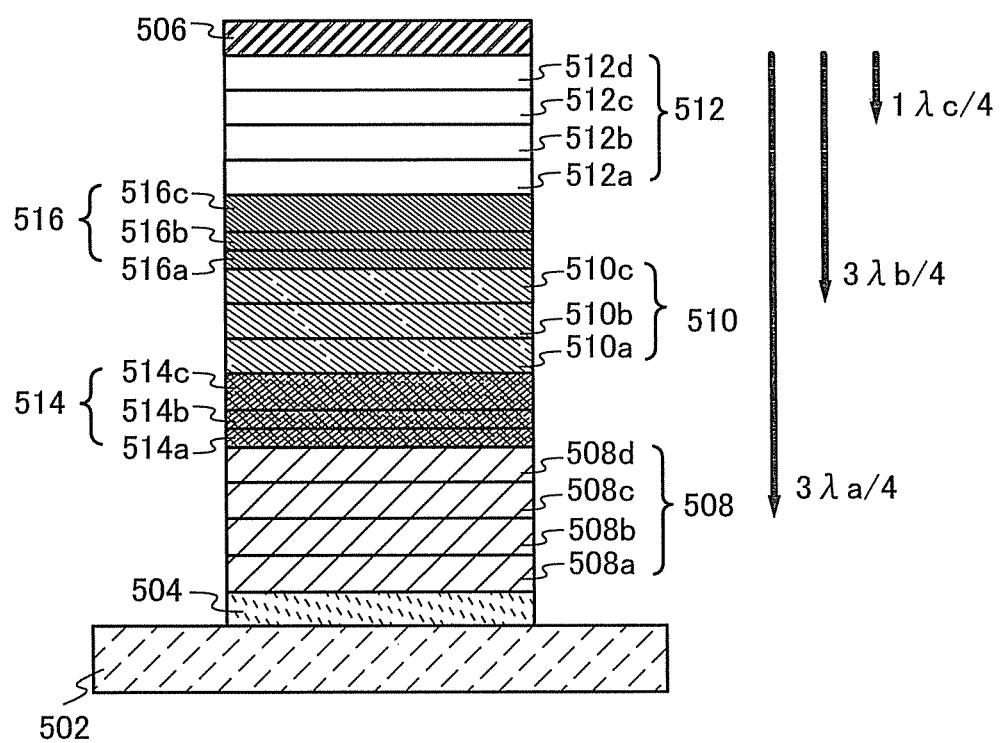
FIG. 2 illustrates a light-emitting element 1 used in Example 1, which is an example of a light-emitting element in accordance with one embodiment of the present invention.

The light-emitting element illustrated in FIG. 2 is provided over a substrate 502; includes a light-transmitting electrode 504 and a light-reflecting electrode 506; and includes, between the light-transmitting electrode 504 and the light-reflecting electrode 506, a first light-emitting layer 508 including a hole-injection layer 508a, a hole-transport layer 508b, a light-emitting layer 508c, and an electron-transport layer 508d; a first intermediate layer 514 including an electron-injection buffer layer 514a, an electron-relay layer 514b, and a charge-generation layer 514c; a second light-emitting layer 510 including a hole-transport layer 510a, a light-emitting layer 510b, and an electron-transport layer 510c; a second intermediate layer 516 including an electron-injection buffer layer 516a, an electron-relay layer 516b, and a charge-generation layer 516c; and a third light-emitting layer 512 including a hole-transport layer 512a, a light-emitting layer 512b, an electron-transport layer 512c, and an electron-injection layer 512d.

As described above, the first light-emitting layer 508, the second light-emitting layer 510, and the third light-emitting layer 512 may each include at least a light-emitting layer, and may have a stack structure including a functional layer in addition to the light-emitting layer. Examples of the functional layer other than the light-emitting layer include a layer containing a substance having a high hole-injection property, a layer containing a substance having a high hole-transport property, a layer containing a substance having a high electron-transport property, a layer containing a substance having a high electron-injection property, a layer containing a bipolar substance (a substance having high electron and hole transport properties), and the like. Specifically, functional layers such as a hole-injection layer, a hole-transport layer, an electron-transport layer, and an electron-injection layer can be used in combination as appropriate.

In one embodiment of the present invention, light emitted from each light-emitting layer is output to the outside through the light-transmitting electrode 504. Accordingly, the light-transmitting electrode 504 is formed using a light-transmitting substance. In addition, the light-reflecting electrode 506 is preferably formed using a highly light-reflective substance so that light can be output efficiently through the light-transmitting electrode 504.

The first intermediate layer 514 and the second intermediate layer 516 may each be formed of a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes an organic compound and a metal oxide such as vanadium oxide, molybdenum oxide, or tungsten oxide, for example. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transporting property and has a hole mobility of $10^{-6}$ cm$^2$/Vs or higher. However, other substances than the above described materials may also be used as long as the substances have higher hole-transport properties than electron-transport properties. The materials used for the first intermediate layer 514 and the second intermediate layer 516 are excellent in carrier-injecting property and carrier-transporting property, and thus, a light-emitting element with low-voltage driving and low-current driving can be provided.

Note that the first intermediate layer 514 and the second intermediate layer 516 may each be formed with a combination of a composite material of an organic compound and a metal oxide with another material. For example, a layer containing a composite material of an organic compound and a metal oxide may be combined with a layer containing a compound selected from substances with electron-donating properties and a compound with a high electron-transporting property. Moreover, a layer containing a composite material of an organic compound and a metal oxide may be combined with a transparent conductive film.

As for a light-emitting element having such a structure, problems such as energy transfer and quenching hardly occur, and a light-emitting element which has both high light emission efficiency and long lifetime can be easily obtained due to expansion in the choice of materials. Further, a light-emitting element which provides phosphorescence from one of light-emitting layers and fluorescence from another of the light-emitting layers can be easily obtained.

Note that the first intermediate layer 514 has a function of injecting electrons to the first light-emitting layer 508 formed in contact with the first intermediate layer 514 and injecting holes to the second light-emitting layer 510 faulted in contact with the first intermediate layer 514, when voltage is applied between the light-transmitting electrode 504 and the light-reflecting electrode 506. In addition, the second intermediate layer 516 has a function of injecting electrons to the second light-emitting layer 510 formed in contact with the second intermediate layer 516 and injecting holes to the third light-emitting layer 512 formed in contact with the second intermediate layer 516, when voltage is applied between the light-transmitting electrode 504 and the light-reflecting electrode 506.

The element structure illustrated in FIG. 2 can exhibit various emission colors of light by changing the kinds of light-emitting substances used for the first light-emitting layer 508, the second light-emitting layer 510, and the third light-emitting layer 512. In addition, a plurality of light-emitting substances of different emission colors are used as the light-emitting substances, whereby light emission having a broad spectrum or white light emission can also be obtained.

In the case of obtaining white light emission using the light-emitting element illustrated in FIG. 2, as for the combination of a plurality of light-emitting layers, a structure for emitting white light including red light, green light, and blue light may be employed. For example, a structure including a light-emitting layer containing a blue fluorescent material as a light-emitting substance and a light-emitting layer containing red and green phosphorescent materials as light-emitting substances may be employed. In addition, the structure may include a light-emitting layer for red light, a light-emitting layer for green light, and a light-emitting layer for blue light.

Note that light emitted from the first light-emitting layer 508 has the longest peak wavelength, as compared with light emitted from the second light-emitting layer 510 and light emitted from the third light-emitting layer 512, while light emitted from the second light-emitting layer 510 has the shortest peak wavelength, as compared with light emitted from the first light-emitting layer 508 and light emitted from the third light-emitting layer 512. In addition, light emitted from the third light-emitting layer 512 may be in a wavelength shorter than or equal to the wavelength of light emitted from the first light-emitting layer 508.

By such a structure in which light emitted from the first light-emitting layer 508 has the longest peak wavelength and light emitted from the second light-emitting layer 510 has the shortest peak wavelength, the optical path length of each light-emitting layer (i.e., thickness of each light-emitting layer) can be optimized. By the optimization of the optical path length of each light-emitting layer (i.e., the thickness of each light-emitting layer), a light-emitting element with high power efficiency can be provided.

Concretely, the optical path length between the light-reflecting electrode 506 and the first light-emitting layer 508 is three fourths of the peak wavelength of light emitted from the first light-emitting layer 508, the optical path length between the light-reflecting electrode 506 and the second light-emitting layer 510 is three fourths of the peak wavelength of light emitted from the second light-emitting layer 510, and the optical path length between the light-reflecting electrode 506 and the third light-emitting layer 512 is one fourth of the peak wavelength of light emitted from the third light-emitting layer 512.

In the light-emitting element illustrated in FIG. 2, the optical path length between the light-reflecting electrode 506 and the first light-emitting layer 508 is $3\lambda a/4$, the optical path length between the light-reflecting electrode 506 and the second light-emitting layer 510 is $3\lambda b/4$, and the optical path length between the light-reflecting electrode 506 and the third light-emitting layer 512 is $1\lambda c/4$. In addition, $\lambda a$ means a wavelength of light emitted from the first light-emitting layer 508, $\lambda b$ means a wavelength of light emitted from the second light-emitting layer 510, and $\lambda c$ means a wavelength of light emitted from the third light-emitting layer 512.

In addition, in the light-emitting element illustrated in FIG. 2, current flows due to potential difference between the light-transmitting electrode 504 and the light-reflecting electrode 506 and holes and electrons are recombined in the first light-emitting layer 508, the second light-emitting layer 510, and the third light-emitting layer 512 so that the light-emitting element 500 emits light. In other words, light-emitting regions are formed inside the first light-emitting layer 508, the second light-emitting layer 510, and the third light-emitting layer 512. In summary, in the specification and the like, the optical path length between the light-reflecting electrode 506 and each of the first to third light-emitting layers is preferably an optical path length between the light-reflecting electrode 506 and the light-emitting region in each of the first to third light-emitting layers.

In other words, the optical path length between the light-reflecting electrode 506 and the first light-emitting layer 508 is preferably an optical path length between the light-reflecting electrode 506 and the light-emitting layer 508c positioned in the first light-emitting layer 508. Similarly, the optical path length between the light-reflecting electrode 506 and the second light-emitting layer 510 is preferably an optical path length between the light-reflecting electrode 506 and the light-emitting layer 510b positioned in the second light-emitting layer 510. Similarly, the optical path length between the light-reflecting electrode 506 and the third light-emitting layer 512 is preferably an optical path length between the light-reflecting electrode 506 and the light-emitting layer 512b positioned in the third light-emitting layer 512.

The optical path length between the light-reflecting electrode 506 and each light-emitting layer included in the first to third light-emitting layers can be adjusted as appropriate by controlling the thickness of the first intermediate layer 514, the second intermediate layer 516, or the functional layer such as the hole-injection layer, the hole-transport layer, the electron-transport layer, or the electron-injection layer included in the first to third light-emitting layers.

As described above, in the light-emitting element described in this embodiment, the wavelength of light emitted from each of the first to third light-emitting layers is decided and the stack order of the three light-emitting layers is limited. In addition, by deciding the optical path length between the light-reflecting electrode 506 and each light-emitting layer, a light-emitting element with high power efficiency can be provided.

Note that in the structure of the above-mentioned stacked layer element, by provision of the first intermediate layer and the second intermediate layer between the stacked light-emitting layers, the element can have long lifetime in a high-luminance region while the current density is kept low. In addition, the voltage drop due to resistance of the electrode material can be reduced, whereby uniform light emission in a large area is possible.

This embodiment can be implemented in combination with any of the other embodiments or examples as appropriate.

(Embodiment 4)

In this embodiment, an example using the light-emitting element described in any of Embodiment 1 to Embodiment 3 will be described with reference to FIGS. 3A and 3B.

Figure 3A:
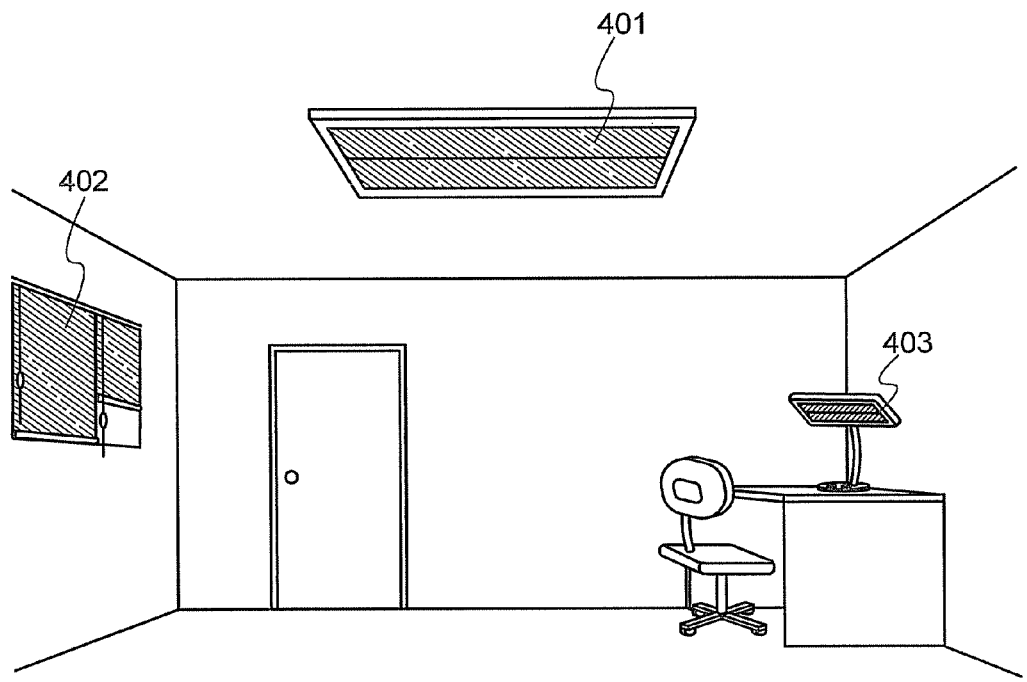
FIGS. 3A and 3B illustrate lighting devices in accordance with one embodiment of the present invention.

FIG. 3A illustrates an indoor lighting device 401 and a desk lamp 403 to which the light-emitting element described in any of Embodiment 1 to Embodiment 3 is applied. Since the light-emitting device in accordance with one embodiment of the present invention can have a large area, the light-emitting device can be used as a lighting apparatus having a large area.

Note that in the example of FIG. 3A, a plate-like light-emitting device is illustrated, but one embodiment of the present invention is not limited to this example. A lighting device having a light-emitting portion with a curved surface can also be manufactured. Further, in accordance with one embodiment of the present invention, a lighting device having a see-through light-emitting portion can be manufactured. One embodiment of the present invention can also be applied to lighting in a car; for example, lighting can be provided for a dashboard, on a windshield, ceiling, or the like. Alternatively, the light-emitting device can be used as a roll-type lighting device 402.

Figure 3B:
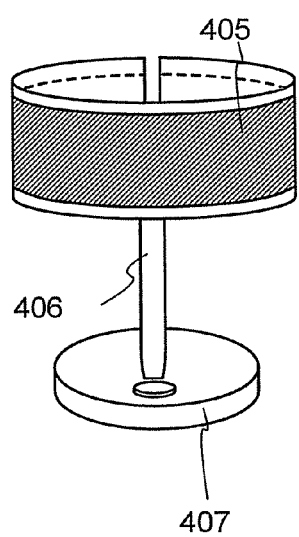

FIG. 3B illustrates an example of another lighting device. A desk lamp illustrated in FIG. 3B includes a lighting portion 405, a support 406, a support base 407, and the like. The lighting portion 405 includes a light-emitting device in accordance with one embodiment of the present invention. As described above, in one embodiment of the present invention, a lighting device having a lighting portion with a curved surface or a flexible lighting portion can be manufactured with use of a resin material with high tolerance to bending (i.e., high flexibility). The use of a flexible light-emitting device for a lighting device like that not only improves the degree of freedom in design of the lighting device but also enables the lighting device to be mounted onto a portion having a curved surface.

By applying one embodiment of the present invention to such lighting devices, the lighting devices can have high power efficiency.

This embodiment can be implemented in combination with any of the other embodiments or examples as appropriate.

EXAMPLE 1

In this example, a light-emitting element 1 having a structure similar to the light-emitting element described in Embodiment 3 was fabricated and evaluated. In addition, a comparative light-emitting element 1 was also formed for comparison with the light-emitting element 1 and evaluated. The light-emitting element 1 and the comparative light-emitting element 1 will be described with reference to FIG. 2, FIG. 4, FIGS. 5A, 5B, and FIG. 6.

Figure 4:
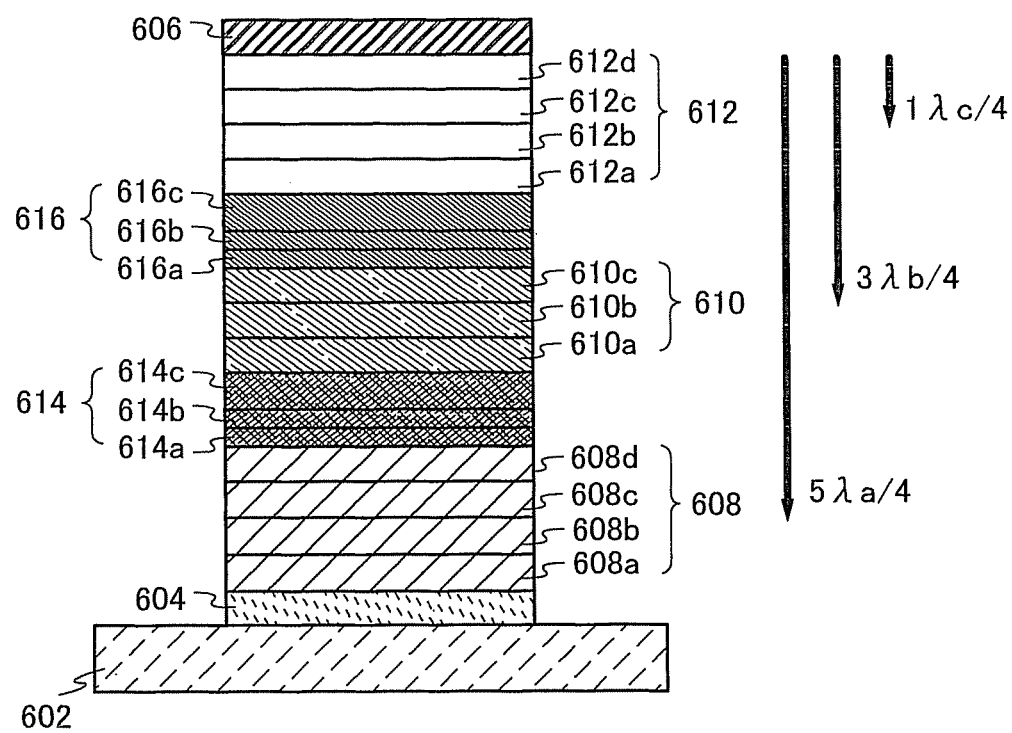
FIG. 4 illustrates a comparative light-emitting element 1.

First, fabrication methods of the light-emitting element 1 and the comparative light-emitting element 1 in this example are described with reference to FIG. 2 and FIG. 4.

(Light-Emitting Element 1)

First, the light-emitting element 1 will be described (see FIG. 2). A film of indium tin oxide including silicon oxide (ITO—$SiO_2$) was formed over the substrate 502 by a sputtering method, thereby forming the light-transmitting electrode 504. The thickness was 110 nm and the electrode area was 2 mm×2 mm.

Next, the substrate provided with the light-transmitting electrode 504 was fixed to a substrate holder in a vacuum evaporation apparatus so that a surface of the substrate over which the light-transmitting electrode 504 was formed faced downward. The pressure in the vacuum evaporation apparatus was reduced to about $10^{-4}$ Pa. Then, 4,4',4''-(1,3,5-benzenetriyl)tri(dibenzothiophene) (abbreviation: DBT3P-II represented by the structural formula (101) below) that is a substance with a high hole-transport property and molybdenum oxide that is an acceptor substance were co-evaporated to form the hole-injection layer 508a including a composite material of an organic compound and an inorganic compound, over the light-transmitting electrode 504. The thickness of the hole-injection layer 508a was set to 13 nm, and the weight ratio of DBT3P-II (abbreviation) to molybdenum oxide was adjusted to 1:0.5 (=DBT3P-II: molybdenum oxide). Note that the co-evaporation method refers to an evaporation method in which evaporation is carried out from a plurality of evaporation sources at the same time in one treatment chamber.

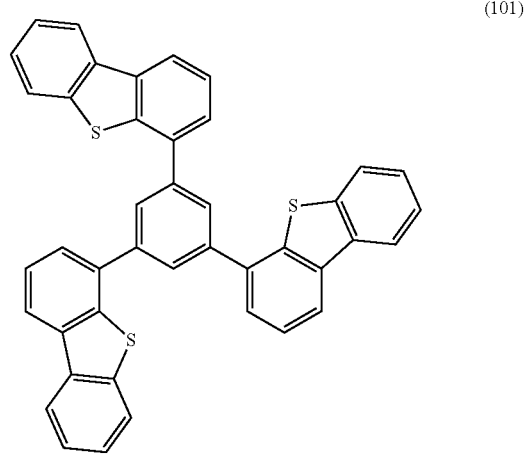

(101)

[DBT-3P-II]

Next, by an evaporation method using resistance heating, 4-phenyl-4'-(9-phenylfluoren-9-yl)triphenylamine (abbre viation: BPAFLP represented by the structural formula (102) below) was deposited to a thickness of 20 nm over the hole-injection layer 508a to form the hole-transport layer 508b.

(102)

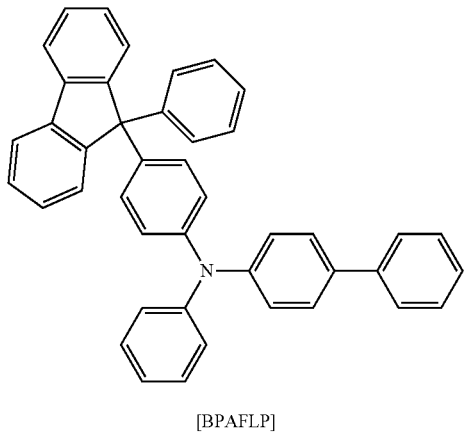

[BPAFLP]

After that, over the hole-transport layer 508b, 2-[3-(dibenzothiophen-4-yl)phenyl]dibenzo[f,h]quinoxaline (abbreviation: 2mDBTPDBq-II represented by the structural formula (103) below), 4-phenyl-4'-(9-phenyl-9H-carbazol-3-yl)triphenylamine (abbreviation: PCBA1BP represented by the structural formula (104) below), and (acetylacetonato)bis(4,6-diphenylpyrimidinato)iridium(III) (abbreviation: [Ir(dppm)$_2$(acac)] represented by the structural formula (105) below) were co-evaporated, so that the light-emitting layer 508c having a thickness of 40 nm was formed. At this time, the weight ratio of 2mDBTPDBq-II (abbreviation) to PCBA1BP (abbreviation) to [Ir(dppm)$_2$(acac)] (abbreviation) was adjusted to 0.8:0.2:0.06 (=2mDBTPDBq-II: PCBA1BP:[Ir(dppm)$_2$(acac)]). Note that Ir(dppm)$_2$(acac) (abbreviation) is a phosphorescent compound which exhibits orange light emission.

(103)

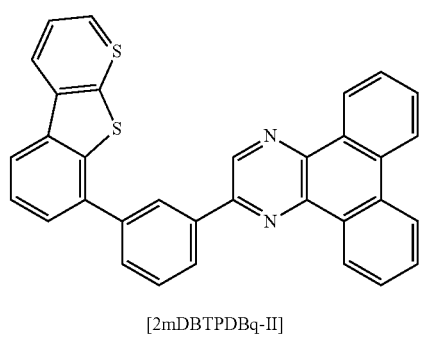

[2mDBTPDBq-II]

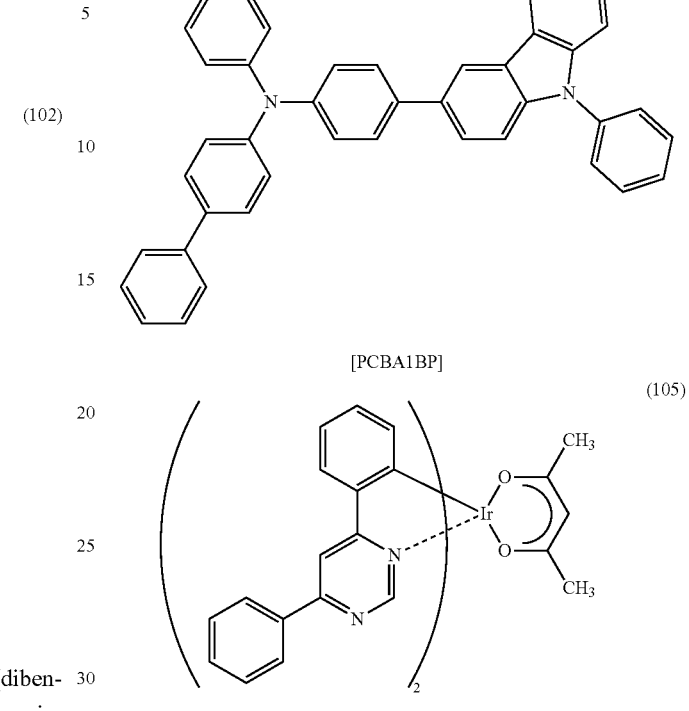

[PCBA1BP]

[Ir(dppm)$_2$(acac)]

After that, by an evaporation method using resistance heating, a film of 2mDBTPDBq-II (abbreviation) with a thickness of 10 nm and a film of bathophenanthroline (abbreviation: BPhen represented by the structural formula (106)) with a thickness of 10 nm were deposited to be stacked in this order over the light-emitting layer 508c, whereby an electron-transport layer 508d was formed.

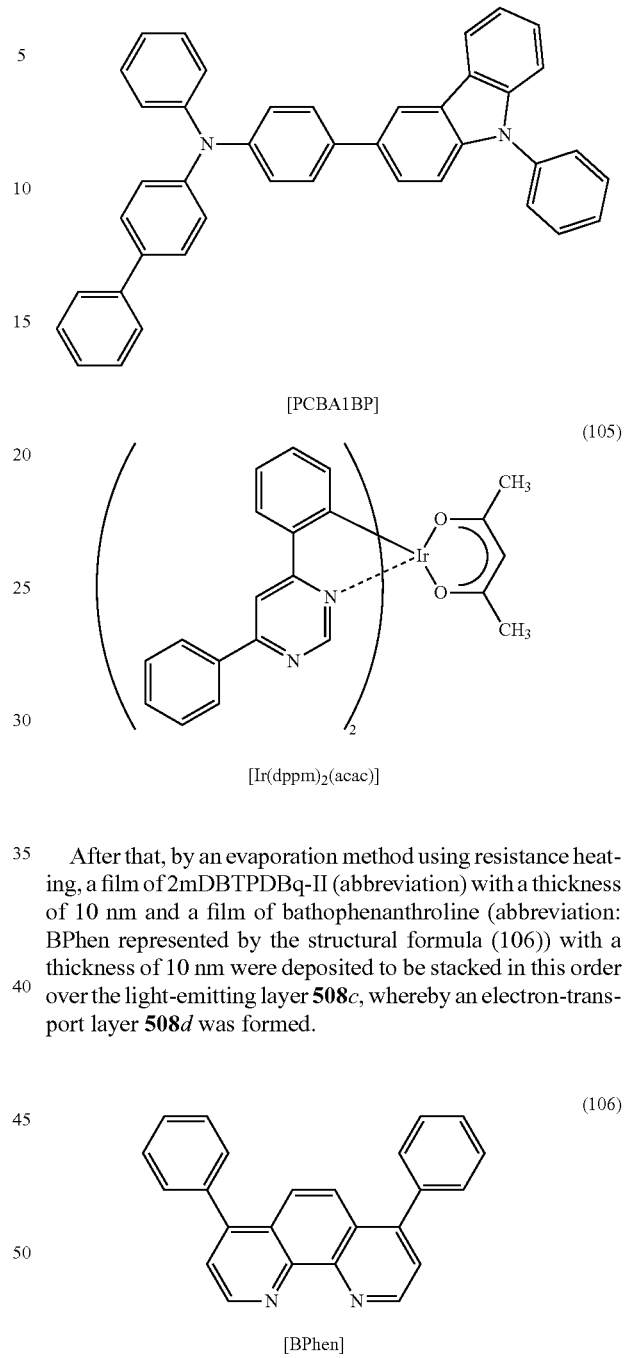

[BPhen]

In this manner, the first light-emitting layer 508 including the hole-injection layer 508a, the hole-transport layer 508b, the light-emitting layer 508c, and the electron-transport layer 508d was formed.

Next, lithium oxide (LiO$_2$) was evaporated over the electron-transport layer 508d to a thickness of 0.1 nm to form the electron-injection buffer layer 514a.

Then, the electron-relay layer 514b with a thickness of 2 nm was formed over the electron-injection buffer layer 514a by evaporation of copper phthalocyanine (abbreviation: CuPc represented by the structural formula (107)).

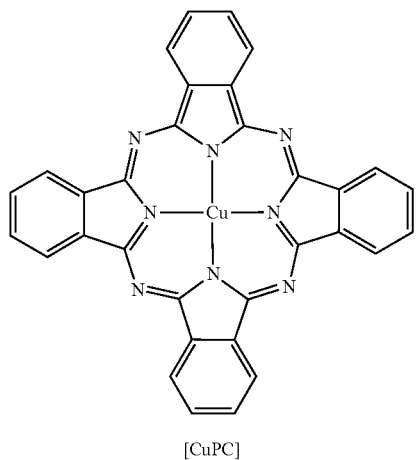

[CuPC]

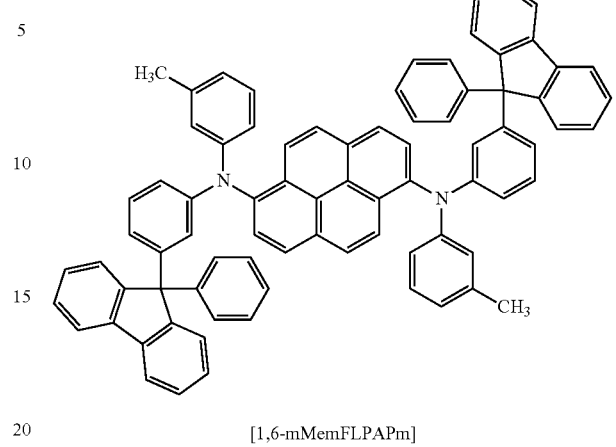

[1,6-mMemFLPAPm]

Next, DBT3P-II (abbreviation) as a substance with a high hole-transport property and molybdenum oxide as an acceptor substance were co-evaporated to form the charge-generation layer 514c over the electron-relay layer 514b. The thickness thereof was set to 13 nm, and the weight ratio of DBT3P-II to molybdenum oxide was adjusted to 1:0.5 (=DBT3P-II: molybdenum oxide).

In this manner, the first intermediate layer 514 including the electron-injection buffer layer 514a, the electron-relay layer 514b, and the charge-generation layer 514c was formed.

Then, the second light-emitting layer 510 was formed over the first intermediate layer 514 in the following manner. First, BPAFLP (abbreviation) was deposited to a thickness of 10 nm over the charge-generation layer 514c to form the hole-transport layer 510a by an evaporation method using resistance heating.

Then, 9-[4-(10-phenyl-9-anthryl)phenyl]-9H-carbazole (abbreviation: CzPA represented by the structural formula (108) below) and N,N'-bis(3-methylphenyl)-N,N'-bis[3-(9-phenyl-9H-fluoren-9-yl)phenyl]pyrene-1,6-dia mine (abbreviation: 1,6mMemFLPAPrn represented by the structural formula (109) below) were co-evaporated to form the light-emitting layer 510b with a thickness of 30 nm over the hole-transport layer 510a. Here, the weight ratio of CzPA (abbreviation) to 1,6mMemFLPAPrn (abbreviation) was adjusted to be 1:0.05 (=CzPA: 1,6mMemFLPAPrn). Note that CzPA (abbreviation) is a substance with an electron-transport property and 1,6mMemFLPAPm (abbreviation) that is a guest material is a fluorescent compound which exhibits blue light emission.

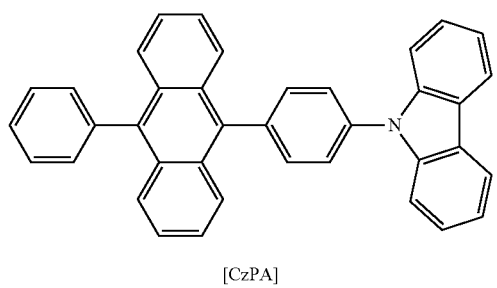

[CzPA]

Then, CzPA (abbreviation) with a thickness of 5 nm and BPhen (abbreviation) with a thickness of 15 nm were deposited to be stacked in this order over the light-emitting layer 510b by evaporation, whereby the electron-transport layer 510c was formed.

In this manner, the second light-emitting layer 510 including the hole-transport layer 510a, the light-emitting layer 510b, and the electron-transport layer 510c was fowled.

Next, lithium oxide ($Li_2O$) was deposited to a thickness of 0.1 nm over the electron-transport layer 510c to form the electron-injection buffer layer 516a by evaporation.

Next, the electron-relay layer 516b with a thickness of 2 nm was formed over the electron-injection buffer layer 516a by evaporation of CuPc (abbreviation).

Next, DBT3P-II (abbreviation) as a substance having a high hole-transport property and molybdenum oxide as an acceptor substance were co-evaporated over the electron-relay layer 516b to form the charge-generation layer 516c. The thickness was 33 nm, and the weight ratio of DBT3P-II (abbreviation) to molybdenum oxide was adjusted so as to be 1:0.5 (=DBT3P-II: molybdenum oxide). In this manner, the second intermediate layer 516 including the electron-injection buffer 516a, the electron-relay layer 516b, and the charge-generation layer 516c was formed.

Next, the third light-emitting layer 512 was formed over the second intermediate layer 516 in the following manner. First, by an evaporation method using resistance heating, BPAFLP (abbreviation) was deposited to a thickness of 20 nm over the charge-generation layer 516c to form the hole-transport layer 512a.

Then, 2mDBTPDBq-II (abbreviation), PCBA1BP (abbreviation), and [Ir(dppm)$_2$(acac)] (abbreviation) were co-evaporated, so that the light-emitting layer 512b with a thickness of 40 nm was formed over the hole-transport layer 512a. The weight ratio of 2mDB IPDBq-II (abbreviation) to PCBA1BP (abbreviation) and [Ir(dppm)$_2$(acac)] (abbreviation) was adjusted to 0.8:0.2:0.06 (=2mDBTPDBq-II: PCBA1BP:[Ir(dppm)$_2$(acac)]).

Next, 2mDBTPDBq-II (abbreviation) with a thickness of 25 nm and BPhen (abbreviation) with a thickness of 15 nm were deposited to be stacked in this order over the light-emitting layer 512b by evaporation, whereby the electron-transport layer 512c was formed. Then, lithium fluoride (LiF) was evaporated to a thickness of 1 nm over the electron-transport layer 512c to form the electron-injection layer 512d.

In this manner, the third light-emitting layer 512 including the hole-transport layer 512a, the light-emitting layer 512b, the electron-transport layer 512c, and the electron-injection layer 512d was formed.

Lastly, a 200-nm-thick aluminum film was formed over the electron-injection layer 512d by an evaporation method using resistance heating to form the light-reflecting electrode 506. In this manner, the light-emitting element 1 was fabricated.

(Comparative Light-Emitting Element 1)

Next, the comparative light-emitting element 1 will be described (see FIG. 4). A film of indium tin oxide including silicon oxide (ITO—$SiO_2$) was formed over a substrate 602 by a sputtering method, thereby forming a light-transmitting electrode 604. The thickness was 110 nm and the electrode area was 2 mm×2 mm.

Next, the substrate provided with the light-transmitting electrode 604 was fixed to a substrate holder in a vacuum evaporation apparatus so that a surface of the substrate over which the light-transmitting electrode 604 was formed faced downward. The pressure in the vacuum evaporation apparatus was reduced to about $10^{-4}$ Pa. Then, 9-phenyl-3-[4-(10-phenyl-9-anthryl)phenyl]-9H-carbazole (abbreviation: PCzPA represented by the structural formula (110)) as a substance having a high hole-transport property and molybdenum oxide as an acceptor substance were co-evaporated to form a hole-injection layer 608a including a composite material of an organic compound and an inorganic compound, over the light-transmitting electrode 604. The thickness of the hole-injection layer 608a was set to 60 nm, and the weight ratio of PCzPA (abbreviation) to molybdenum oxide was adjusted to 1:0.5 (=PCzPA: molybdenum oxide).

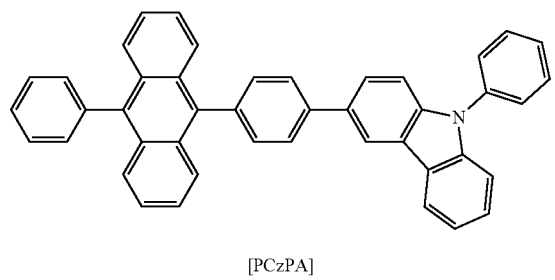

[PCzPA] (110)

Next, by an evaporation method using resistance heating, PCzPA (abbreviation) was deposited to a thickness of 30 nm over the hole-injection layer 608a to form a hole-transport layer 608b.

Then, 9-[4-(10-phenyl-9-anthryl)phenyl]-9H-carbazole (abbreviation: CzPA represented by the structural formula (108) below) and N,N-bis(3-methylphenyl)-N,N'-bis[3-(9-phenyl-9H-fluoren-9-yl)phenyl]pyrene-1,6-dia mine (abbreviation: 1,6mMemFLPAPrn represented by the structural formula (109) below) were co-evaporated to form a light-emitting layer 608c with a thickness of 30 nm over the hole-transport layer 608b. Here, the weight ratio of CzPA (abbreviation) to 1,6mMemFLPAPrn (abbreviation) was adjusted to be 1:0.05 (=CzPA: 1,6mMemFLPAPrn). Note that CzPA (abbreviation) is a substance with an electron-transport property and 1,6mMemFLPAPrn (abbreviation) that is a guest material is a fluorescent compound which exhibits blue light emission.

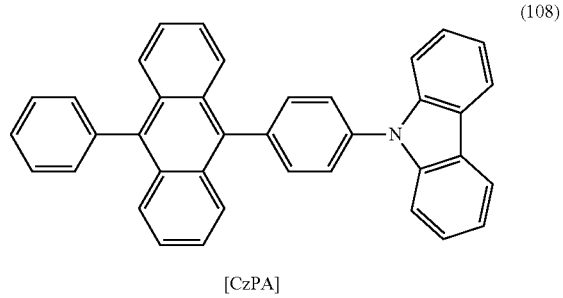

[CzPA] (108)

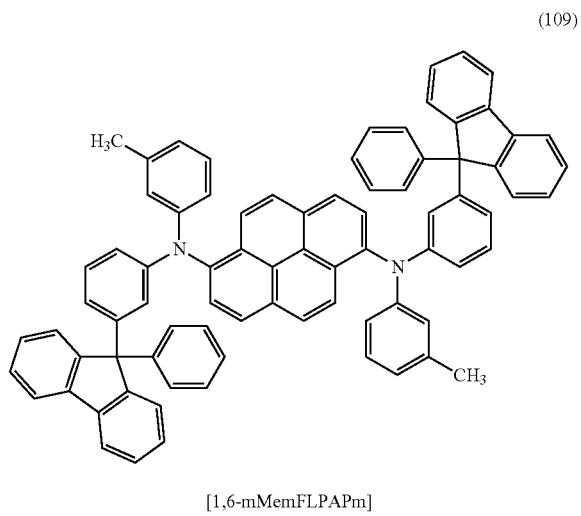

[1,6-mMemFLPAPm] (109)

After that, by an evaporation method using resistance heating, CzPA (abbreviation) with a thickness of 5 nm and bathophenanthroline (abbreviation: BPhen represented by the structural formula (106)) with a thickness of 15 nm were deposited to be stacked in this order over the light-emitting layer 608c, whereby an electron-transport layer 608d was formed.

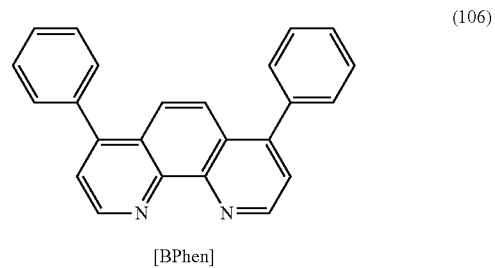 [SMILES: c1ccc(-c2ccnc3c2ccc2c(-c4ccccc4)ccnc23)cc1]

[BPhen] (106)

In this manner, the first light-emitting layer 608 including the hole-injection layer 608a, the hole-transport layer 608b, the light-emitting layer 608c, and the electron-transport layer 608d was formed.

Next, lithium oxide ($Li_2O$) was evaporated over the electron-transport layer 608d to a thickness of 0.1 nm to form an electron-injection buffer 614a.

Next, an electron-relay layer 614b with a thickness of 2 nm was formed over the electron-injection buffer 614a by evaporation of copper phthalocyanine (abbreviation: CuPc represented by the structural formula (107)).

(107)

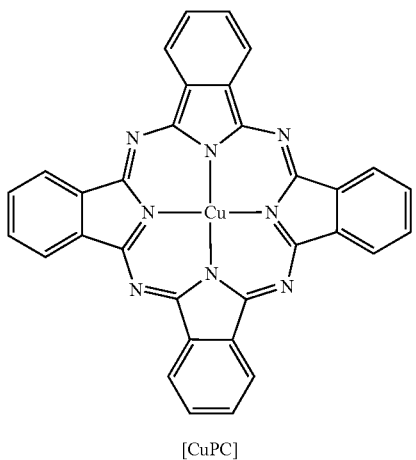

[CuPC]

Next, PCzPA (abbreviation) as a substance with a high hole-transport property and molybdenum oxide as an acceptor substance were co-evaporated to form a charge-generation layer 614c over the electron-relay layer 614b. The thickness thereof was 20 nm and the weight ratio of PCzPA (abbreviation) to molybdenum oxide was adjusted to 1:0.5 (=PCzPA: molybdenum oxide).

In this manner, the first intermediate layer 614 including the electron-injection buffer layer 614a, the electron-relay layer 614b, and the charge-generation layer 614c was formed.

Then, a second light-emitting layer 610 was formed over the first intermediate layer 614 in the following manner. First, 4-phenyl-4'-(9-phenylfluoren-9-yl)triphenylamine (abbreviation: BPAFLP represented by the structural formula (102) below) was deposited to a thickness of 20 nm over the charge-generation layer 614c to form a hole-transport layer 610a by an evaporation method using resistance heating.

(102)

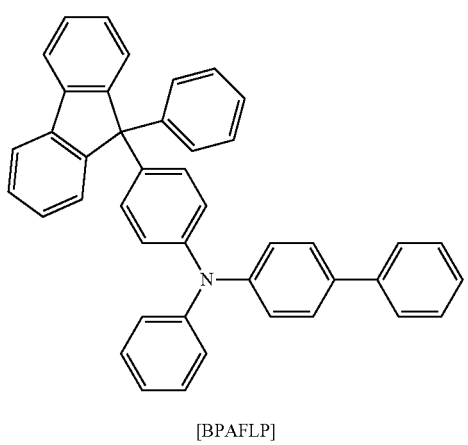

[BPAFLP]

After that, over the hole-transport layer 610a, 2-[3-(dibenzothiophen-4-yl)phenyl]dibenzo[f,h]quinoxaline (abbreviation: 2mDBIPDBq-II represented by the structural formula (103)), 4-phenyl-4'-(9-phenyl-9H-carbazol-3-yl)triphenylamine (abbreviation: PCBA1BP represented by the structural formula (104)), and (acetylacetonato)bis(4,6-diphenylpyrimidinato)iridium(III) (abbreviation: [Ir(dppm)₂(acac)] represented by the structural formula (105)) were co-evaporated, so that a second light-emitting layer 610b with a thickness of 40 nm was formed. The weight ratio of 2mDBTPDBq-II (abbreviation) to PCBA1BP (abbreviation) and [Ir(dppm)₂(acac)] (abbreviation) was adjusted to 0.8:0.2: 0.06 (=2mDBTPDBq-II: PCBAMP:[Ir(dppm)₂(acac)]). Note that [Ir(dppm)₂(acac)] is a phosphorescent compound which exhibits orange light emission.

(103)

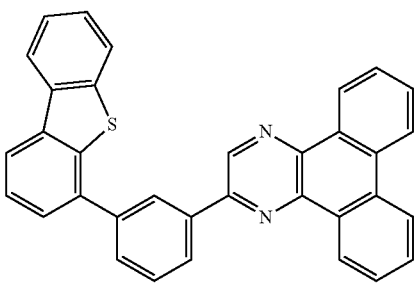

[2mDBTPDBq-II]

(104)

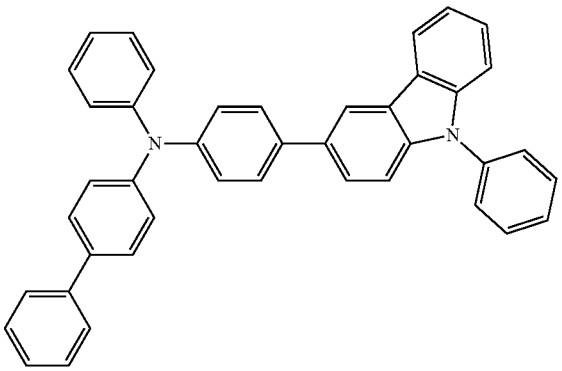

[PCBA1BP]

(105)

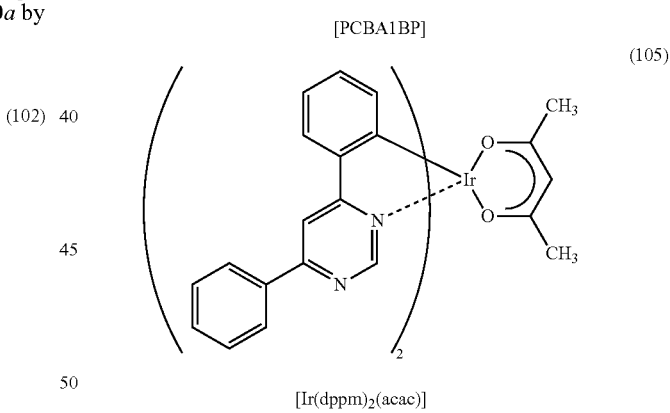

[Ir(dppm)₂(acac)]

Next, 2mDBTPDBq-II (abbreviation) with a thickness of 15 nm and BPhen (abbreviation) with a thickness of 15 nm were deposited to be stacked in this order over the light-emitting layer 610b by evaporation, whereby an electron-transport layer 610c was formed.

In this manner, the second light-emitting layer 610 including the hole-transport layer 610a, the light-emitting layer 610b, and the electron-transport layer 610c was formed.

Next, lithium oxide (Li$_2$O) was evaporated to a thickness of 0.1 nm over the electron-transport layer 610c to faun an electron-injection buffer 616a.

Next, an electron-relay layer 616b with a thickness of 2 nm was formed over the electron-injection buffer 616a by evaporation of CuPc (abbreviation).

Next, PCzPA (abbreviation) as a substance with a high hole-transport property and molybdenum oxide as an acceptor substance were co-evaporated to form a charge-generation layer 616c over the electron-relay layer 616b. The thickness thereof was 67 nm and the weight ratio of PCzPA (abbreviation) to molybdenum oxide was adjusted to 1:0.05 (=PCzPA:molybdenum oxide). In this manner, the second intermediate layer 616 including the electron-injection buffer 616a, the electron-relay layer 616b, and the charge-generation layer 616c was formed.

Next, a third light-emitting layer 612 was formed. First, by an evaporation method using resistance heating, BPAFLP (abbreviation) was deposited to a thickness of 20 nm over the charge-generation layer 616c to form a hole-transport layer 612a.

After that, a light-emitting layer 612b with a thickness of 40 nm was formed over the hole-transport layer 612a by co-evaporation of 2mDBTPDBq-II (abbreviation), PCBA1BP (abbreviation), and [Ir(dppm)$_2$(acac)] (abbreviation). The weight ratio of 2mDBTPDBq-II (abbreviation) to PCBA1BP (abbreviation) and [Ir(dppm)$_2$(acac)] (abbreviation) was adjusted to 0.8:0.2:0.06 (=2mDBTPDBq-II:PCBA1BP:[Ir(dppm)$_2$(acac)]).

Next, 2mDBTPDBq-II (abbreviation) with a thickness of 15 nm and BPhen (abbreviation) with a thickness of 15 nm were deposited to be stacked in this order over the light-emitting layer 612b by evaporation, whereby an electron-transport layer 612c was formed. Lithium fluoride (LiF) was evaporated to a thickness of 1 nm over the electron-transport layer 612c to form an electron-injection layer 612d.

In this manner, the third light-emitting layer 612 including the hole-transport layer 612a, the light-emitting layer 612b, the electron-transport layer 612c, and the electron-injection layer 612d was formed.

Lastly, a 200-nm-thick aluminum film was formed over the electron-injection layer 612d by an evaporation method using resistance heating to form a light-reflecting electrode 606. In this manner, the comparative light-emitting element 1 was fabricated.

Here, the thicknesses of the light-transmitting electrodes, the light-reflecting electrodes, the first to third light-emitting layers, the first intermediate layers, and the second intermediate layers in the light-emitting element 1 and the comparative light-emitting element 1 fabricated in this example are shown in Table 1.

As shown in Table 1, as for the light-emitting element 1, the total thickness of the first light-emitting layer, the second light-emitting layer, the third light-emitting layer, the first intermediate layer, and the second intermediate layer is about 300 nm, while as for the comparative light-emitting element 1, the total thickness of the first light-emitting layer, the second light-emitting layer, the third light-emitting layer, the first intermediate layer, and the second intermediate layer is about 410 nm. In other words, the light-emitting element 1 has a smaller total thickness of the first light-emitting layer, the second light-emitting layer, the third light-emitting layer, the first intermediate layer, and the second intermediate layer than the comparative light-emitting element 1.

In addition, in the light-emitting element 1, a light-emitting layer that emits light having the longest peak wavelength of the three light-emitting layers is used for the first light-emitting layer 508, a light-emitting layer that emits light having the shortest peak wavelength of the three light-emitting layers is used for the second light-emitting layer 510, and a material the same as that of the first light-emitting layer 508 is used for the third light-emitting layer 512. On the other hand, in the comparative light-emitting element 1, a light-emitting layer that emits light having the shortest peak wavelength of the three light-emitting layers is used for the first light-emitting layer 608, and light-emitting layers that emit light having the longest peak wavelength are used for the second light-emitting layer 610 and the third light-emitting layer 612.

In other words, the stack orders of the light-emitting layers in the light-emitting element 1 and the comparative light-emitting element 1 in this example are as follows.

In the light-emitting element 1, orange/blue/orange light-emitting layers are formed in this order from the light-transmitting electrode 504 side, while in the comparative light-emitting element 1, blue/orange/orange light-emitting layers are formed in this order from the light-transmitting electrode 604 side.

In the light-emitting element 1, the optical path length between the light-reflecting electrode 506 and the light-emitting region in the first light-emitting layer 508 is about 270 nm, and is about three fourths of the peak wavelength of light (i.e., orange) emitted from the first light-emitting layer 508. In addition, the optical path length between the light-reflecting electrode 506 and the light-emitting region in the second

TABLE 1

|  | light-transmitting electrode | First light-emitting layer | | | | First intermediate layer | | | Second light-emitting layer | | |
| --- | --- | --- | --- | --- | --- | --- | --- | --- | --- | --- | --- |
|  |  | Hole-injection layer | Hole-transport layer | Light-emitting layer | Electron-transport layer | Electron-injection buffer layer | Electron-relay layer | Charge-generation layer | Hole-transport layer | Light-emitting layer | Electron-transport layer |
| Light-emitting element 1 | 110 nm | 13 nm | 20 nm | 40 nm | 20 nm | 0.1 nm | 2 nm | 13 nm | 10 nm | 30 nm | 20 nm |
| Comparative light-emitting element1 | 110 nm | 60 nm | 30 nm | 30 nm | 20 nm | 0.1 nm | 2 nm | 20 nm | 20 nm | 40 nm | 30 nm |

|  | Second intermediate layer | | | Third light-emitting layer | | | | Light-reflecting electrode |
| --- | --- | --- | --- | --- | --- | --- | --- | --- |
|  | Electron-injection buffer layer | Electron-relay layer | Charge-generation layer | Hole-transport layer | Light-emitting layer | Electron-transport layer | Electron-injection layer |  |
| Light-emitting element 1 | 0.1 nm | 2 nm | 33 nm | 20 nm | 40 nm | 40 nm | 1 nm | 200 nm |
| Comparative light-emitting element1 | 0.1 nm | 2 nm | 67 nm | 20 nm | 40 nm | 30 nm | 1 nm | 200 nm | light-emitting layer 510 is about 185 nm, and is about three fourths of the peak wavelength of light (i.e., blue) emitted from the second light-emitting layer 510. In addition, the optical path length between the light-reflecting electrode 506 and the light-emitting region in the third light-emitting layer 512 is about 80 nm, and is about one fourth of the peak wavelength of light (i.e., orange) emitted from the third light-emitting layer 512. Note that in the light-emitting element 1, it is considered that the light-emitting region in each light-emitting layer can lie near the interface between the hole-transport layer and the light-emitting layer.

On the other hand, in the comparative light-emitting element 1, the optical path length between the light-reflecting electrode 606 and the light-emitting region in the first light-emitting layer 608 is about 320 nm, and is about five fourths of the peak wavelength of light (i.e., blue) emitted from the first light-emitting layer 608. In addition, the optical path length between the light-reflecting electrode 606 and the light-emitting region in the second light-emitting layer 610 is about 230 nm, and is about three fourths of the peak wavelength of light (i.e., orange) emitted from the second light-emitting layer 610. In addition, the optical path length between the light-reflecting electrode 606 and the light-emitting region in the third light-emitting layer 612 is about 70 nm, and is about one fourth of the peak wavelength of light (i.e., orange) emitted from the third light-emitting layer 612. Note that in the comparative light-emitting element 1, it is considered that the light-emitting region in each light-emitting layer can lie near the interface between the hole-transport layer and the light-emitting layer.

By controlling the thickness of each light-emitting layer and the thickness of each intermediate layer in this manner, the optical path length between the light-reflecting electrode and each light-emitting layer can be adjusted. Note that as for the comparative light-emitting element 1, if the optical path length between the light-reflecting electrode 606 and the light-emitting region in the first light-emitting layer 608 is three fourths of a peak wavelength of light emitted from the first light-emitting layer 608, it is about 190 nm, which precludes a possibility of the formation of the light-emitting element. For this reason, the optical path length is set to five fourths of the peak wavelength of light emitted from the first light-emitting layer 608.

The light-emitting element 1 and the comparative light-emitting element 1 fabricated in this manner were sealed in a glove box under a nitrogen atmosphere so that these light-emitting elements were prevented from being exposed to the air. Then, the operation characteristics of the light-emitting element 1 and the comparative light-emitting element 1 were measured. Note that the measurement was carried out at room temperature (in the atmosphere kept at 25° C.).

Figure 5A:
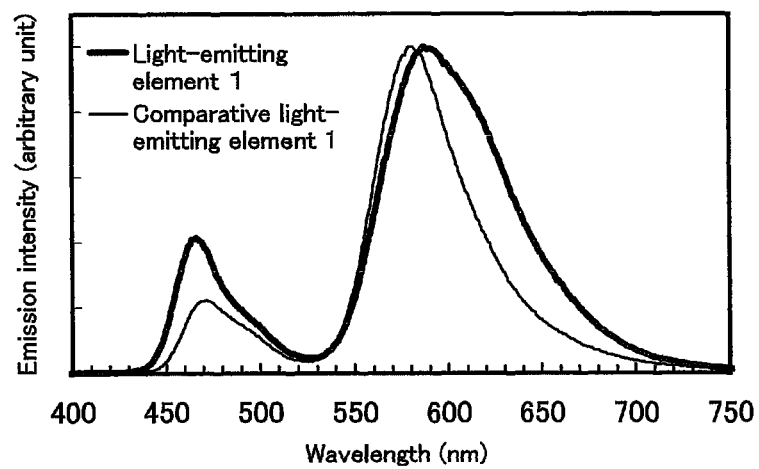
FIGS. 5A and 5B are graphs respectively showing emission spectra and external quantum efficiency vs. luminance plots of the light-emitting element 1 and the comparative light-emitting element 1.
Figure 5B:
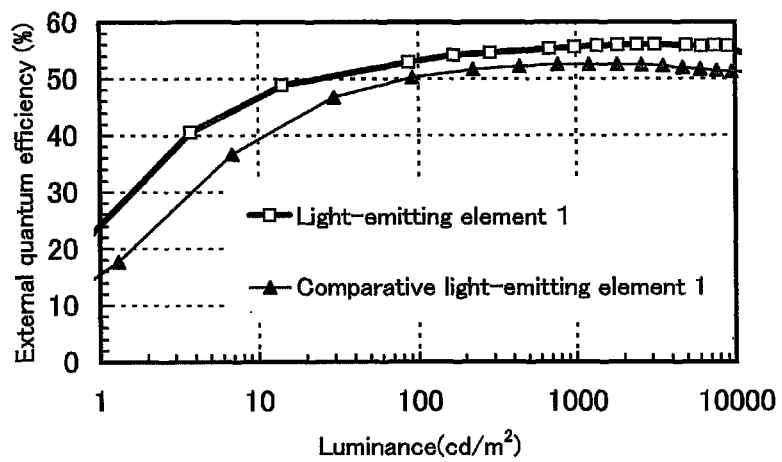
Figure 6:
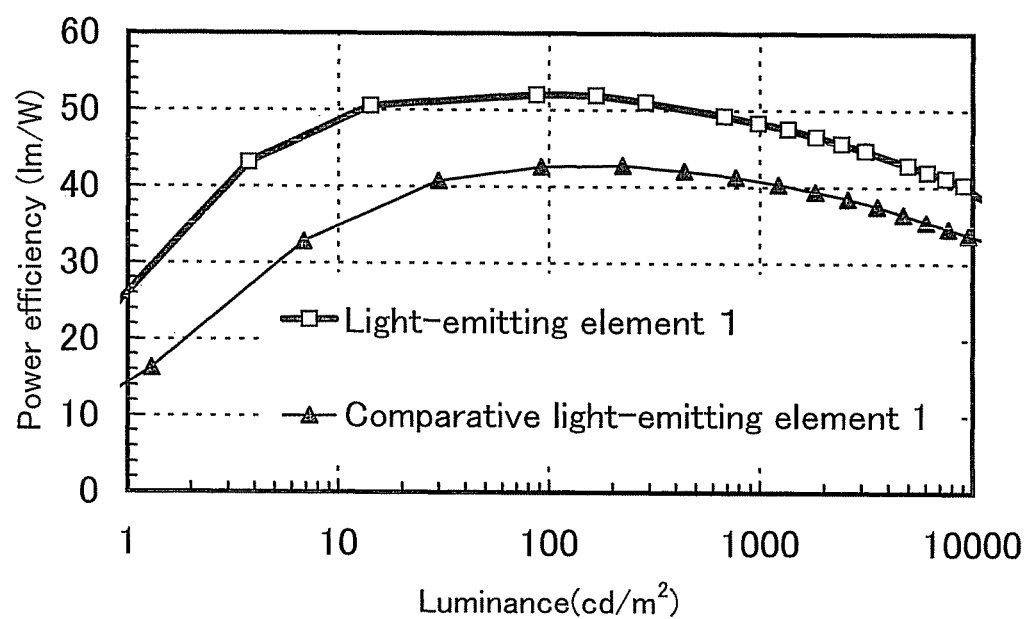
FIG. 6 is a graph showing power efficiency vs. luminance plots of the light-emitting element 1 and the comparative light-emitting element 1.

FIG. 5A shows emission spectra of the light-emitting element 1 and the comparative light-emitting element 1, FIG. 5B shows external quantum efficiency vs. luminance plots of the light-emitting element 1 and the comparative light-emitting element 1, and FIG. 6 shows power efficiency vs. luminance plots of the light-emitting element 1 and the comparative light-emitting element 1.

As shown in FIG. 5A, the light-emitting element 1 has two peaks in visible light region: the first peak at 466 nm in the blue wavelength range and the second peak at 587 nm in the orange wavelength range. On the other hand, the comparative light-emitting element 1 also has two peaks in visible light region: the first peak at 471 nm in the blue wavelength range and the second peak at 581 nm in the orange wavelength range.

This is because that the light-emitting element 1 and the comparative light-emitting element 1 both have stacked layers of the light-emitting layer that emits blue light in a wavelength range of low luminosity and the light-emitting layer that emits orange light in a wavelength range of high luminosity. Thus, it is found that the light-emitting element 1 and the comparative light-emitting element 1 both can emit light with white color close to incandescent color or warm white color.

However, the light-emitting element 1 has a broader orange wavelength range than the comparative light-emitting element 1, because the light-emitting element 1 is different from the comparative light-emitting element 1 in the stack order of the light-emitting layers and the thickness of each light-emitting layer and each intermediate layer.

Next, as shown in FIG. 5B, the light-emitting element 1 has a maximum external quantum efficiency of 55.9%, while the comparative light-emitting element 1 has a maximum external quantum efficiency of 51.9%. The difference in external quantum efficiency results from that the external quantum efficiency in the total luminous flux of the light-emitting element 1 is increased by the broader orange wavelength range in the emission spectrum in FIG. 5A.

Next, as shown in FIG. 6, the light-emitting element 1 has a maximum power efficiency of 52.0 lm/W, while the comparative light-emitting element 1 has a maximum power efficiency of 42.7 lm/W. The difference in power efficiency results from that the power efficiency in the total luminous flux of the light-emitting element 1 is increased by the broader orange wavelength range in the emission spectrum in FIG. 5A.

As described above, the following was confirmed: the light-emitting element 1 in accordance with one embodiment of the present invention has two peaks in the visible region and emits light with white color close to incandescent color or warm white color; the light-emitting element 1 in accordance with one embodiment of the present invention has a higher power efficiency than the comparative light-emitting element 1; and the light-emitting element 1 in accordance with one embodiment of the present invention has smaller thicknesses of the light-emitting layers than those of the comparative light-emitting element 1.

This embodiment can be implemented in combination with any of the other embodiments or the examples, as appropriate.

EXAMPLE 2

Figure 9A:
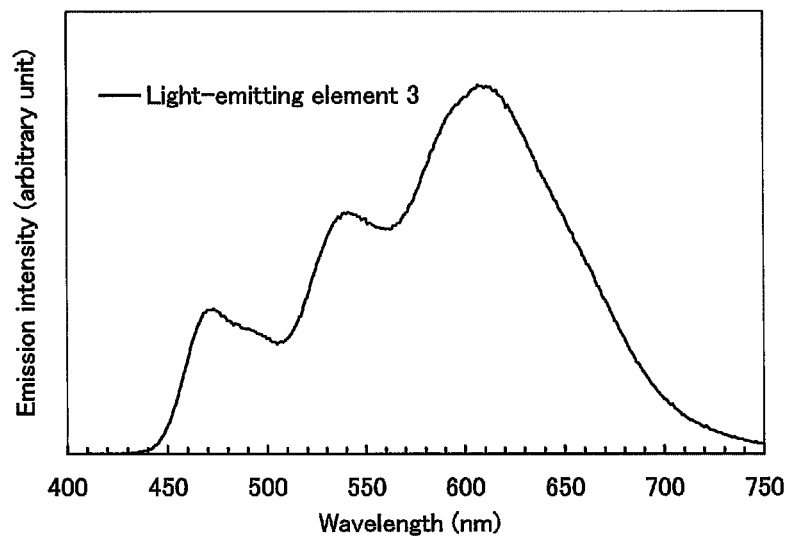
FIGS. 9A and 9B are graphs respectively showing an emission spectrum and external quantum efficiency vs. luminance plots of a light-emitting element 3.
Figure 9B:
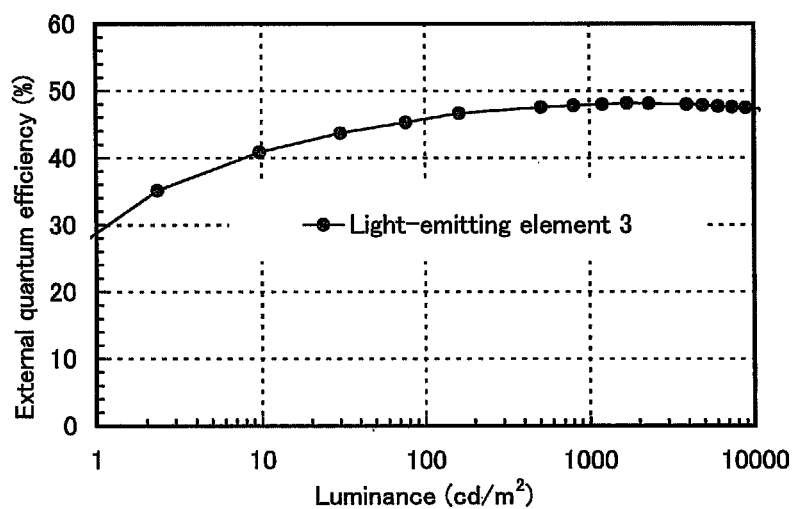
Figure 10:
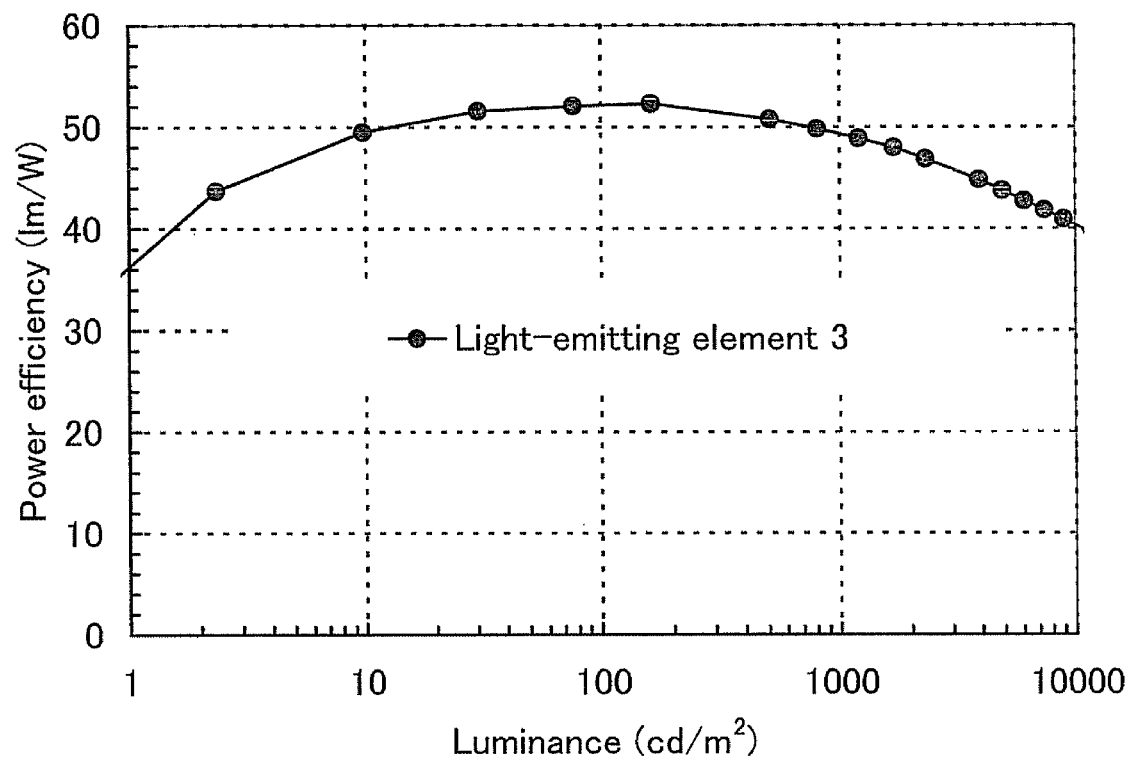
FIG. 10 is a graph showing power efficiency vs. luminance plots of the light-emitting element 3.

In this example, a light-emitting element 2 and a light-emitting element 3 each having a structure similar to the light-emitting element described in Embodiment 3 were fabricated and evaluated. The light-emitting element 2 and the light-emitting element 3 will be described with reference to FIG. 2, FIGS. 7A, 7B, FIG. 8. FIGS. 9A, 9B, and FIG. 10.

First, fabrication methods of the light-emitting element 2 and the light-emitting element 3 in this example are described with reference to FIG. 2, FIGS. 7A, 7B, FIG. 8. FIGS. 9A, 9B, and FIG. 10.

(Light-Emitting Element 2)

First, the light-emitting element 2 will be described (see FIG. 2). A film of indium tin oxide including silicon oxide (ITO—$SiO_2$) was formed over the substrate 502 by a sputtering method, thereby forming the light-transmitting electrode 504. The thickness was 110 nm and the electrode area was 2 mm×2 mm.

Next, the substrate provided with the light-transmitting electrode 504 was fixed to a substrate holder in a vacuum evaporation apparatus so that a surface of the substrate over which the light-transmitting electrode 504 was formed faced downward. The pressure in the vacuum evaporation apparatus was reduced to about 10 Pa. Then, DBT3P-II (abbreviation) (the structural formula (101) below) as a substance with a high hole-transport property and molybdenum oxide as an acceptor substance were co-evaporated to form the hole-injection layer 508a including a composite material of an organic compound and an inorganic compound, over the light-transmitting electrode 504. The thickness of the hole-injection layer 508a was set to 26.6 nm, and the weight ratio of DBT3P-II (abbreviation) to molybdenum oxide was adjusted to 1:0.5 (=DBT3P-II: molybdenum oxide).

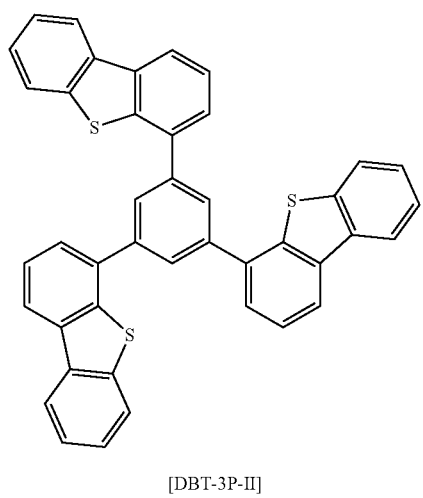

[DBT-3P-II]

(101)

Next, by an evaporation method using resistance heating, BPAFLP (abbreviation) (the structural formula (102) below) was deposited to a thickness of 20 nm over the hole-injection layer 508a to form the hole-transport layer 508b.

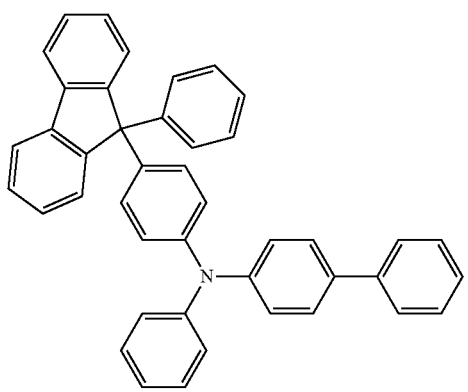

[BPAFLP]

(102)

After that, over the hole-transport layer 508b, 2mDBTP-DBq-II (abbreviation) (the structural formula (103) below), PCBA1BP (abbreviation) (the structural formula (104) below), and bis(2,3,5-triphenylpyrazinato)(dipivaloylmethanato)iridium(III) (abbreviation: [Ir(tppr)$_2$(dpm)] represented by the structural formula (111) below) were co-evaporated, so that the light-emitting layer 508c having a thickness of 40 nm was formed. At this time, the weight ratio of 2mDBTPDBq-II (abbreviation) to PCBA1BP (abbreviation) and [Ir(tppr)$_2$(dpm)] (abbreviation) was adjusted to 0.8:0.2:0.06 (=2mDBTPDBq-II:PCBA1BP:[Ir(tppr)$_2$(dpm)]). Note that [Ir(tppr)$_2$(dpm)] (abbreviation) is a phosphorescent compound which exhibits red light emission.

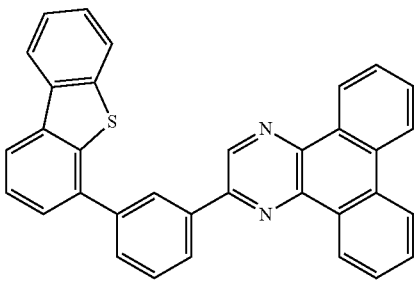

[2mDBTPDBq-II]

(103)

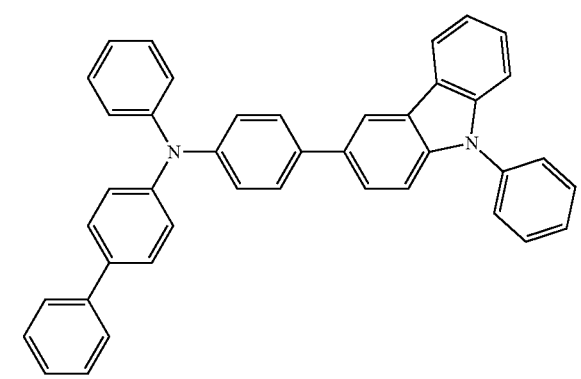

[PCBA1BP]

(104)

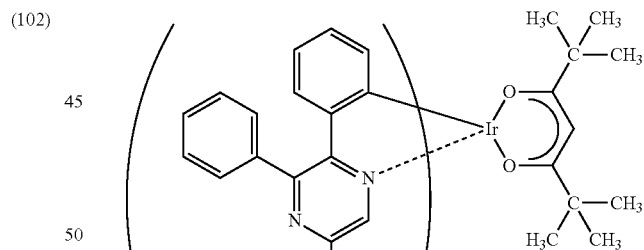

[Ir(tppr)$_2$(dpm)]

(111)

After that, by an evaporation method using resistance heating, a film of 2mDBTPDBq-II (abbreviation) with a thickness of 5 nm and a film of BPhen (abbreviation) (the structural formula (106)) with a thickness of 10 nm were deposited to be stacked in this order over the light-emitting layer 508c, whereby an electron-transport layer 508d was formed.

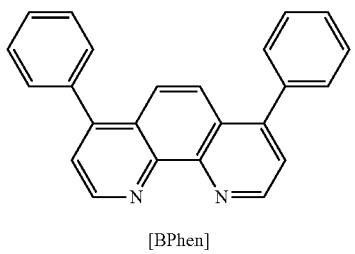

[BPhen] (106)

In this manner, the first light-emitting layer 508 including the hole-injection layer 508a, the hole-transport layer 508b, the light-emitting layer 508c, and the electron-transport layer 508d was formed.

Next, lithium oxide ($Li_2O$) was evaporated over the electron-transport layer 508d to a thickness of 0.1 nm to form the electron-injection buffer layer 514a.

Then, the electron-relay layer 514b with a thickness of 2 nm was formed over the electron-injection buffer layer 514a by evaporation of CuPc (abbreviation) (the structural formula (107)).

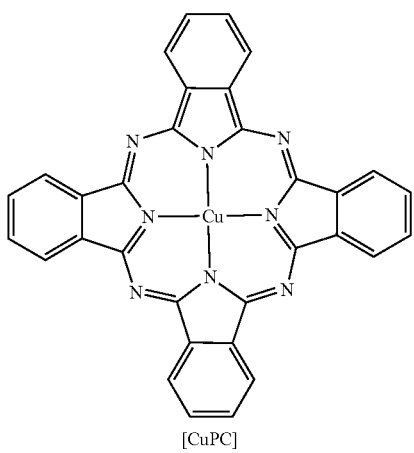

[CuPC] (107)

Next, DBT3P-II (abbreviation) as a substance with a high hole-transport property and molybdenum oxide as an acceptor substance were co-evaporated to form the charge-generation layer 514c over the electron-relay layer 514b. The thickness thereof was set to 3.3 nm, and the weight ratio of DBT3P-II (abbreviation) to molybdenum oxide was adjusted to 1:0.5 (=DBT3P-II: molybdenum oxide).

In this manner, the first intermediate layer 514 including the electron-injection buffer layer 514a, the electron-relay layer 514b, and the charge-generation layer 514c was formed.

Then, the second light-emitting layer 510 was formed over the first intermediate layer 514 in the following manner. First, BPAFLP (abbreviation) was deposited to a thickness of 10 nm over the charge-generation layer 514c to form the hole-transport layer 510a by an evaporation method using resistance heating.

Then, CzPA (abbreviation) (the structural formula (108) below) and 1,6mMemFLPAPrn (abbreviation) (the structural formula (109) below) were co-evaporated to form the light-emitting layer 510b with a thickness of 30 nm over the hole-transport layer 510a. Here, the weight ratio of CzPA (abbreviation) to 1,6mMemFLPAPrn (abbreviation) was adjusted to be 1:0.05 (=CzPA: 1,6mMemFLPAPrn). Note that CzPA (abbreviation) is a substance with an electron-transport property and 1,6mMemFLPAPrn (abbreviation) that is a guest material is a fluorescent compound which exhibits blue light emission.

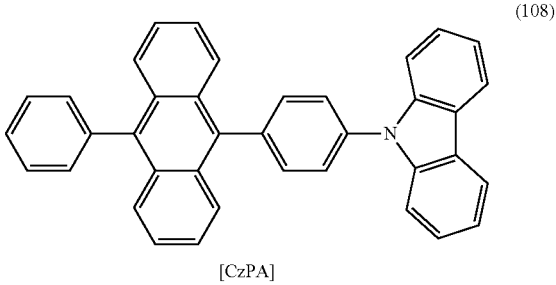

[CzPA] (108)

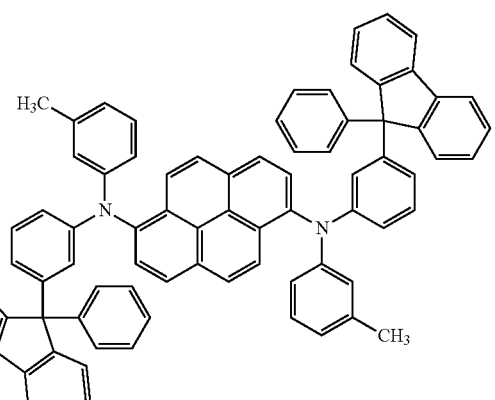

[1,6-mMemFLPAPrn] (109)

Then, CzPA (abbreviation) with a thickness of 5 nm and BPhen (abbreviation) with a thickness of 10 nm were deposited to be stacked in this order over the light-emitting layer 510b by evaporation, whereby the electron-transport layer 510c was formed.

In this manner, the second light-emitting layer 510 including the hole-transport layer 510a, the light-emitting layer 510b, and the electron-transport layer 510c was formed.

Next, lithium oxide ($Li_2O$) was deposited to a thickness of 0.1 nm over the electron-transport layer 510c to form the electron-injection buffer layer 516a by evaporation.

Next, the electron-relay layer 516b with a thickness of 2 nm was formed over the electron-injection buffer layer 516a by evaporation of CuPc (abbreviation).

Next, DBT3P-II (abbreviation) as a substance having a high hole-transport property and molybdenum oxide as an acceptor substance were co-evaporated over the electron-relay layer 516b to form the charge-generation layer 516c. The thickness was 53.3 nm, and the weight ratio of DBT3P-II (abbreviation) to molybdenum oxide was adjusted so as to be 1:0.5 (=DBT3P-II: molybdenum oxide). In this manner, the second intermediate layer 516 including the electron-injection buffer 516a, the electron-relay layer 516b, and the charge-generation layer 516c was formed.

Next, the third light-emitting layer 512 was formed over the second intermediate layer 516 in the following manner. First, by an evaporation method using resistance heating, BPAFLP (abbreviation) was deposited to a thickness of 20 nm over the charge-generation layer 516c to form the hole-transport layer 512a.

Then, 2mDBTPDBq-II (abbreviation), PCBA1BP (abbreviation), and (acetylacetonato)bis[4-(2-norbornyl)-6-phenylpyrimidinato]iridium(III) (endo-and exo-mixture) (abbreviation:[Ir(nbppm)$_2$(acac)] represented by the structural formula (112) below) were co-evaporated, so that the light-emitting layer 512b with a thickness of 40 nm was formed over the hole-transport layer 512a. The weight ratio of 2mDBIPDBq-II (abbreviation) to PCBA1BP (abbreviation) and [Ir(nbppm)$_2$(acac)] (abbreviation) was adjusted to 0.8:0.2:0.03 (=2mDBTPDBq-II:PCBA1BP:[Ir(nbppm)$_2$(acac)]). Note that [Ir(nbppm)$_2$(acac)] (abbreviation) is a phosphorescent compound that emits green light.

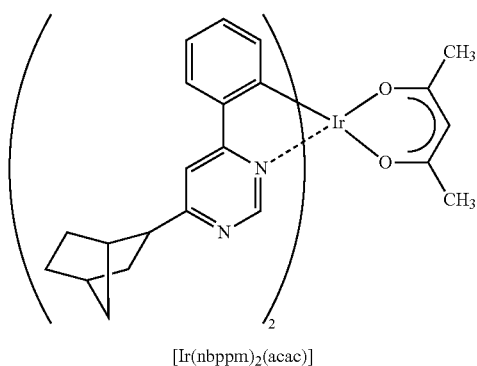

[Ir(nbppm)$_2$(acac)]

(112)

Next, 2mDBTPDBq-II (abbreviation) with a thickness of 25 nm and BPhen (abbreviation) with a thickness of 15 nm were deposited to be stacked in this order over the light-emitting layer 512b by evaporation, whereby the electron-transport layer 512c was formed. Then, lithium fluoride (LiF) was deposited to a thickness of 1 nm over the electron-transport layer 512c to form the electron-injection layer 512d by evaporation.

In this manner, the third light-emitting layer 512 including the hole-transport layer 512a, the light-emitting layer 512b, the electron-transport layer 512c, and the electron-injection layer 512d was formed.

Lastly, a 200-nm-thick aluminum film was formed over the electron-injection layer 512d by an evaporation method using resistance heating to form the light-reflecting electrode 506. In this manner, the light-emitting element 2 was fabricated.

(Light-Emitting Element 3)

First, the light-emitting element 3 will be described (see FIG. 2). A film of indium tin oxide including silicon oxide (ITO—SiO$_2$) was formed over the substrate 502 by a sputtering method, thereby forming the light-transmitting electrode 504. The thickness was 110 nm and the electrode area was 2 mm×2 mm.

Next, the substrate provided with the light-transmitting electrode 504 was fixed to a substrate holder in a vacuum evaporation apparatus so that a surface of the substrate over which the light-transmitting electrode 504 was formed faced downward. The pressure in the vacuum evaporation apparatus was reduced to about 10$^{-4}$ Pa. Then, DBT3P-II (abbreviation) (the structural formula (101) below) as a substance with a high hole-transport property and molybdenum oxide as an acceptor substance were co-evaporated to form the hole-injection layer 508a including a composite material of an organic compound and an inorganic compound, over the light-transmitting electrode 504. The thickness of the hole-injection layer 508a was set to 26.6 nm, and the weight ratio of DBT3P-II (abbreviation) to molybdenum oxide was adjusted to 1:0.5 (=DBT3P-II: molybdenum oxide).

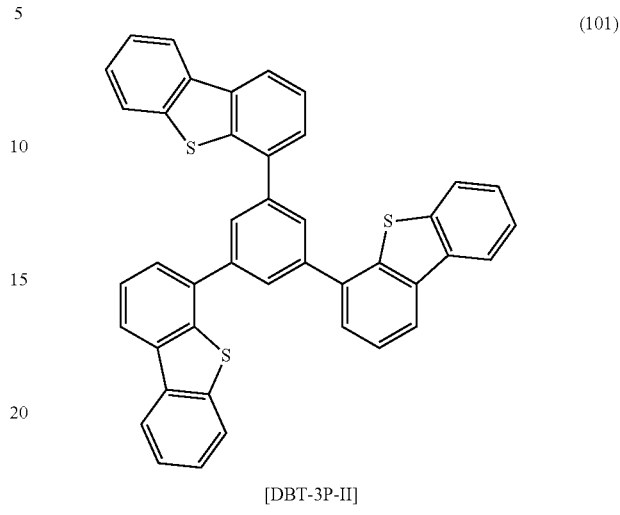

[DBT-3P-II]

(101)

Next, by an evaporation method using resistance heating, BPAFLP (abbreviation) (the structural formula (102) below) was deposited to a thickness of 20 nm over the hole-injection layer 508a to form the hole-transport layer 508b.

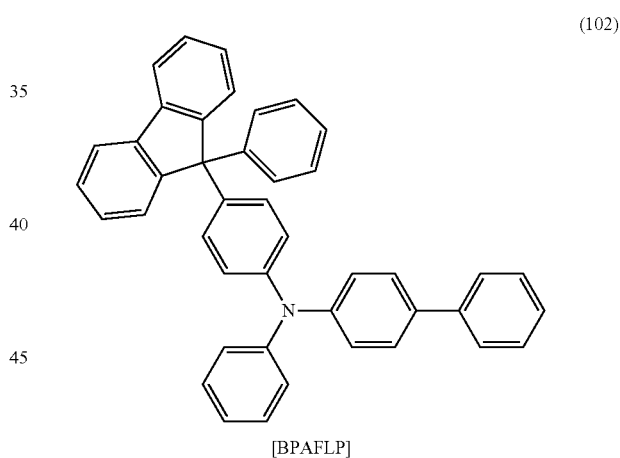

[BPAFLP]

(102)

After that, over the hole-transport layer 508b, 2mDBTPDBq-II (abbreviation) (the structural formula (103) below), PCBA1BP (abbreviation) (the structural formula (104) below), and bis[4,6-bis(3-methylphenyl)pyrimidinato](di-isobutylylmethano)iridium(III) (another name: (2,6-dimethyl-3,5-heptanedionato-κ$^2$O,O')bis[4-methyl-2-(3-methyl-4-pyrimidinyl-κN3) phenyl-κC]iridium(III)) (abbreviation: [Ir(5mdppm)$_2$(dibm)] represented by the structural formula (113) below) were co-evaporated, so that the light-emitting layer 508c having a thickness of 40 nm was formed. At this time, the weight ratio of 2mDRTPDBq-II (abbreviation) to PCBA1BP (abbreviation) and [Ir(5mdppm)$_2$ (dibm)] (abbreviation) was adjusted to 0.8:0.2:0.06 (=2mDBTPDBq-II:PCBA1BP:Ir(5mdppm)$_2$(dibm)). Note that [Ir(5mdppm)$_2$(dibm)] (abbreviation) is a phosphorescent compound which exhibits vermilion light emission.

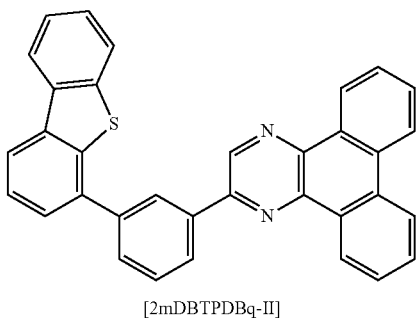

[2mDBTPDBq-II] (103)

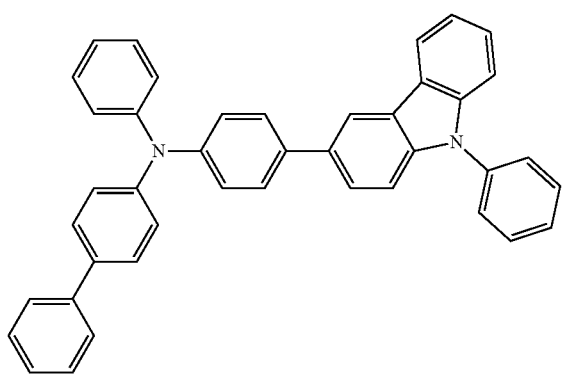

[PCBA1BP] (104)

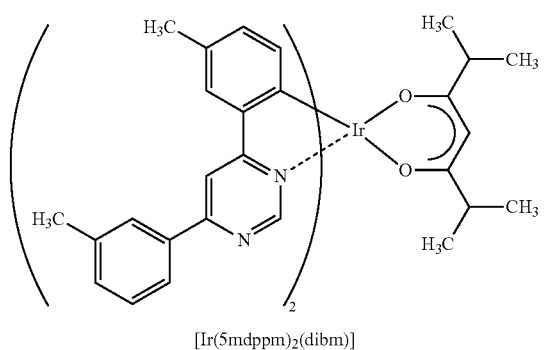

[Ir(5mdppm)₂(dibm)] (113)

After that, by an evaporation method using resistance heating, a film of 2mDBTPDBq-II (abbreviation) with a thickness of 5 nm and a film of BPhen (abbreviation) (the structural formula (106)) with a thickness of 10 nm were deposited to be stacked in this order over the light-emitting layer 508c, whereby an electron-transport layer 508d was formed.

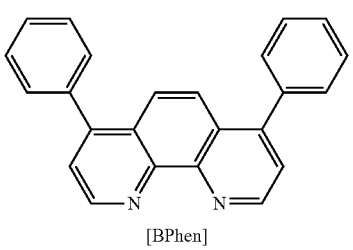

[BPhen] (106)

In this manner, the first light-emitting layer 508 including the hole-injection layer 508a, the hole-transport layer 508b, the light-emitting layer 508c, and the electron-transport layer 508d was formed.

Next, lithium oxide ($Li_2O$) was evaporated over the electron-transport layer 508d to a thickness of 0.1 nm to form the electron-injection buffer layer 514a.

Then, the electron-relay layer 514b with a thickness of 2 nm was formed over the electron-injection buffer layer 514a by evaporation of CuPc (abbreviation) (the structural formula (107)).

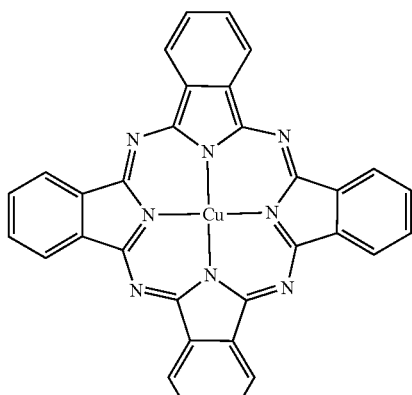

[CuPC] (107)

Next, DBT3P-II (abbreviation) as a substance with a high hole-transport property and molybdenum oxide as an acceptor substance were co-evaporated to form the charge-generation layer 514c over the electron-relay layer 514b. The thickness thereof was set to 3.3 nm, and the weight ratio of DBT3P-II (abbreviation) to molybdenum oxide was adjusted to 1:0.5 (=DBT3P-II: molybdenum oxide).

In this manner, the first intermediate layer 514 including the electron-injection buffer layer 514a, the electron-relay layer 514b, and the charge-generation layer 514c was formed.

Then, the second light-emitting layer 510 was formed over the first intermediate layer 514 in the following manner. First, BPAFLP (abbreviation) was deposited to a thickness of 10 nm over the charge-generation layer 514c to form the hole-transport layer 510a by an evaporation method using resistance heating.

Then, CzPA (abbreviation) (the structural formula (108) below) and 1,6mMemFLPAPrn (abbreviation) (the structural formula (109) below) were co-evaporated to form the light-emitting layer 510b with a thickness of 30 nm over the hole-transport layer 510a. Here, the weight ratio of CzPA (abbreviation) to 1,6mMemFLPAPrn (abbreviation) was adjusted to be 1:0.05 (=CzPA: 1,6mMemFLPAPrn). Note that CzPA (abbreviation) is a substance with an electron-transport property and 1,6mMemFLPAPrn (abbreviation) that is a guest material is a fluorescent compound which exhibits blue light emission.

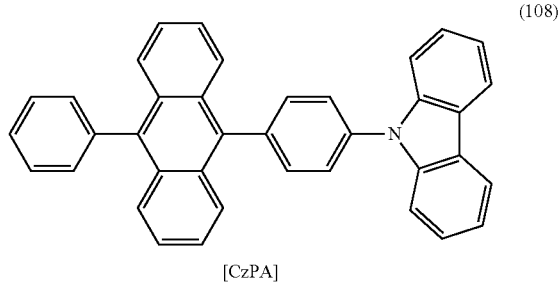

[CzPA] (108)

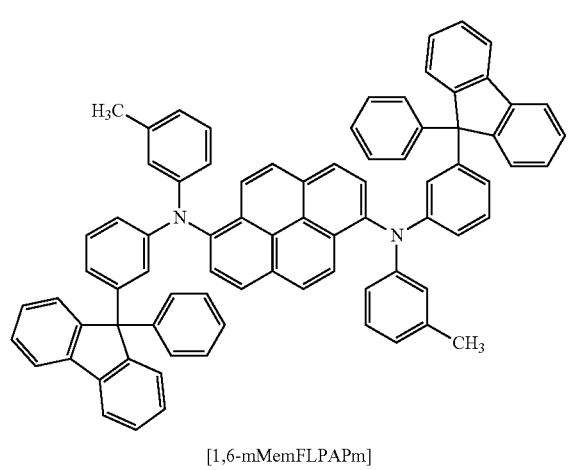

[1,6-mMemFLPAPm] (109)

Then, CzPA (abbreviation) with a thickness of 5 nm and BPhen (abbreviation) with a thickness of 10 nm were deposited to be stacked in this order over the light-emitting layer 510b by evaporation, whereby the electron-transport layer 510c was formed.

In this manner, the second light-emitting layer 510 including the hole-transport layer 510a, the light-emitting layer 510b, and the electron-transport layer 510c was formed.

Next, lithium oxide ($Li_2O$) was deposited to a thickness of 0.1 nm over the electron-transport layer 510c to form the electron-injection buffer 516a by evaporation.

Next, the electron-relay layer 516b with a thickness of 2 nm was formed over the electron-injection buffer layer 516a by evaporation of CuPc (abbreviation).

Next, DBT3P-II (abbreviation) as a substance having a high hole-transport property and molybdenum oxide as an acceptor substance were co-evaporated over the electron-relay layer 516b to faun the charge-generation layer 516c. The thickness was 53.3 nm, and the weight ratio of DBT3P-II (abbreviation) to molybdenum oxide was adjusted so as to be 1:0.5 (=DBT3P-II: molybdenum oxide). In this manner, the second intermediate layer 516 including the electron-injection buffer 516a, the electron-relay layer 516b, and the charge-generation layer 516c was formed.

Next, the third light-emitting layer 512 was formed over the second intermediate layer 516 in the following manner. First, by an evaporation method using resistance heating, BPAFLP (abbreviation) was deposited to a thickness of 20 nm over the charge-generation layer 516c to form the hole-transport layer 512a.

Then, 2mDBTPDBq-II (abbreviation), PCBA1BP (abbreviation), and [Ir(nbppm)$_2$(acac)] (abbreviation) (the structural formula (112)) were co-evaporated, so that the light-emitting layer 512b with a thickness of 40 nm was formed over the hole-transport layer 512a. The weight ratio of 2mDBTPDBq-II (abbreviation) to PCBA1BP (abbreviation) and [Ir(nbppm)$_2$(acac)] (abbreviation) was adjusted to 0.8:0.2:0.03 (=2mDBTPDBq-II:PCBA1BP:[Ir(nbppm)$_2$(acac)]). Note that [Ir(nbppm)$_2$(acac)] (abbreviation) is a phosphorescent compound that emits green light.

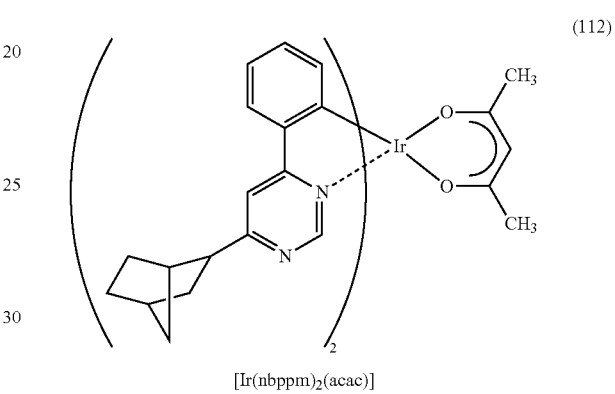

[Ir(nbppm)$_2$(acac)] (112)

Next, 2mDBTPDBq-II (abbreviation) with a thickness of 25 nm and BPhen (abbreviation) with a thickness of 15 nm were deposited to be stacked in this order over the light-emitting layer 512b by evaporation, whereby the electron-transport layer 512c was formated. Then, lithium fluoride (LiF) was deposited to a thickness of 1 nm over the electron-transport layer 512c to form the electron-injection layer 512d by evaporation.

In this manner, the third light-emitting layer 512 including the hole-transport layer 512a, the light-emitting layer 512b, the electron-transport layer 512c, and the electron-injection layer 512d was formed.

Lastly, a 200-nm-thick aluminum film was formed over the electron-injection layer 512d by an evaporation method using resistance heating to form the light-reflecting electrode 506. In this manner, the light-emitting element 3 was fabricated.

Here, the thicknesses of the light-transmitting electrodes, the light-reflecting electrodes, the first to third light-emitting layers, the first intermediate layers, and the second intermediate layers in the light-emitting element 2 and the light-emitting element 3 fabricated in this example are shown in Table 2.

TABLE 2

| | | First light-emitting layer | | | | First intermediate layer | | | Second light-emitting layer | | |
|---|---|---|---|---|---|---|---|---|---|---|---|
| | light-transmitting electrode | Hole-injection layer | Hole-transport layer | Light-emitting layer | Electron-transport layer | Electron-injection buffer layer | Electron-relay layer | Charge-generation layer | Hole-transport layer | Light-emitting layer | Electron-transport layer |
| Light-emitting element 2 | 110 nm | 26.6 nm | 20 nm | 40 nm | 15 nm | 0.1 nm | 2 nm | 3.3 nm | 10 nm | 30 nm | 15 nm |

TABLE 2-continued

| | | | | | | | | | | |
|---|---|---|---|---|---|---|---|---|---|---|
| Light-emitting element 3 | 110 nm | 26.6 nm | 20 nm | 40 nm | 15 nm | 0.1 nm | 2 nm | 3.3 nm | 10 nm | 30 nm | 15 nm |

| | Second intermediate layer | | | Third light-emitting layer | | | Electron-injection layer | Light-reflecting electrode |
|---|---|---|---|---|---|---|---|---|
| | Electron-injection buffer layer | Electron-relay layer | Charge-generation layer | Hole-transport layer | Light-emitting layer | Electron-transport layer | | |
| Light-emitting element 2 | 0.1 nm | 2 nm | 53.3 nm | 20 nm | 40 nm | 40 nm | 1 nm | 200 nm |
| Light-emitting element 3 | 0.1 nm | 2 nm | 53.3 nm | 20 nm | 40 nm | 40 nm | 1 nm | 200 nm |

As shown in Table 2, as for each of the light-emitting element 2 and the light-emitting element 3, the total thickness of the first light-emitting layer, the second light-emitting layer, the third light-emitting layer, the first intermediate layer, and the second intermediate layer is about 320 nm.

In addition, in each of the light-emitting element 2 and the light-emitting element 3, a light-emitting layer that emits light having the longest peak wavelength of the three light-emitting layers is used for the first light-emitting layer 508, a light-emitting layer that emits light having the shortest peak wavelength of the three light-emitting layers is used for the second light-emitting layer 510, and a light-emitting layer that emits light having a wavelength that is shorter than or equal to the wavelength of light emitted from the first light-emitting layer 508 and longer than or equal to the wavelength of light emitted from the second light-emitting layer 510 is used for the third light-emitting layer 512.

In other words, the stack orders of the light-emitting layers in the light-emitting element 2 and the light-emitting element 3 in this example are as follows. In the light-emitting element 2, red/blue/green light-emitting layers are formed in this order from the light-transmitting electrode 504 side, and in the light-emitting element 3, vermilion/blue/green light-emitting layers are formed in this order from the light-transmitting electrode 504 side.

In the light-emitting element 2, the optical path length between the light-reflecting electrode 506 and the light-emitting region in the first light-emitting layer 508 is about 270 nm, and is about three fourths of the peak wavelength of light (i.e., red) emitted from the first light-emitting layer 508. In addition, the optical path length between the light-reflecting electrode 506 and the light-emitting region in the second light-emitting layer 510 is about 200 nm, and is about three fourths of the peak wavelength of light (i.e., blue) emitted from the second light-emitting layer 510. In addition, the optical path length between the light-reflecting electrode 506 and the light-emitting region in the third light-emitting layer 512 is about 80 nm, and is about one fourth of the peak wavelength of light (i.e., green) emitted from the third light-emitting layer 512. Note that in the light-emitting element 2, it is considered that the light-emitting region in each light-emitting layer can lie near the interface between the hole-transport layer and the light-emitting layer.

In the light-emitting element 3, the optical path length between the light-reflecting electrode 506 and the light-emitting region in the first light-emitting layer 508 is about 270 nm, and is about three fourths of the peak wavelength of light (i.e., vermilion) emitted from the first light-emitting layer 508. In addition, the optical path length between the light-reflecting electrode 506 and the light-emitting region in the second light-emitting layer 510 is about 200 nm, and is about three fourths of the peak wavelength of light (i.e., blue) emitted from the second light-emitting layer 510. In addition, the optical path length between the light-reflecting electrode 506 and the light-emitting region in the third light-emitting layer 512 is about 80 nm, and is about one fourth of the peak wavelength of light (i.e., orange) emitted from the third light-emitting layer 512. Note that in the light-emitting element 3, it is considered that the light-emitting region in each light-emitting layer can lie near the interface between the hole-transport layer and the light-emitting layer.

By controlling the thickness of each light-emitting layer and the thickness of each intermediate layer in this manner, the optical path length between the light-reflecting electrode and each light-emitting layer can be adjusted.

The light-emitting element 2 and the light-emitting element 3 fabricated in this manner were sealed in a glove box under a nitrogen atmosphere so that these light-emitting elements were prevented from being exposed to the air. Then, the operation characteristics of the light-emitting element 2 and the light-emitting element 3 were measured. Note that the measurement was carried out at room temperature (in the atmosphere kept at 25° C.).

Figure 7A:
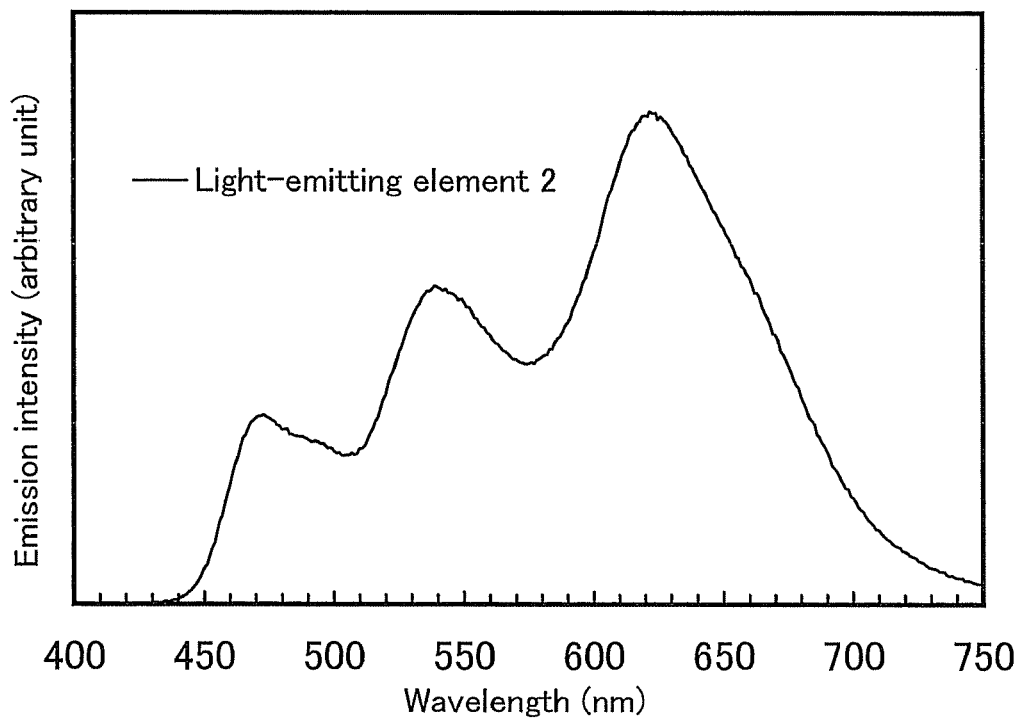
FIGS. 7A and 7B are graphs respectively showing an emission spectrum and external quantum efficiency vs. luminance plots of a light-emitting element 2.
Figure 7B:
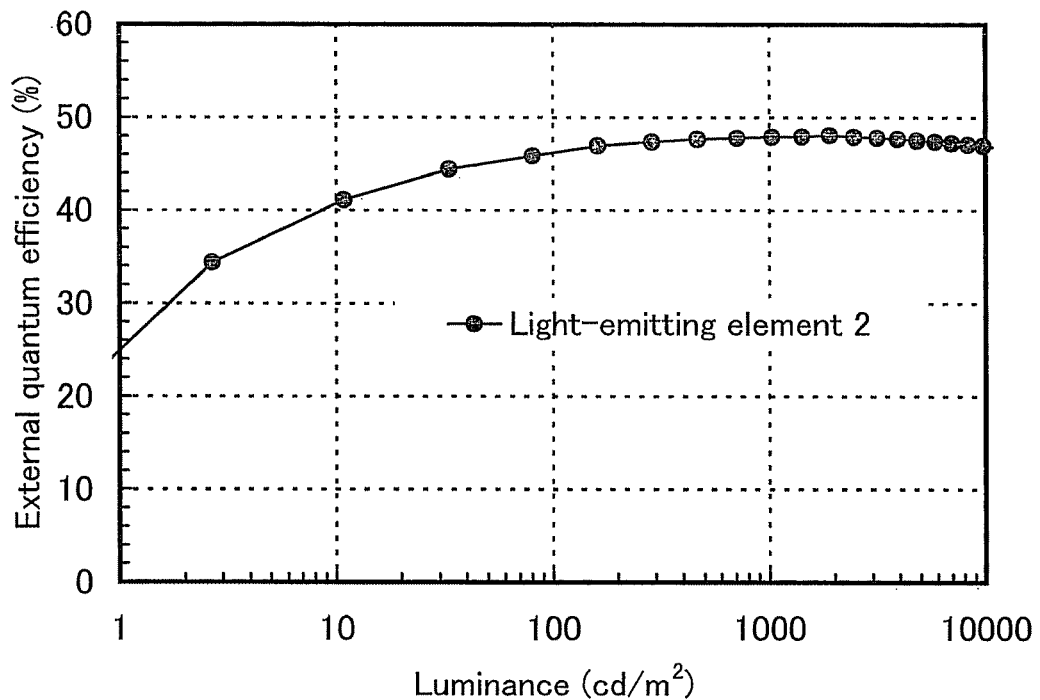
Figure 8:
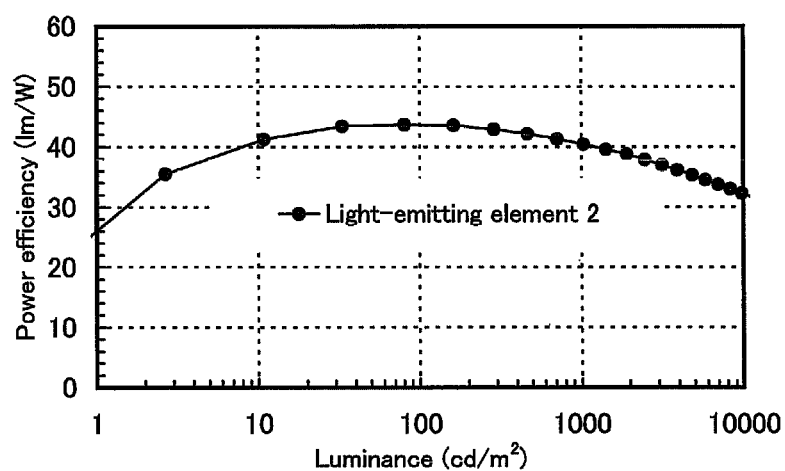
FIG. 8 is a graph showing power efficiency vs. luminance plots of the light-emitting element 2.

FIG. 7A shows emission spectrum of the light-emitting element 2, FIG. 7B shows external quantum efficiency vs. luminance plots of the light-emitting element 2, and FIG. 8 shows power efficiency vs. luminance plots of the light-emitting element 2. FIG. 9A shows emission spectrum of the light-emitting element 3, FIG. 9B shows external quantum efficiency vs. luminance plots of the light-emitting element 3, and FIG. 10 shows power efficiency vs. luminance plots of the light-emitting element 3.

As shown in FIG. 7A, the light-emitting element 2 has three peaks in visible light region: the first peak at 473 nm in the blue wavelength range; the second peak at 539 inn in the green wavelength range; and the third peak at 622 nm in the red wavelength range. In addition, as shown in FIG. 9A, the light-emitting element 3 has three peaks in visible light region: the first peak at 473 nm in the blue wavelength range; the second peak at 541 nm in the green wavelength range; and the third peak at 607 nm in the vermilion wavelength range.

In addition, as shown in FIG. 7B and FIG. 8, the light-emitting element 2 has a maximum external quantum efficiency of 48.0% and a maximum power efficiency of 43.7 lm/W, and as shown in FIG. 9B and FIG. 10, the light-emitting element 3 has a maximum external quantum efficiency of 48.2% and a maximum power efficiency of 52.3 lm/W.

As described above, the following was confirmed: each of the light-emitting element 2 and the light-emitting element 3 in accordance with one embodiment of the present invention has three peaks in the visible region and emits light with white color close to incandescent color or warm white color; each of the light-emitting element 2 and the light-emitting element 3 in accordance with one embodiment of the present invention has a high power efficiency.

This embodiment can be implemented in combination with any of the other embodiments or the examples, as appropriate.

EXAMPLE 3

Figure 14A:
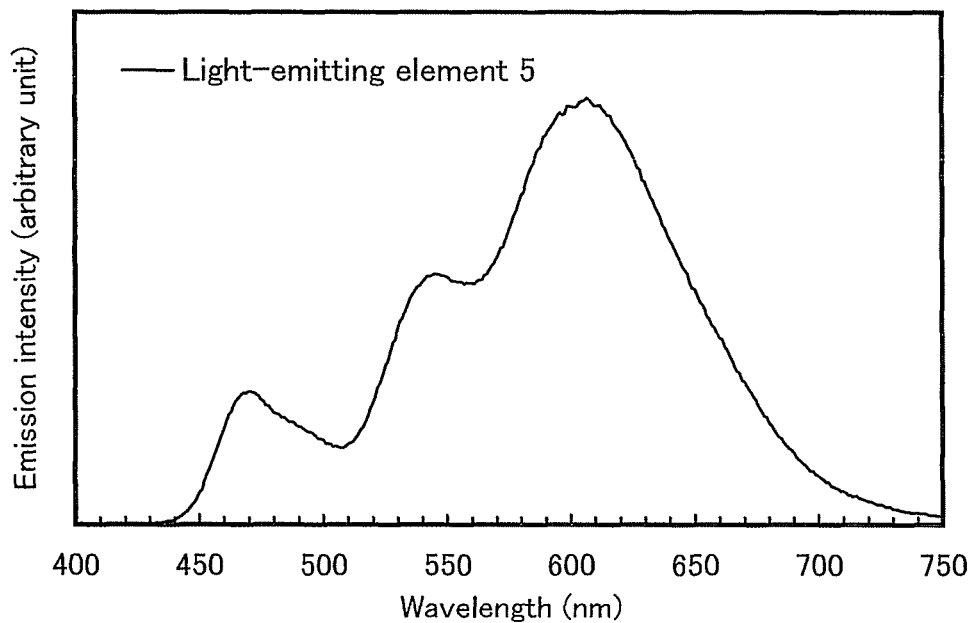
FIGS. 14A and 14B are graphs respectively showing an emission spectrum and external quantum efficiency vs. luminance plots of a light-emitting element 5.
Figure 14B:
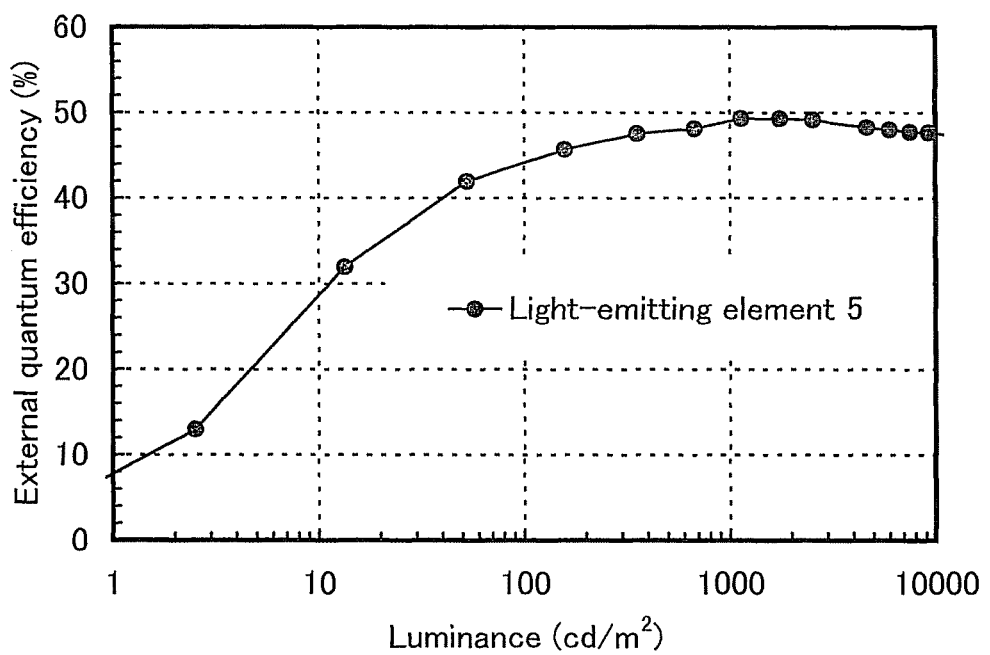
Figure 15:
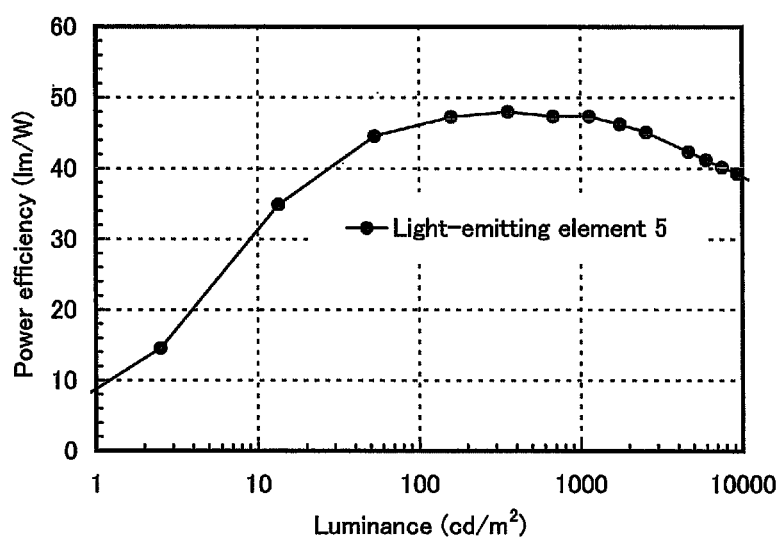
FIG. 15 is a graph showing power efficiency vs: luminance plots of the light-emitting element 5.

In this example, a light-emitting element 4 and a light-emitting element 5 in accordance with embodiments of the present invention were fabricated and evaluated. The light-emitting element 4 and the light-emitting element 5 will be described with reference to FIG. 11, FIGS. 12A, 12B, FIG. 13. FIGS. 14A, 14B, and FIG. 15.

Figure 11:
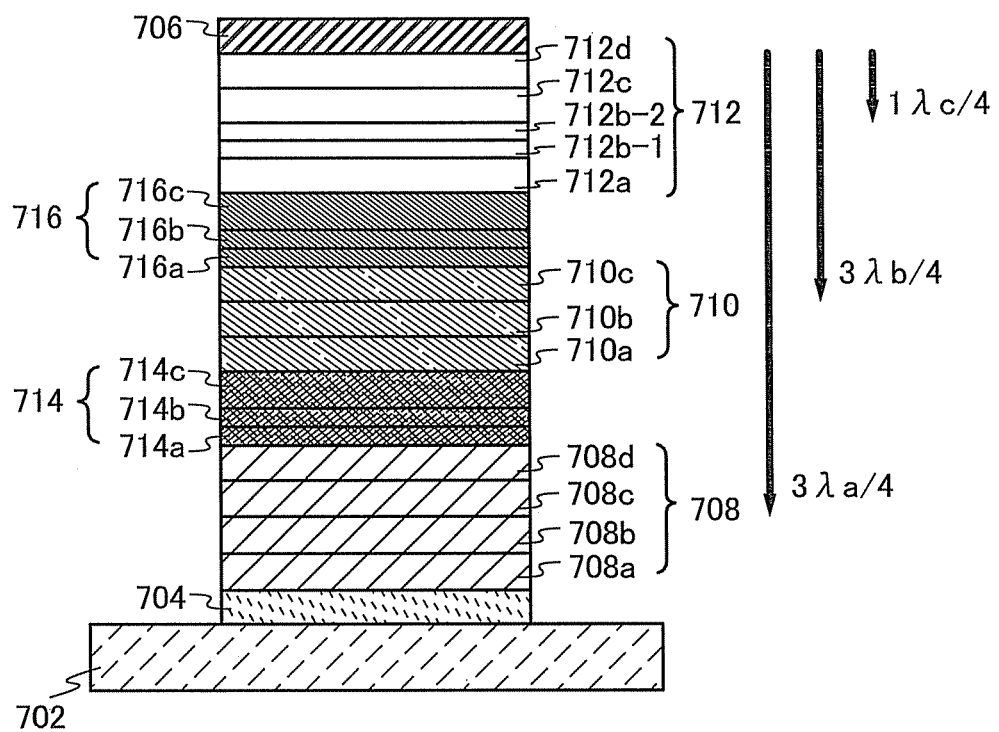
FIG. 11 illustrates a structure example of a light-emitting element 4 and a light-emitting element 5.

The light-emitting element illustrated in FIG. 11 is provided over a substrate 702; includes a light-transmitting electrode 704 and a light-reflecting electrode 706; and includes, between the light-transmitting electrode 704 and the light-reflecting electrode 706, a first light-emitting layer 708 including a hole-injection layer 708a, a hole-transport layer 708b, a light-emitting layer 708c, and an electron-transport layer 708d; a first intermediate layer 714 including an electron-injection buffer layer 714a, an electron-relay layer 714b, and a charge-generation layer 714c; a second light-emitting layer 710 including a hole-transport layer 710a, a light-emitting layer 710b, an electron-transport layer 710c; a second inter mediate layer 716 including an electron-injection buffer layer 716a, an electron-relay layer 716b, and a charge-generation layer 716c; and a third light-emitting layer 712 including a hole-transport layer 712a, a light-emitting layer 712b-1, a light-emitting layer 712b-2, an electron-transport layer 712c, and an electron-injection layer 712d.

Details of the light-emitting element illustrated in FIG. 11 are described below with reference to the fabrication methods of the light-emitting element 4 and the light-emitting element 5.

(Light-Emitting Element 4)

First, the light-emitting element 4 will be described (see FIG. 11). A film of indium tin oxide including silicon oxide (ITO—$SiO_2$) was formed over the substrate 702 by a sputtering method, thereby forming the light-transmitting electrode 704. The thickness was 110 nm and the electrode area was 2 mm×2 mm.

Next, the substrate provided with the light-transmitting electrode 704 was fixed to a substrate holder in a vacuum evaporation apparatus so that a surface of the substrate over which the light-transmitting electrode 704 was formed faced downward. The pressure in the vacuum evaporation apparatus was reduced to about $10^{-4}$ Pa. Then, DBT3P-II (abbreviation) (the structural formula (101) below) as a substance with a high hole-transport property and molybdenum oxide as an acceptor substance were co-evaporated to form the hole-injection layer 708a including a composite material of an organic compound and an inorganic compound, over the light-transmitting electrode 704. The thickness thereof was set to 26.6 nm, and the weight ratio of DBT3P-II (abbreviation) to molybdenum oxide was adjusted to 1:0.5 (=DBT3P-II: molybdenum oxide).

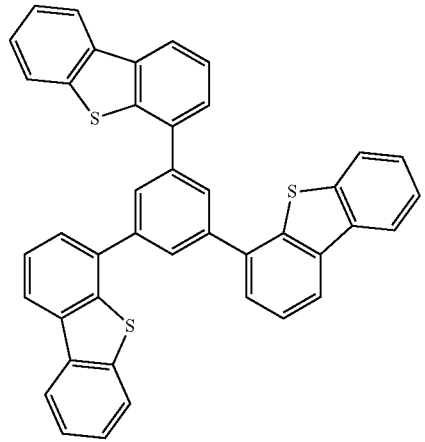

[DBT-3P-II]

(101)

Next, by an evaporation method using resistance heating, BPAFLP (abbreviation) (the structural formula (102) below) was deposited to a thickness of 20 nm over the hole-injection layer 708a to form the hole-transport layer 708b.

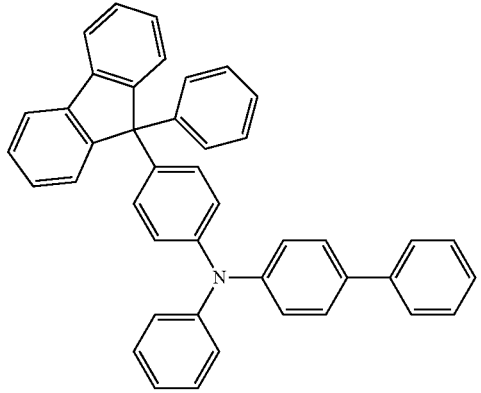

[BPAFLP]

(102)

After that, over the hole-transport layer 708b; 2mDBTP-DBq-II (abbreviation) (represented by the structural formula (103)), 4,4'-di(1-naphthyl)-4''-(9-phenyl-9H-carbazol-3-yl)-triphenylamine (abbreviation: PCBNBB represented by the structural formula (114)), and [Ir(tppr)$_2$(dpm)] (abbreviation) (represented by the structural formula (111)) were co-evaporated, so that the light-emitting layer 708c having a thickness of 40 nm was formed. At this time, the weight ratio of 2mDBTPDBq-II (abbreviation) to PCBNBB (abbreviation) and [Ir(tppr)$_2$(dpm)] (abbreviation) was adjusted to 0.8:0.2: 0.06 (=2mDBTPDBq-II:PCBNBB:[Ir(tppr)$_2$(dpm)]). Note that [Ir(tppr)$_2$(dpm)] (abbreviation) is a phosphorescent compound which exhibits red light emission.

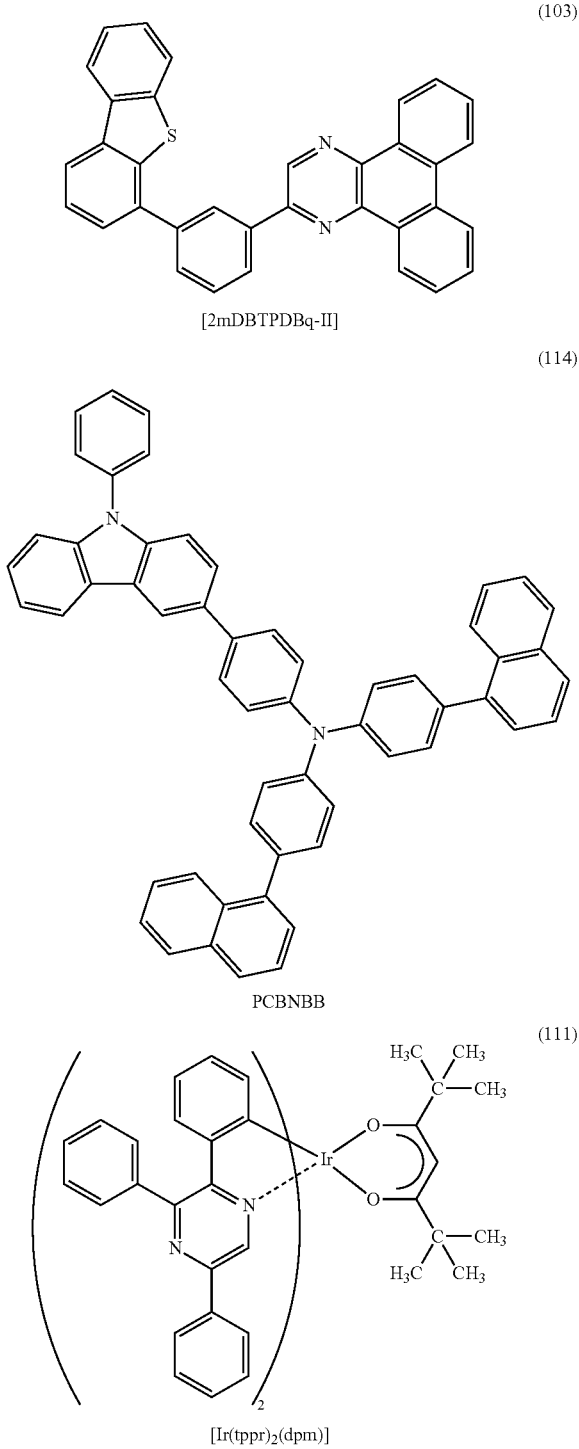

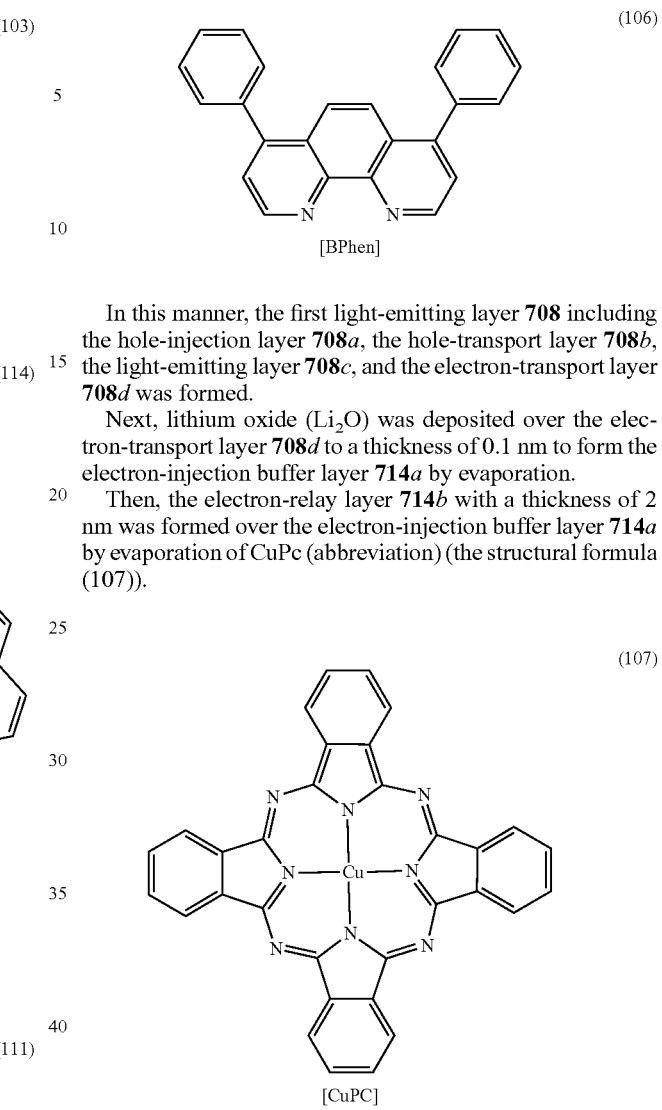

After that, by an evaporation method using resistance heating, a film of 2mDBTPDBq-II (abbreviation) with a thickness of 5 nm and a film of BPhen (abbreviation) (the structural formula (106)) with a thickness of 10 nm were deposited to be stacked in this order over the light-emitting layer 708c, whereby an electron-transport layer 708d was formed.

In this manner, the first light-emitting layer 708 including the hole-injection layer 708a, the hole-transport layer 708b, the light-emitting layer 708c, and the electron-transport layer 708d was formed.

Next, lithium oxide ($Li_2O$) was deposited over the electron-transport layer 708d to a thickness of 0.1 nm to form the electron-injection buffer layer 714a by evaporation.

Then, the electron-relay layer 714b with a thickness of 2 nm was formed over the electron-injection buffer layer 714a by evaporation of CuPc (abbreviation) (the structural formula (107)).

Next, DBT3P-II (abbreviation) as a substance with a high hole-transport property and molybdenum oxide as an acceptor substance were co-evaporated to form the charge-generation layer 714c over the electron-relay layer 714b. The thickness thereof was set to 3.3 nm, and the weight ratio of DBT3P-II (abbreviation) to molybdenum oxide was adjusted to 1:0.5 (=DBT3P-II: molybdenum oxide).

In this manner, the first intermediate layer 714 including the electron-injection buffer layer 714a, the electron-relay layer 714b, and the charge-generation layer 714c was formed.

Then, the second light-emitting layer 710 was formed over the first intermediate layer 714 in the following manner. First, BPAFLP (abbreviation) was deposited to a thickness of 10 nm over the charge-generation layer 714c to form the hole-transport layer 710a by an evaporation method using resistance heating.

Then, CzPA (abbreviation) (the structural formula (108) below) and 1,6mMemFLPAPrn (abbreviation) (the structural formula (109) below) were co-evaporated to form the light-emitting layer 710b with a thickness of 30 nm over the hole-transport layer 710a. Here, the weight ratio of CzPA (abbreviation) to 1,6mMemFLPAPrn (abbreviation) was adjusted to be 1:0.05 (=CzPA: 1,6mMemFLPAPm). Note that CzPA (abbreviation) is a substance with an electron-transport property and 1,6mMemFLPAPrn (abbreviation) that is a guest material is a fluorescent compound which exhibits blue light emission.

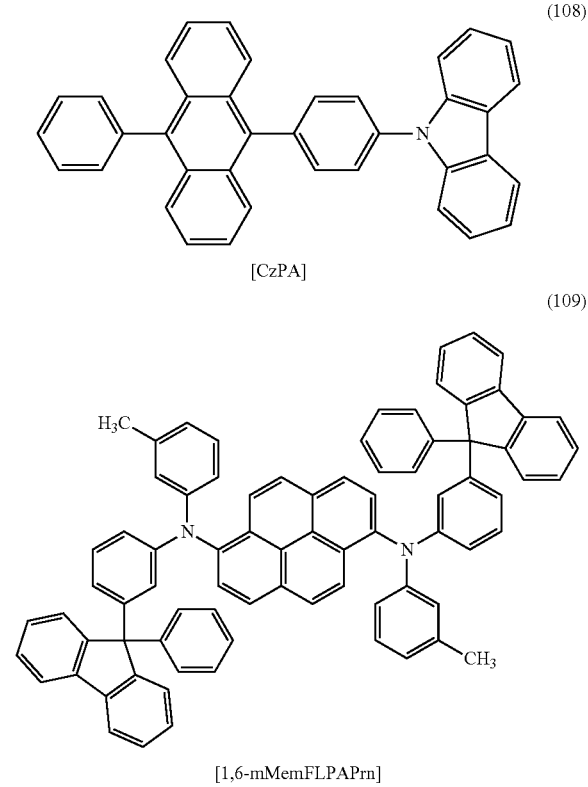 [SMILES: c1ccc(-c2c3ccccc3c(-c3ccc(-n4c5ccccc5c5ccccc54)cc3)c3ccccc23)cc1 ; Cc1cccc(N(c2cccc(C3(c4ccccc4)c4ccccc4-c4ccccc43)c2)c2ccc3ccc4c(N(c5cccc(C)c5)c5cccc(C6(c7ccccc7)c7ccccc7-c7ccccc76)c5)ccc5ccc2c3c54)c1]

[CzPA] (108)

[1,6-mMemFLPAPrn] (109)

Then, CzPA (abbreviation) with a thickness of 5 nm and BPhen (abbreviation) with a thickness of 10 nm were deposited to be stacked in this order over the light-emitting layer 710b by evaporation, whereby the electron-transport layer 710c was formed.

In this manner, the second light-emitting layer 710 including the hole-transport layer 710a, the light-emitting layer 710b, and the electron-transport layer 710c was formed.

Next, lithium oxide (Li$_2$O) was deposited to a thickness of 0.1 nm over the electron-transport layer 710c to form the electron-injection buffer layer 716a by evaporation.

Next, the electron-relay layer 716b with a thickness of 2 nm was formed over the electron-injection buffer layer 716a by evaporation of CuPc (abbreviation).

Next, DBT3P-II (abbreviation) as a substance having a high hole-transport property and molybdenum oxide as an acceptor substance were co-evaporated over the electron-relay layer 716b to form the charge-generation layer 716c. The thickness of the charge-generation layer 716c was 60 nm, and the weight ratio of DBT3P-II (abbreviation) to molybdenum oxide was adjusted so as to be 1:0.5 (=DBT3P-II: molybdenum oxide). In this manner, the second intermediate layer 716 including the electron-injection buffer 716a, the electron-relay layer 716b, and the charge-generation layer 716c was formed.

Next, the third light-emitting layer 712 was formed over the second intermediate layer 716 in the following manner. First, by an evaporation method using resistance heating, BPAFLP (abbreviation) was deposited to a thickness of 20 nm over the charge-generation layer 716c to form the hole-transport layer 712a.

Then, 2mDBTPDBq-II (abbreviation), PCBNBB (abbreviation), and (acetylacetonato)bis(6-tert-butyl-4-phenylpyrimidinato)iridium(III) (abbreviation: [Ir(tBuppm)$_2$(acac)] represented by the structural formula (115)) were co-evaporated, so that the light-emitting layer 712b-1 with a thickness of 30 nm was formed over the hole-transport layer 712a. The weight ratio of 2mDBTPDBq-II (abbreviation) to PCBNBB (abbreviation) and [Ir(tBuppm)$_2$(acac)] (abbreviation) was adjusted to 0.8:0.2:0.06 (=2mDBTPDBq-II:PCBNBB:[Ir(tBuppm)$_2$(acac)]). Note that [Ir(tBuppm)$_2$(acac)] (abbreviation) is a phosphorescent compound that emits green light.

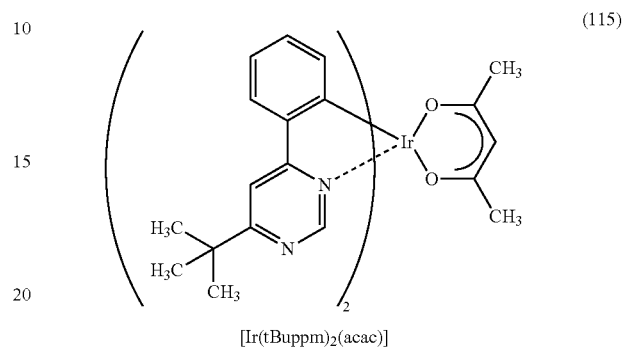

[Ir(tBuppm)$_2$(acac)] (115)

Then, 2mDBTPDBq-II (abbreviation), PCBNBB (abbreviation), and [Ir(dppm)$_2$(acac)] (abbreviation) (the structural formula (105)) were co-evaporated, so that the light-emitting layer 712b-2 with a thickness of 10 nm was formed over the light-emitting layer 712b-1. The weight ratio of 2mDBTPDBq-II (abbreviation) to PCBNBB (abbreviation) and [Ir(dppm)$_2$(acac)] (abbreviation) was adjusted to 0.8: 0.2:0.06 (=2mDBTPDBq-II:PCBNBB:Ir(dppm)$_2$(acac)). Note that [Ir(dppm)$_2$(acac)] (abbreviation) is a phosphorescent compound that emits orange light.

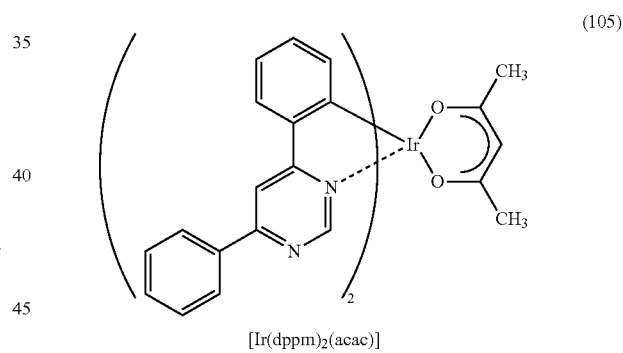

[Ir(dppm)$_2$(acac)] (105)

Next, 2mDBTPDBq-II (abbreviation) with a thickness of 15 nm and BPhen (abbreviation) with a thickness of 15 nm were deposited to be stacked in this order over the light-emitting layer 712b-2 by evaporation, whereby the electron-transport layer 712c was formed. Then, lithium fluoride (LiF) was deposited to a thickness of 1 nm over the electron-transport layer 712c to form the electron-injection layer 712d by evaporation.

In this manner, the third light-emitting layer 712 including the hole-transport layer 712a, the light-emitting layer 712b-1, the light-emitting layer 712b-2, the electron-transport layer 712c, and the electron-injection layer 712d was formed.

Lastly, a 200-nm-thick aluminum film was formed over the electron-injection layer 712d by an evaporation method using resistance heating to form the light-reflecting electrode 706. In this manner, the light-emitting element 4 was fabricated.
(Light Emitting Element 5)

Next, the light-emitting element 5 will be described (see FIG. 11). A film of indium tin oxide including silicon oxide (ITO—SiO$_2$) was formed over the substrate 702 by a sputtering method, thereby forming the light-transmitting electrode 704. The thickness was 110 nm and the electrode area was 2 mm×2 mm.

Next, the substrate provided with the light-transmitting electrode 704 was fixed to a substrate holder in a vacuum evaporation apparatus so that a surface of the substrate over which the light-transmitting electrode 704 was formed faced downward. The pressure in the vacuum evaporation apparatus was reduced to about $10^{-4}$ Pa. Then, DBT3P-II (abbreviation) (the structural formula (101) below) as a substance with a high hole-transport property and molybdenum oxide as an acceptor substance were co-evaporated to form the hole-injection layer 708a including a composite material of an organic compound and an inorganic compound, over the light-transmitting electrode 704. The thickness of the hole-injection layer 708a was set to 26.6 nm, and the weight ratio of DBT3P-II (abbreviation) to molybdenum oxide was adjusted to 1:0.5 (=DBT3P-II: molybdenum oxide).

(101)

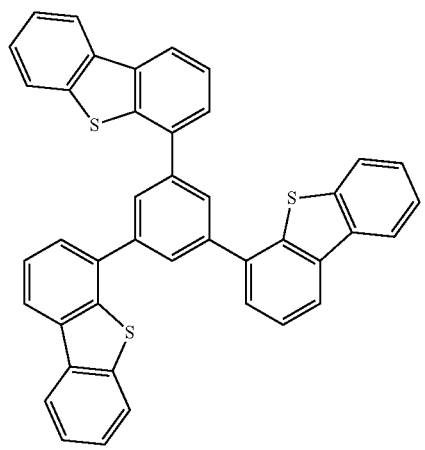

[DBT-3P-II]

Next, by an evaporation method using resistance heating, BPAFLP (abbreviation) (the structural formula (102) below) was deposited to a thickness of 20 nm over the hole-injection layer 708a to form the hole-transport layer 708b.

(102)

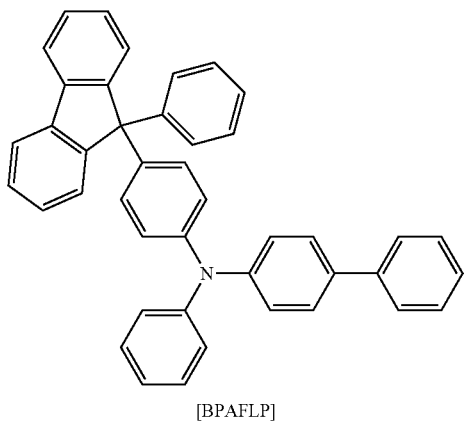

[BPAFLP]

After that, over the hole-transport layer 708b, 2mDBTP-DBq-II (abbreviation) (the structural formula (103) below), PCBNBB (abbreviation) (the structural formula (114) below), and [Ir(5mdppm)$_2$(dibm)] (abbreviation) (the structural formula (113) below) were co-evaporated, so that the light-emitting layer 708c having a thickness of 40 nm was fainted. At this time, the weight ratio of 2mDBTPDBq-II (abbreviation) to PCBNBB (abbreviation) to [Ir(5mdppm)$_2$(dibm)] (abbreviation) was adjusted to 0.8:0.2:0.06 (=2mDBTPDBq-II:PCBNBB:[Ir(5mdppm)$_2$(dibm)]). Note that [Ir(5mdppm)$_2$(dibm)] (abbreviation) is a phosphorescent compound which exhibits vermilion light emission.

(103)

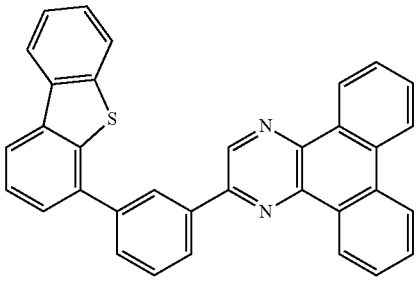

[2mDBTPDBq-II]

(114)

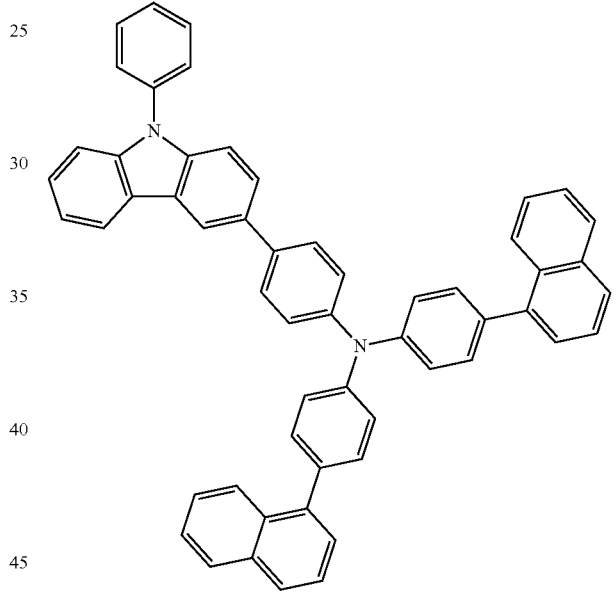

PCBNBB (113)

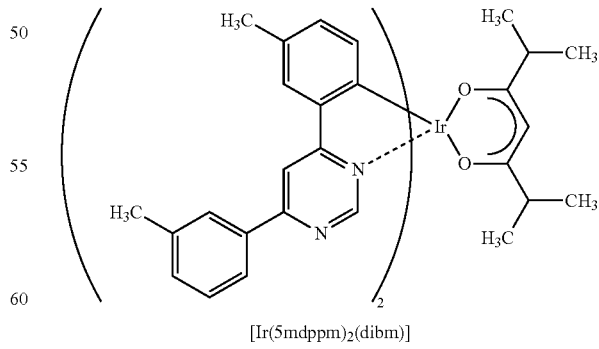

[Ir(5mdppm)$_2$(dibm)]

After that, by an evaporation method using resistance heating, a film of 2mDBTPDBq-II (abbreviation) with a thickness of 5 nm and a film of BPhen (abbreviation) (the structural formula (106)) with a thickness of 10 nm were deposited to be stacked in this order over the light-emitting layer 708c, whereby the electron-transport layer 708d was formed.

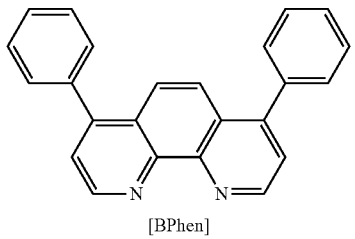

[BPhen]
(106)

In this manner, the first light-emitting layer 708 including the hole-injection layer 708a, the hole-transport layer 708b, the light-emitting layer 708c, and the electron-transport layer 708d was formed.

Next, lithium oxide (Li$_2$O) was deposited over the electron-transport layer 708d to a thickness of 0.1 nm to form the electron-injection buffer layer 714a by evaporation.

Then, the electron-relay layer 714b with a thickness of 2 nm was formed over the electron-injection buffer layer 714a by evaporation of CuPc (abbreviation) (the structural formula (107)).

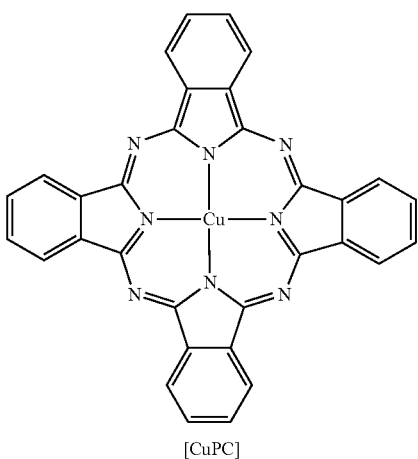

[CuPC]
(107)

Next, DBT3P-II (abbreviation) as a substance with a high hole-transport property and molybdenum oxide as an acceptor substance were co-evaporated to form the charge-generation layer 714c over the electron-relay layer 714b. The thickness thereof was set to 3.3 nm, and the weight ratio of DBT3P-II (abbreviation) to molybdenum oxide was adjusted to 1:0.5 (=DBT3P-II: molybdenum oxide).

In this manner, the first intermediate layer 714 including the electron-injection buffer layer 714a, the electron-relay layer 714b, and the charge-generation layer 714c was formed.

Then, the second light-emitting layer 710 was formed over the first intermediate layer 714 in the following manner. First, BPAFLP (abbreviation) was deposited to a thickness of 10 nm over the charge-generation layer 714c to form the hole-transport layer 710a by an evaporation method using resistance heating.

Then, CzPA (abbreviation) (the structural formula (108) below) and 1,6mMemFLPAPrn (abbreviation) (the structural formula (109) below) were co-evaporated to form the light-emitting layer 710b with a thickness of 30 nm over the hole-transport layer 710a. Here, the weight ratio of CzPA (abbreviation) to 1,6mMemFLPAPrn (abbreviation) was adjusted to be 1:0.05 (=CzPA: 1,6mMemFLPAPrn). Note that CzPA (abbreviation) is a substance with an electron-transport property and 1,6mMemFLPAPrn (abbreviation) that is a guest material is a fluorescent compound which exhibits blue light emission.

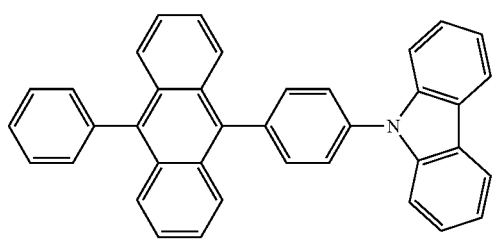

[CzPA]
(108)

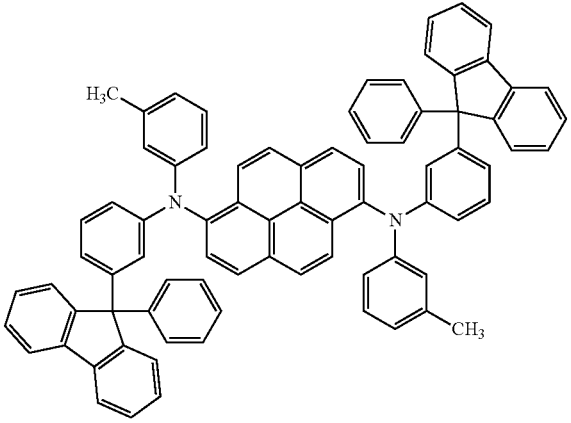

[1,6-mMemFLPAPrn]
(109)

Then, CzPA (abbreviation) with a thickness of 5 nm and BPhen (abbreviation) with a thickness of 10 nm were deposited to be stacked in this order over the light-emitting layer 710b by evaporation, whereby the electron-transport layer 710c was fog med.

In this manner, the second light-emitting layer 710 including the hole-transport layer 710a, the light-emitting layer 710b, and the electron-transport layer 710c was formed.

Next, lithium oxide (Li$_2$O) was deposited to a thickness of 0.1 nm over the electron-transport layer 710c to form the electron-injection buffer layer 716a by evaporation.

Next, the electron-relay layer 716b with a thickness of 2 nm was formed over the electron-injection buffer layer 716a by evaporation of CuPc (abbreviation).

Next, DBT3P-II (abbreviation) as a substance having a high hole-transport property and molybdenum oxide as an acceptor substance were co-evaporated over the electron-relay layer 716b to form the charge-generation layer 716c. The thickness was 60 nm, and the weight ratio of DBT3P-II (abbreviation) to molybdenum oxide was adjusted so as to be 1:0.5 (=DBT3P-II: molybdenum oxide). In this manner, the second intermediate layer 716 including the electron-injection buffer 716a, the electron-relay layer 716b, and the charge-generation layer 716c was formed.

Next, the third light-emitting layer 712 was formed over the second intermediate layer 716 in the following manner.

First, by an evaporation method using resistance heating, BPAFLP (abbreviation) was deposited to a thickness of 20 nm over the charge-generation layer 716c to form the hole-transport layer 712a by evaporation.

Then, 2mDBTPDBq-II (abbreviation), PCBNBB (abbreviation), and [Ir(tBuppm)$_2$(acac)] (abbreviation) (the structural formula (115)) were co-evaporated, so that the light-emitting layer 712b-1 with a thickness of 30 nm was formed over the hole-transport layer 712a. The weight ratio of 2mDBTPDBq-II (abbreviation) to PCBNBB (abbreviation) and [Ir(tBuppm)$_2$(acac)] (abbreviation) was adjusted to 0.8:0.2:0.06 (=2mDBTPDBq-II:PCBNBB:[Ir(tBuppm)$_2$(acac)]). Note that [Ir(tBuppm)$_2$(acac)] (abbreviation) is a phosphorescent compound that emits green light.

(115)

[Ir(tBuppm)$_2$(acac)]

Then, 2mDBTPDBq-II (abbreviation), PCBNBB (abbreviation), and [Ir(dppm)$_2$(acac)] (abbreviation) (the structural formula (105)) were co-evaporated, so that the light-emitting layer 712b-2 with a thickness of 10 nm was formed over the light-emitting layer 712b-1. The weight ratio of 2mDBTPDBq-II (abbreviation) to PCBNBB (abbreviation) and [Ir(dppm)$_2$(acac)] (abbreviation) was adjusted to 0.8:0.2:0.06 (=2mDBTPDBq-II:PCBNBB:[Ir(dppm)$_2$(acac)]). Note that Ir(dppm)$_2$(acac) (abbreviation) is a phosphorescent compound that emits orange light.

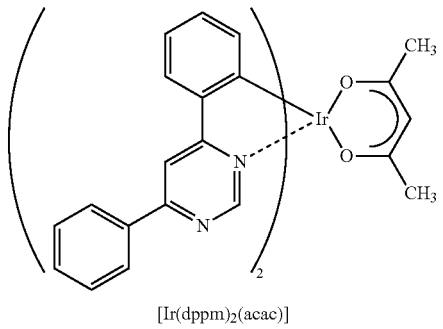

(105)

[Ir(dppm)$_2$(acac)]

Next, 2mDBTPDBq-II (abbreviation) with a thickness of 15 nm and BPhen (abbreviation) with a thickness of 15 nm were deposited to be stacked in this order over the light-emitting layer 712b-2 by evaporation, whereby the electron-transport layer 712c was formed. Then, lithium fluoride (LiF) was deposited to a thickness of 1 nm over the electron-transport layer 712c to faun the electron-injection layer 712d by evaporation.

In this manner, the third light-emitting layer 712 including the hole-transport layer 712a, the light-emitting layer 712b-1, the light-emitting layer 712b-2, the electron-transport layer 712c, and the electron-injection layer 712d was formed.

Lastly, a 200-nm-thick aluminum film was formed over the electron-injection layer 712d by an evaporation method using resistance heating to form the light-reflecting electrode 706. In this manner, the light-emitting element 5 was fabricated.

Here, the thicknesses of the light-transmitting electrodes, the light-reflecting electrodes, the first to third light-emitting layers, the first intermediate layers, and the second intermediate layers in the light-emitting element 4 and the light-emitting element 5 fabricated in this example are shown in Table 3.

TABLE 3

| | | First light-emitting layer | | | | First intermediate layer | | | Second light-emitting layer | | |
|---|---|---|---|---|---|---|---|---|---|---|---|
| | light-transmitting electrode | Hole-injection layer | Hole-transport layer | Light-emitting layer | Electron-transport layer | Electron-injection buffer layer | Electron-relay layer | Charge-generation layer | Hole-transport layer | Light-emitting layer | Electron-transport layer |
| Light-emitting element 4 | 110 nm | 26.6 nm | 20 nm | 40 nm | 15 nm | 0.1 nm | 2 nm | 3.3 nm | 10 nm | 30 nm | 15 nm |
| Light-emitting element 5 | 110 nm | 26.6 nm | 20 nm | 40 nm | 15 nm | 0.1 nm | 2 nm | 3.3 nm | 10 nm | 30 nm | 15 nm |

| | Second intermediate layer | | | Third light-emitting layer | | | | | |
|---|---|---|---|---|---|---|---|---|---|
| | Electron-injection buffer layer | Electron-relay layer | Charge-generation layer | Hole-transport layer | Light-emitting layer | Light-emitting layer | Electron-transport layer | Electron-injection layer | Light-reflecting electrode |
| Light-emitting element 4 | 0.1 nm | 2 nm | 60 nm | 20 nm | 30 nm | 10 nm | 40 nm | 1 nm | 200 nm |
| Light-emitting element 5 | 0.1 nm | 2 nm | 60 nm | 20 nm | 30 nm | 10 nm | 40 nm | 1 nm | 200 nm |

As shown in Table 3, as for each of the light-emitting element 4 and the light-emitting element 5, the total thickness of the first light-emitting layer, the second light-emitting layer, the third light-emitting layer, the first intermediate layer, and the second intermediate layer is about 315 nm.

In addition, in each of the light-emitting element 4 and the light-emitting element 5, a light-emitting layer that emits light having the longest peak wavelength of the three light-emitting layers is used for the first light-emitting layer 708, a light-emitting layer that emits light having the shortest peak wavelength of the three light-emitting layers is used for the second light-emitting layer 710, and two light-emitting layers that emit light in a wavelength range that is shorter than or equal to the wavelength of light emitted from the first light-emitting layer 708 and is longer than or equal to the wavelength of light emitted from the second light-emitting layer 710 are used for the third light-emitting layer 712. In this manner, the third light-emitting layer 712 can include the light-emitting layers with two wavelength. Although not described in this example, the first light-emitting layer 708 and the second light-emitting layer 710 can also each include light-emitting layers with two wavelength.

In other words, the stack orders of the light-emitting element 4 and the light-emitting element 5 in this example are as follows. In the light-emitting element 4, red/blue/green-or-ange light-emitting layers are formed in this order from the light-transmitting electrode 704 side, and in the light-emitting element 5, vermilion/blue/green-orange light-emitting layers are formed in this order from the light-transmitting electrode 704 side.

In the light-emitting element 4, the optical path length between the light-reflecting electrode 706 and the light-emitting region in the first light-emitting layer 708 is about 270 nm, and is about three fourths of the peak wavelength of light (i.e., red) emitted from the first light-emitting layer 708. In addition, the optical path length between the light-reflecting electrode 706 and the light-emitting region in the second light-emitting layer 710 is about 200 nm, and is about three fourths of the peak wavelength of light (i.e., blue) emitted from the second light-emitting layer 710. In addition, the optical path length between the light-reflecting electrode 706 and the light-emitting region in the third light-emitting layer 712 is about 70 nm, and is about one fourth of the peak wavelength of light (i.e., green) emitted from the third light-emitting layer 712. Note that in the light-emitting element 4, it is considered that the light-emitting region in each of the light-emitting layer 708 and the second light-emitting layer 710 can lie near the interface between the hole-transport layer and the light-emitting layer. In addition, the light-emitting region in the third light-emitting layer 712 is difficult to specify accurately, since the third light-emitting layer includes the light-emitting layers with two wavelength; however, when the light-emitting layer 712b-1 and the light-emitting layer 712b-2 are compared, because the light-emitting layer 712b-1 is thicker than the light-emitting layer 712b-2, it is considered that light emitted from the light-emitting layer 712b-1 contributes more largely to light emission, and thus the light-emitting region lies near the interface between the hole-transport layer and the light-emitting layer 712b-1.

In the light-emitting element 5, the optical path length between the light-reflecting electrode 706 and the light-emitting region in the first light-emitting layer 708 is about 270 nm, and is about three fourths of the peak wavelength of light (i.e., vermilion) emitted from the first light-emitting layer 708. In addition, the optical path length between the light-reflecting electrode 706 and the light-emitting region in the second light-emitting layer 710 is about 200 nm, and is about three fourths of the peak wavelength of light (i.e., blue) emitted from the second light-emitting layer 710. In addition, the optical path length between the light-reflecting electrode 706 and the light-emitting region in the third light-emitting layer 712 is about 70 nm, and is about one fourth of the peak wavelength of light (i.e., green) emitted from the third light-emitting layer 712. Note that in the light-emitting element 5, it is considered that the light-emitting region in each of the light-emitting layer 708 and the second light-emitting layer 710 can lie near the interface between the hole-transport layer and the light-emitting layer. In addition, the light-emitting region in the third light-emitting layer 712 is difficult to specify accurately, since the third light-emitting layer includes the light-emitting layers with two wavelength ranges; however, when the light-emitting layer 712b-1 and the light-emitting layer 712b-2 are compared, because the light-emitting layer 712b-1 is thicker than the light-emitting layer 712b-2, it is considered that light emitted from the light-emitting layer 712b-1 contributes more largely to light emission, and thus the light-emitting region lies near the interface between the hole-transport layer and the light-emitting layer 712b-1.

By controlling the thickness of each light-emitting layer and the thickness of each intermediate layer in this manner, the optical path length between the light-reflecting electrode and each light-emitting layer can be adjusted.

The light-emitting element 4 and the light-emitting element 5 fabricated in this manner were sealed in a glove box under a nitrogen atmosphere so that these light-emitting elements were prevented from being exposed to the air. Then, the operation characteristics of the light-emitting element 4 and the light-emitting element 5 were measured. Note that the measurement was carried out at room temperature (in the atmosphere kept at 25° C.).

Figure 12A:
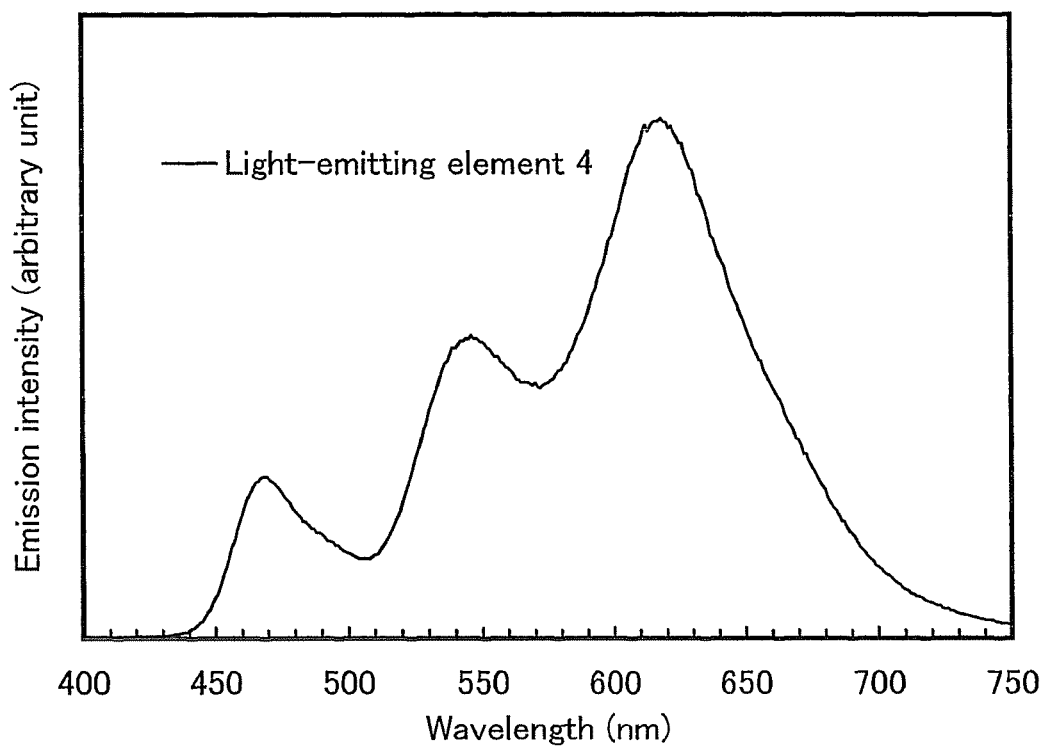
FIGS. 12A and 12B are graphs respectively showing an emission spectrum and external quantum efficiency vs. luminance plots of a light-emitting element 4.
Figure 12B:
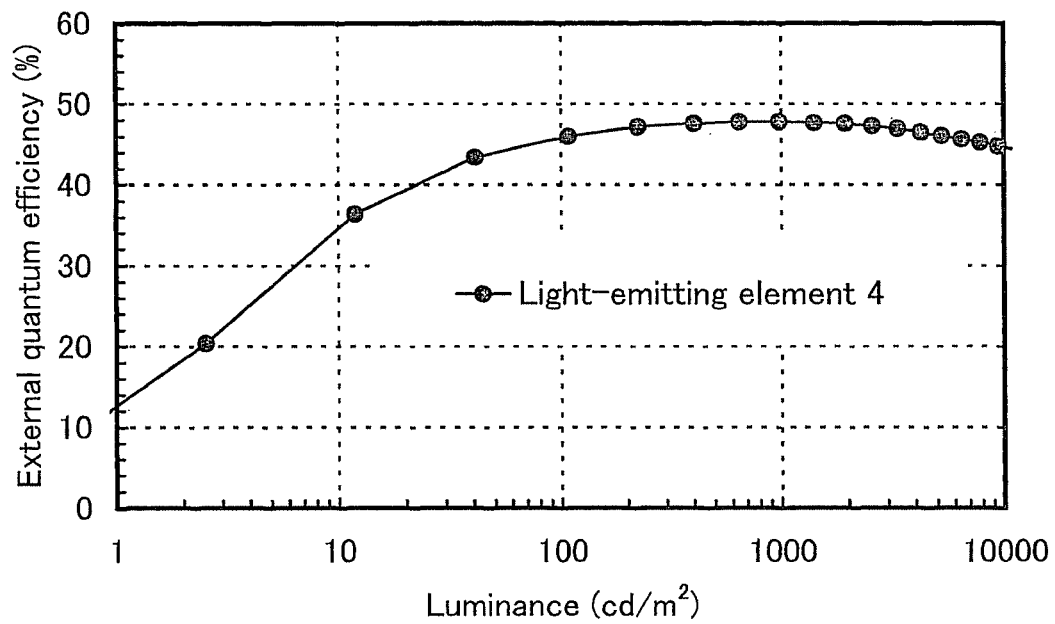
Figure 13:
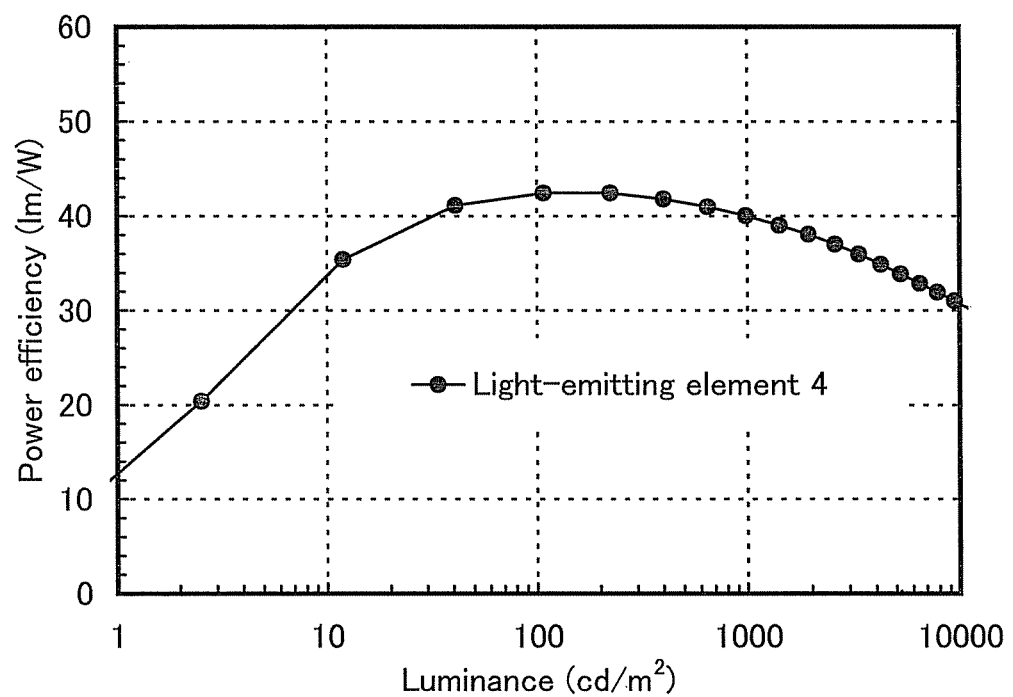
FIG. 13 is a graph showing power efficiency vs. luminance plots of the light-emitting element 4.

FIG. 12A shows emission spectrum of the light-emitting element 4, FIG. 12B shows external quantum efficiency vs. luminance plots of the light-emitting element 4, and FIG. 13 shows power efficiency vs. luminance plots of the light-emitting element 4. FIG. 14A shows emission spectrum of the light-emitting element 5, FIG. 14B shows external quantum efficiency vs. luminance plots of the light-emitting element 5, and FIG. 15 shows power efficiency vs. luminance plots of the light-emitting element 5.

As shown in FIG. 12A, the light-emitting element 4 has three peaks in visible light region: the first peak at 469 nm in the blue wavelength range; the second peak at 546 nm in the green wavelength range; and the third peak at 618 nm in the red wavelength range. In addition, as shown in FIG. 14A, the light-emitting element 5 has three peaks in visible light region: the first peak at 470 nm in the blue wavelength range; the second peak at 545 nm in the green wavelength range; and the third peak at 607 nm in the vermilion wavelength range of.

Next, as shown in FIG. 12B and FIG. 13, the light-emitting element 4 has a maximum external quantum efficiency of 47.8% and a maximum power efficiency of 42.5 lm/W, and as shown in FIG. 14B and FIG. 15, the light-emitting element 5 has a maximum external quantum efficiency of 49.3% and a maximum power efficiency of 48.0 lm/W.

As described above, the following was confirmed: each of the light-emitting element 4 and the light-emitting element 5 in accordance with one embodiment of the present invention has three peaks in the visible region and emits light with white color close to incandescent color or warm white color; each of the light-emitting element 4 and the light-emitting element 5 in accordance with one embodiment of the present invention has a high power efficiency.

This embodiment can be implemented in combination with any of the other embodiments or the examples, as appropriate.

REFERENCE EXAMPLE 1

A synthetic example of ((acetylacetonato)bis(4,6-diphenylpyrimidinato)iridium(III) (another name: bis[2-(6-phenyl-4-pyrimidinyl-κN3)phenyl-κC](2,4-pentanedionato-κ²O, O')iridium(III)) (abbreviation: [Ir(dppm)₂(acac)]), which is used in Examples described above, is described. The structure of [Ir(dppm)₂(acac)] is shown below.

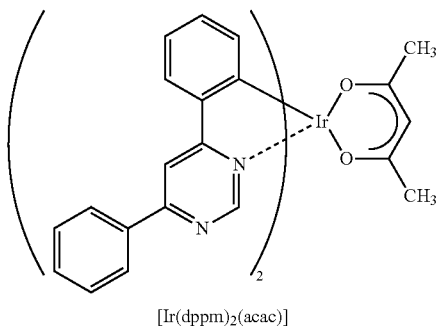

[Ir(dppm)₂(acac)]

Step 1: Synthesis of 4,6-diphenylpyrimidine (abbreviation: Hdppm)

First, in a recovery flask equipped with a reflux pipe were put 5.02 g of 4,6-dichloropyrimidine, 8.29 g of phenylboronic acid, 7.19 g of sodium carbonate, 0.29 g of bis(triphenylphosphine)palladium(II)dichloride (abbreviation: Pd(PPh₃)₂Cl₂), 20 mL of water, and 20 mL of acetonitrile, and the air in the flask was replaced with argon. This reaction container was subjected to irradiation with microwaves (2.45 GHz, 100 W) for 60 minutes to be heated. Here, in the flask were further put 2.08 g of phenylboronic acid, 1.79 g of sodium carbonate, 0.070 g of Pd(PPh₃)₂Cl₂, 5 mL of water, and 5 mL of acetonitrile, and the mixed solution was subjected to irradiation with microwaves (2.45 GHz, 100 W) for 60 minutes to be heated. Then, water was added to this solution and an organic layer was extracted with dichloromethane. The obtained extract was washed with water and dried with magnesium sulfate. The solution which had been dried was filtered. The solvent of this solution was distilled off, and then the obtained residue was purified by silica gel column chromatography using dichloromethane as a developing solvent. As a result, a pyrimidine derivative, Hdppm, was obtained (yellow white powder, yield of 38%). Note that for the microwave irradiation, a microwave synthesis system (Discovery, produced by CEM Corporation) was used. A synthesis scheme (a-1) of Step 1 is shown below.

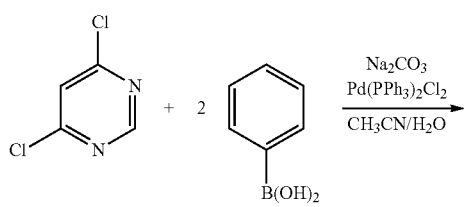

(a-1)

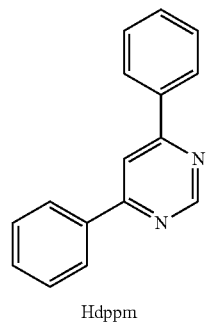

Hdppm

Step 2: Synthesis of di-μ-chloro-bis[bis(4,6-diphenylpyrimidinato)iridium(III)] (abbreviation: [Ir(dppm)₂Cl]₂)

Next, in a recovery flask equipped with a reflux pipe were put 15 mL of 2-ethoxyethanol, 5 mL of water, 1.10 g of Hdppm obtained in Step 1, and 0.69 g of iridium chloride hydrate (IrCl₃.H₂O), and the air in the flask was replaced with argon. After that, irradiation with microwaves (2.45 GHz, 100 W) was performed for 1 hour to cause a reaction. The solvent was distilled off, and then the obtained residue was filtered and washed with ethanol to give a dinuclear complex [Ir(dppm)₂Cl]₂ (reddish brown powder, yield of 88%). A synthesis scheme (a-2) of Step 2 is shown below.

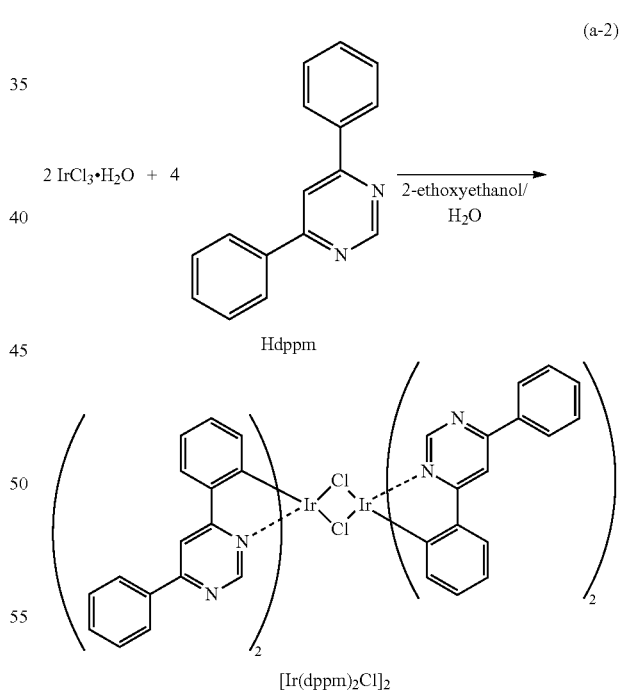

(a-2)

[Ir(dppm)₂Cl]₂

Step 3: Synthesis of (acetylacetonato)bis(4,6-diphenylpyrimidinato)iridium(III) (abbreviation: [Ir(dppm)₂(acac)])

Furthermore, in a recovery flask equipped with a reflux pipe were put 40 mL of 2-ethoxyethanol, 1.44 g of [Ir(dppm)₂Cl]₂ obtained in Step 2, 0.30 g of acetylacetone, and 1.07 g of sodium carbonate, and the air in the flask was replaced with argon. After that, irradiation with microwaves (2.45 GHz, 120 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. The solution which had been dried was filtered. The solvent of this solution was distilled off, and then the obtained residue was purified by silica gel column chromatography using dichloromethane and ethyl acetate as a developing solvent in a volume ratio of 50:1. After that, recrystallization was carried out with a mixed solvent of dichloromethane and hexane to give orange powder that was the objective substance (yield of 32%). A synthesis scheme (a-3) of Step 3 is shown below.

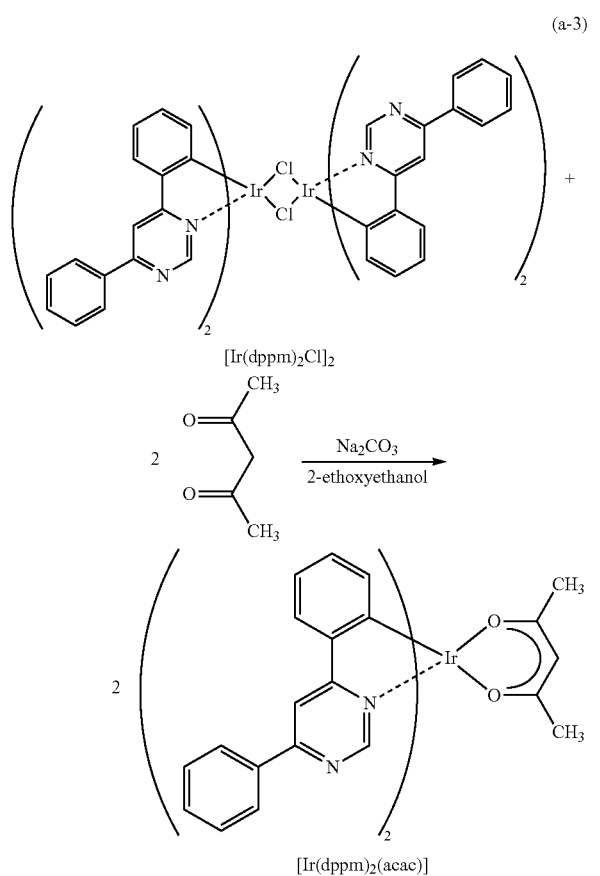

(a-3)

An analysis by nuclear magnetic resonance spectrometry ($^1$H NMR) of the orange powder obtained in Step 3 was performed. The analysis result revealed that the objective compound [Ir(dppm)$_2$(acac)] was obtained.

$^1$H NMR. δ (CDCl$_3$): 1.83 (s, 6H), 5.29 (s, 1H), 6.48 (d, 2H), 6.80 (t, 2H), 6.90 (t, 2H), 7.55-7.63 (m, 6H), 7.77 (d, 2H), 8.17 (s, 2H), 8.24 (d, 4H), 9.17 (s, 2H).

REFERENCE EXAMPLE 2

A synthetic example of (acetylacetonato)bis[4-(2-norbornyl)-6-phenylpyrimidinato]iridium(III) (endo-and exo-mixture) (abbreviation: [Ir(nbppm)$_2$(acac)]), which is used in Examples described above, is described. The structure of [Ir(nbppm)$_2$(acac)] is shown below.

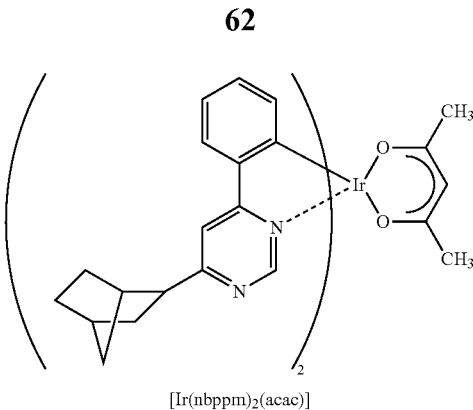

[Ir(nbppm)$_2$(acac)]

Step 1: Synthesis of 4-chloro-6-phenylpyrimidine

First, into a recovery flask equipped with a reflux pipe were put 3.35 g of 4,6-dichloropyrimidine, 3.02 g of phenylboronic acid, 1.7 mL of tricyclohexylphosphine (abbreviation: Cy$_3$P), 14.7 g of cesium carbonate, 0.31 g of tris(dibenzylideneacetone)palladium(0) (abbreviation: Pd$_2$(dba)$_3$), and 30 mL of dioxane, and the air in the flask was replaced with argon. This reaction container was heated by irradiation with microwaves (2.45 GHz, 120 W) for 60 minutes for reaction. The solvent of this solution was distilled off, and then the obtained residue was purified by silica gel column chromatography using a mixed solvent of dichloromethane and hexane as a developing solvent in a volume ratio of 1:1, to give 4-chloro-6-phenylpyrimidine (light yellow powder, 34% in yield). Note that the irradiation with microwaves was performed using a microwave synthesis system (Discover, manufactured by CEM Corporation). A synthesis scheme of Step 1 is shown in (b-1) given below.

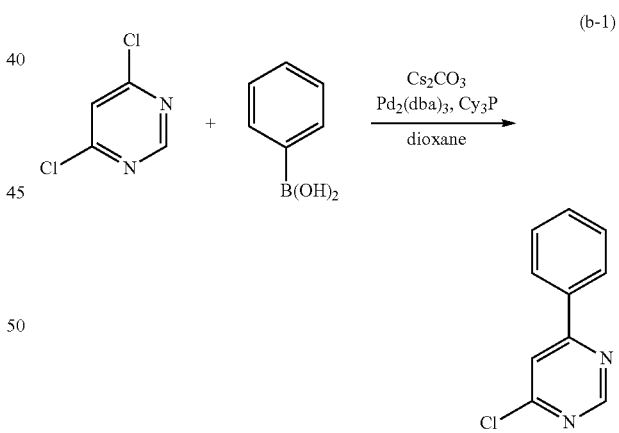

(b-1)

Step 2: 4-(2-norbornyl)-6-phenylpyrimidine (endo- and exo-mixture) (abbreviation: Hnbppm)

Next, into a reaction container were put 2.99 g of exo-2-bromonorbornane, 0.50 g of magnesium, and 10 mL of tetrahydrofuran (THF), and this reaction container was heated by irradiation with microwaves (2.45 GHz, 100 W) for 10 minutes so that Grignard reagent was prepared. 5.02 g of 4-chloro-6-phenylpyrimidine obtained in Step 1 and 30 mL of THF were mixed, and while the mixture was being stirred at −15° C., the obtained Grignard reagent was added thereto, 30 mg of [1,2-bis(diphenylphosphino)ethane]nickel(II) dichloride (abbreviation: Ni(dppe)Cl$_2$) was also added, then the temperature of the mixture was increased to room temperature. To this reaction solution was added an aqueous solution of ammonium chloride, and an organic layer was extracted with ethyl acetate. The obtained organic layer was dried with magnesium sulfate. After the drying, the solution was filtered. The solvent of this solution was distilled off, and then the obtained residue was purified by flash column chromatography (silica gel) using a mixed solvent of hexane and ethyl acetate as a developing solvent in a volume ratio of 5:1, to give Hnbppm, which is the objective substance and a pyrimidine derivative (yellow oily substance, 43% in yield). A synthetic scheme of Step 2 is shown by a following (b-2).

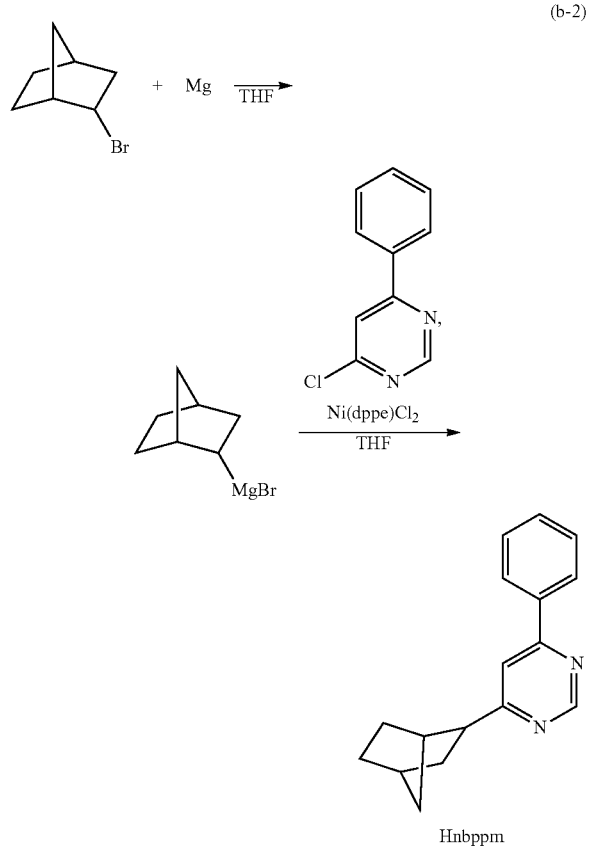

Step 3: Synthesis of di-μ-chloro-bis[bis {4-(2-norbornyl)-6-phenylpyrimidinato}iridium(III) (endo- and exo-mixture) (abbreviation: [Ir(nbppm)$_2$Cl]$_2$)

Next, into a recovery flask equipped with a reflux pipe were put 15 mL of 2-ethoxyethanol, 5 mL of water, 0.83 g of Hnbppm obtained in Step 2, and 0.49 g of iridium chloride hydrate (IrCl$_3$.H$_2$O), and the air in the flask was replaced with argon. Then, the mixture was irradiated with a microwave (2.45 GHz, 100 W) for 30 minutes to be reacted. The reacted solution was filtered and the obtained residue was washed with ethanol to give a dinuclear complex [Ir(nbppm)$_2$Cl]$_2$ (brown powder, 74% in yield). The synthesis scheme of Step 3 is shown in (b-3) below.

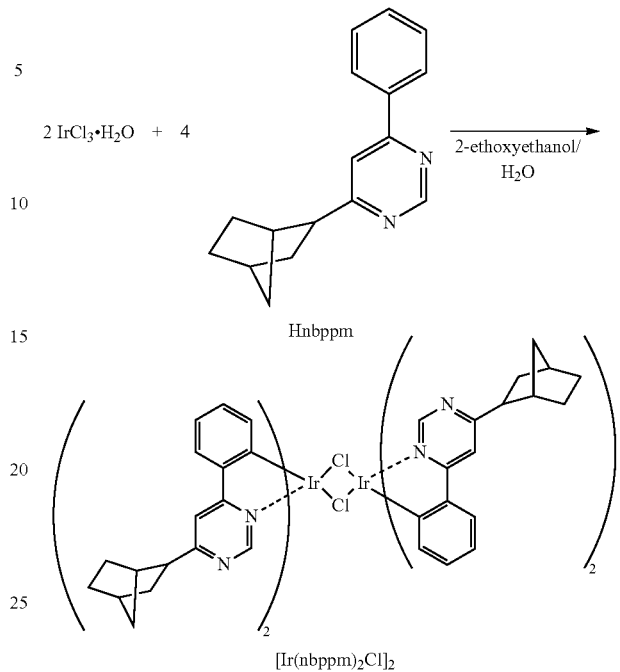

Step 4: Synthesis of (acetylacetonato)bis[4-(2-norbornyl)-6-phenylpyrimidinato]iridium(III) (endo-and exo-mixture) (abbreviation: [Ir(nbppm)$_2$(acac)]

Further, 20 mL of 2-ethoxyethanol, 0.89 g of the dinuclear complex [Ir(nbppm)$_2$Cl]$_2$ obtained in Step 3, 0.19 mL of acetylacetone, and 0.65 g of sodium carbonate were put in a recovery flask with a reflux pipe and the inside air of the flask was replaced with argon. Then, the mixture was irradiated with a microwave (2.45 GHz, 100 W) for 30 minutes to be reacted. The reacted solution was filtered and the obtained residue was washed with water, ethanol, and hexane. The residue was dissolved in dichloromethane, and filtered through a filter aid of Celite (produced by Wako Pure Chemical Industries, Ltd., Catalog No. 531-16855). The solvent of this solution was distilled off, and then the obtained residue was purified by flash column chromatography (silica gel) using a mixed solvent of dichloromethane and ethyl acetate as a developing solvent in a volume ratio of 50:1, to give the objective substance of orange powder (54% in yield). A synthetic scheme of Step 4 is shown by a following (b-4).

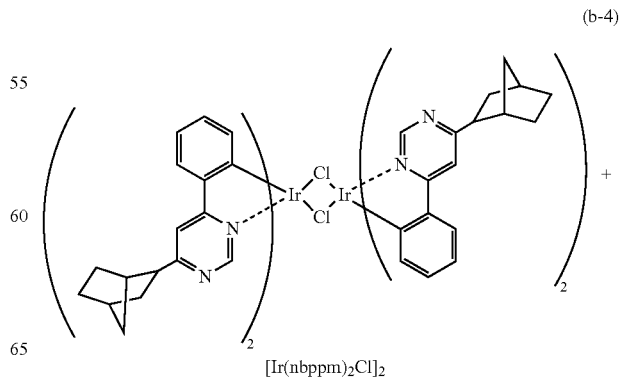

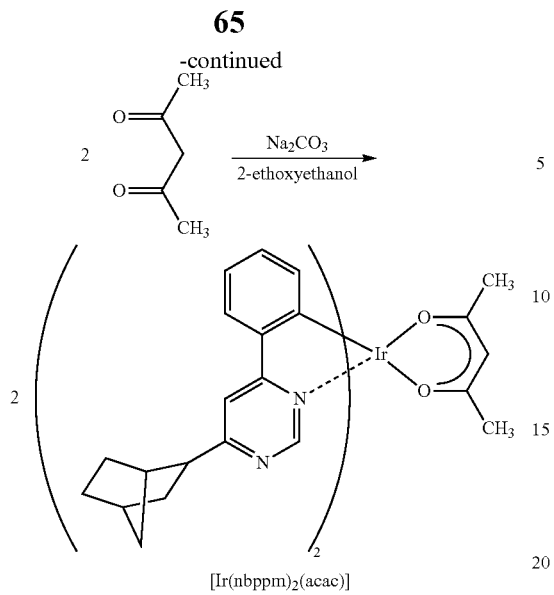

[Ir(nbppm)₂(acac)]

An analysis by nuclear magnetic resonance spectrometry (¹H NMR) of the orange powder obtained in Step 4 was performed. The analysis result revealed that the objective compound [Ir(nbppm)₂(acac)] was obtained.

¹H NMR data of the obtained compound is shown below. Note that in the obtained orange powder, endo-product signals and exo-product signals are mixed, and they cannot be separated from each other in ¹H NMR. The chemical shifts are described as ranges.

¹H-NMR. δ (CDCl₃): 1.24-1.51, 1.61-2.06, 2.07, 2.48, 2.69, 3.03, 3.56, 5.24, 6.34, 6.74-6.86, 7.64, 8.99.

REFERENCE EXAMPLE 3

A synthesis method of (acetylacetonato)bis(6-tert-butyl-4-phenylpyrimidinato)iridium(III) (abbreviation: [Ir(tBuppm)₂(acac)]), which is used in Examples described above, is described specifically. The structure of [Ir(tBuppm)₂(acac)] is shown below.

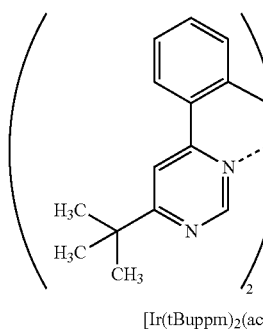

[Ir(tBuppm)₂(acac)]

Step 1: Synthesis of 4-tert-butyl-6-phenylpyrimidine (abbreviation: HtBuppm)

First, into a recovery flask equipped with a reflux pipe were put 22.5 g of 4,4-dimethyl-1-phenylpentane-1,3-dione and 50 g of formamide, and the air in the flask was replaced with nitrogen. This reaction container was heated, and the reacted solution was refluxed for 5 hours. After that, this solution was poured into an aqueous sodium hydroxide solution, and an organic layer was extracted with dichloromethane. The obtained organic layer was washed with water and saturated saline, and dried with magnesium sulfate. The solution which had been dried was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. The synthesis scheme of Step 1 is illustrated in the following (c-1).

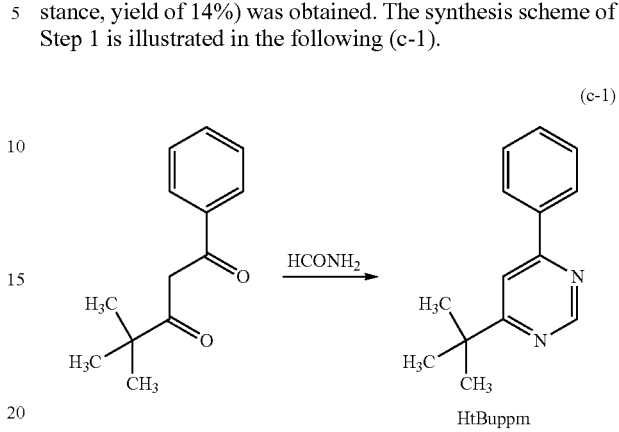

(c-1)

Step 2: Synthesis of di-m-chloro-bis[bis(6-tert-butyl-4-phenylpyrimidinato)iridium(III)] (abbreviation: [Ir(tBuppm)₂Cl]₂)

Next, into a recovery flask equipped with a reflux pipe were put 15 mL of 2-ethoxyethanol, 5 mL of water, 1.49 g of HtBuppm obtained in Step 1, and 1.04 g of iridium chloride hydrate (IrCl₃.H₂O), and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol, so that a dinuclear complex [Ir(tBuppm)₂Cl]₂ (yellow green powder, yield of 73%) was obtained. A synthesis scheme (c-2) of Step 2 is shown below.

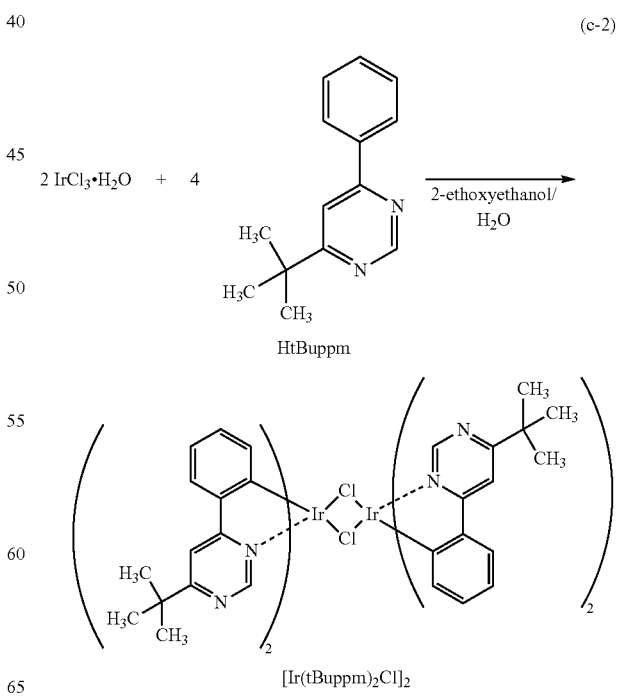

(c-2)

Step 3: Synthesis of (acetylacetonato)bis(6-tert-butyl-4-phenylpyrimidinato)iridium(III) (abbreviation: [Ir(tBuppm)₂(acac)])

Further, into a recovery flask equipped with a reflux pipe were put 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate, and the air in the flask was replaced with argon. Then, irradiation with microwaves (2.45 GHz, 100 W) for 60 minutes was performed to cause reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme of Step 3 is shown by the following (c-3).

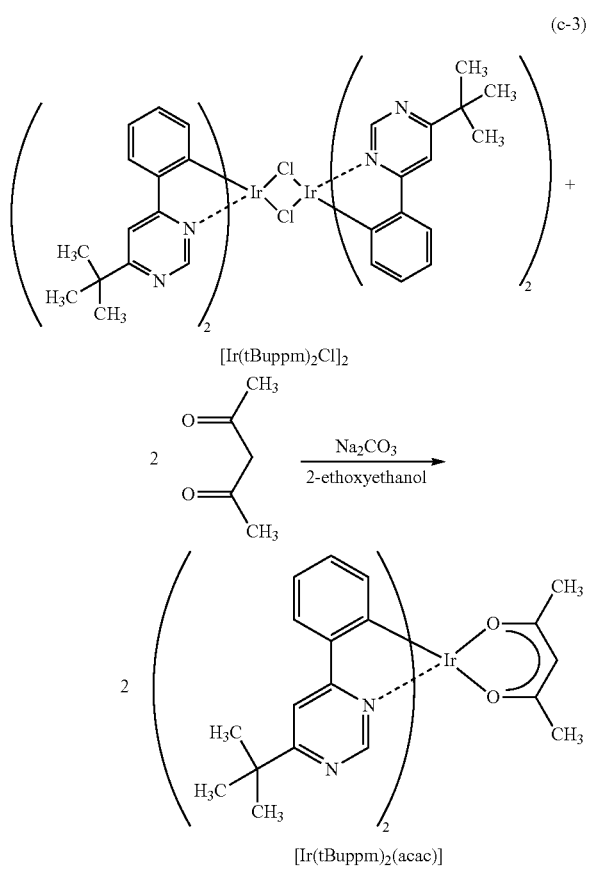

An analysis by nuclear magnetic resonance spectrometry (¹H NMR) of the yellow powder obtained in Step 3 was performed. The analysis result revealed that the objective compound [Ir(tBuppm)₂(acac)] was obtained.

¹H NMR data of the obtained compound is shown below.
¹H NMR. δ (CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

REFERENCE EXAMPLE 4

A synthetic method of an organometallic complex bis[4,6-bis(3-methylphenyl)pyrimidinato](diisobutylylmethano)iridium(III) (another name: (2,6-dimethyl-3,5-heptanedionato-κ²O,O)bis[4-methyl-2-(3-methyl-4-pyrimidinyl-κN3)phenyl-κC]iridium(III)) (abbreviation: [Ir(5mdppm)₂(dibm)]), which is used in Examples described above, is specifically described. A structure of [Ir(5mdppm)₂(dibm)] is shown below.

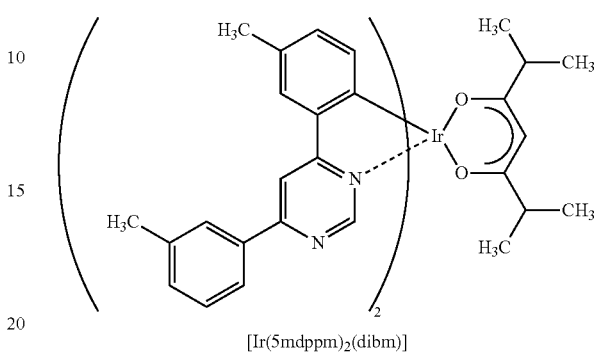

[Ir(5mdppm)₂(dibm)]

Step 1: Synthesis of 4,6-bis(3-methylphenyl)pyrimidine (abbreviation: H5mdppm)

First, into a recovery flask equipped with a reflux pipe were put 4.99 g of 4,6-dichloropyrimidine, 9.23 g of 3-methylphenylboronic acid, 7.18 g of sodium carbonate, 0.29 g of bis(triphenylphosphine)palladium(II)dichloride (abbreviation: Pd(PPh₃)₂Cl₂), 20 mL of water, and 20 mL of acetonitrile, and the air in the flask was replaced with argon. This reaction container was subjected to irradiation with microwaves (2.45 GHz, 100 W) for 60 minutes to be heated. Here, into the flask were further put 2.31 g of 3-methylphenylboronic acid, 1.82 g of sodium carbonate, 0.070 g of Pd(PPh₃)₂Cl₂, 5 mL of water, and 5 mL of acetonitrile, and the mixture was heated again by irradiation with microwaves (2.45 GHz, 100 W) for 60 minutes. Then, water was added to this solution and an organic layer was extracted with dichloromethane. The obtained organic layer was washed with saturated aqueous solution of sodium hydrogen carbonate, water, and saturated saline, and was dried with magnesium sulfate. The solution which had been dried was filtered. The solvent of this solution was distilled off, and then the obtained residue was purified by silica gel column chromatography using dichloromethane and ethyl acetate as a developing solvent in a ratio of 20:1, so that a pyrimidine derivative H5mdppm, which was the objective substance, was obtained (pale yellow powder, yield of 15%). Note that the irradiation with microwaves was performed using a microwave synthesis system (Discover, manufactured by CEM Corporation). A synthesis scheme (d-1) of Step 1 is shown below.

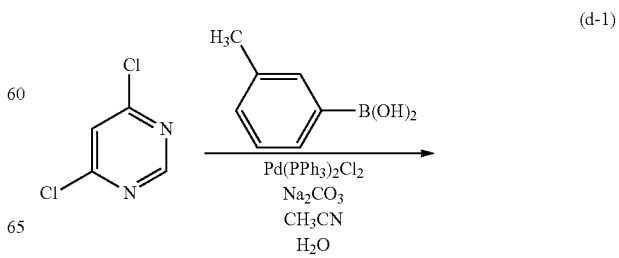

-continued

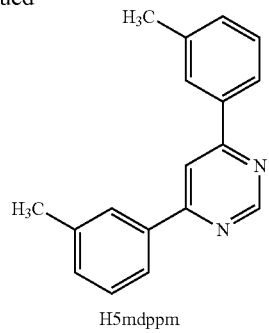

H5mdppm

Step 2: Synthesis of di-μ-chloro-bis{bis[4,6-bis(3-methylphenyl)pyrimidinato]iridium(III)} (abbreviation: [Ir(5mdppm)₂Cl]₂)

Next, into a recovery flask equipped with a reflux pipe were put 15 mL of 2-ethoxyethanol, 5 mL of water, 1.06 g of H5mdppm obtained in Step1, and 0.60 g of iridium chloride hydrate (IrCl₃·H₂O) (produced by Sigma-Aldrich Corp.), and the air in the flask was replaced with argon. Then, irradiation with microwaves (2.45 GHz, 100 W) for one hour was performed to cause reaction. The solvent was distilled off, and then the obtained residue was suction-filtered and washed with ethanol to give a dinuclear complex [Ir(5mdppm)₂Cl]₂ (reddish brown powder, yield of 86%). A synthesis scheme (d-2) of Step 2 is shown below.

Step 3: bis[4,6-bis(3-methylphenyl)pyrimidinato](diisobutylylmethano)iridium(III) (another name: (2,6-dimethyl-3,5-heptanedionato-κ²O,O')bis[4-methyl-2-(3-methyl-4-pyrimidinyl-κN3) phenyl-κC] iridium(TTT)) (abbreviation: [Ir(5mdppm)₂(dibm)])

Next, into a recovery flask equipped with a reflux pipe were put 30 mL of 2-ethoxyethanol, 1.27 g of the dinuclear complex [Ir(5mdppm)₂Cl]₂ obtained in Step 2, 0.40 g of diisobutyrylmethane, and 0.90 g of sodium carbonate, and the air in the flask was replaced with argon. After that, the mixture was heated by irradiation with microwaves (2.45 GHz, 120 W) for 60 minutes. Here, into the flask was further put 0.13 g of diisobutyrylmethane, and the mixture was heated again by irradiation with microwaves (2.45 GHz, 200 W) for 60 minutes. The solvent was distilled off, and the obtained residue was suction-filtered with ethanol. The obtained solid was washed with water and ethanol, and purified by flash column chromatography using dichloromethane as a developing solvent. After that, recrystallization was carried out with a mixed solvent of dichloromethane and ethanol to give orange powder (yield of 15%). A synthesis scheme (d-3) is shown below.

(d-2)

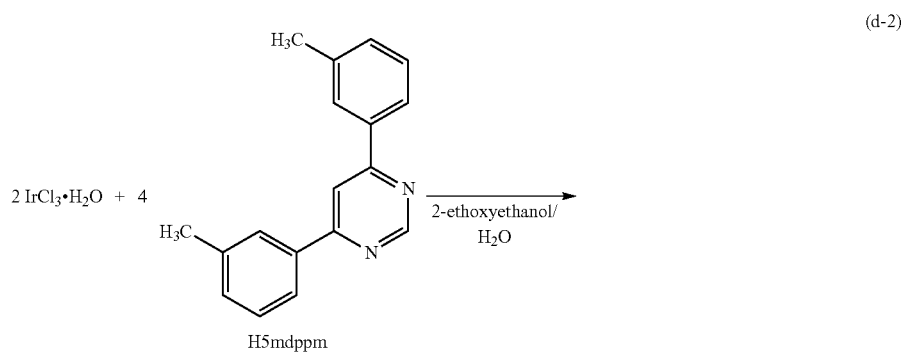

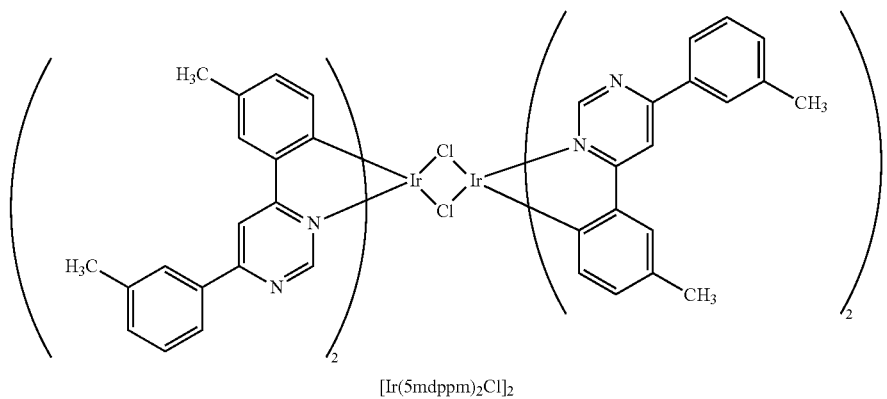

[Ir(5mdppm)₂Cl]₂

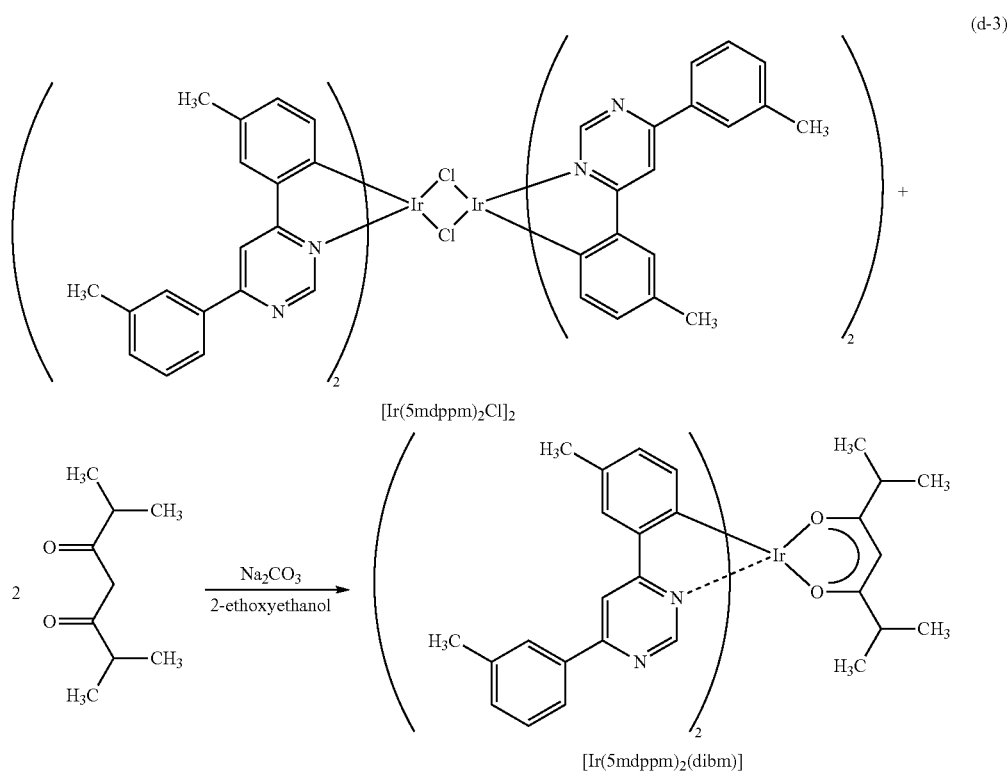

An analysis of the orange powder obtained in the Step 3 by nuclear magnetic resonance spectrometry ($^1$H-NMR) was performed. The analysis result revealed that the objective compound, Ir(5mdppm)$_2$(dibm) was obtained.

$^1$H NMR data of the obtained compound is shown below.

$^1$H NMR. δ (CDCl$_3$): 0.84 (d, 6H), 0.94 (d, 6H), 2.19-2.25 (m, 8H), 2.51 (d, 6H), 5.25 (s, 1H), 6.40 (d, 2H), 6.65 (d, 2H), 7.36 (d, 2H), 7.48 (t, 2H), 7.60 (s, 2H), 8.03 (d, 2H), 8.08 (s, 2H), 8.13 (s, 2H), 9.05 (s, 2H).

Explanation of Reference

100: light-emitting element, 102: substrate, 104: electrode, 106: electrode, 108: first light-emitting layer, 110: second light-emitting layer, 112: third light-emitting layer, 114: first intermediate layer, 116: second intermediate layer, 120: light emission: 122: light emission: 124: light emission: 401: lighting device, 402: lighting device, 403: desk lamp, 405: lighting portion, 406: support, 407: support base, 502: substrate, 504: electrode, 506: electrode, 508: first light-emitting layer, 508a: hole-injection layer, 508b: hole-transport layer, 508c: light-emitting layer, 508d: electron-ransport layer, 510: second light-emitting layer, 510a: hole-transport layer, 510b: light-emitting layer, 510c: electron-transport layer, 512: third light-emitting layer, 512a: hole-transport layer, 512b: light-emitting layer, 512c: electron-transport layer, 512d: electron-njection layer, 514: first intermediate layer, 514a: electron-injection buffer layer, 514b: electron-relay layer, 514c: charge-generation layer, 516: second intermediate Payer, 516a: electron-injection buffer layer, 516b: electron-relay layer, 516c: charge-generation layer, 602: substrate, 604: electrode, 606: electrode, 608: first light-emitting layer, 608a: hole-injection layer, 608b: hole-transport layer, 608c: light-emitting layer, 608d: electron-transport layer, 610: second light-emitting layer, 610a: hole-transport layer, 610b: light-emitting layer, 610c: electron-transport layer, 612: third light-emitting layer, 612a: hole-transport layer, 612b: light-emitting layer, 612c: electron-ransport layer, 612d: electron-injection layer, 614: first intermediate layer, 614a: electron-injection buffer layer, 614b: electron-relay layer, 614c: charge-generation layer, 616: second intermediate layer, 616a: electron-injection buffer layer, 616b: electron-relay layer, 616c: charge-generation layer, 702: substrate, 704: electrode, 706: electrode, 708: first light-emitting layer, 708a: hole-injection layer, 708b: hole-transport layer, 708c: light-emitting layer, 708d: electron-transport layer, 710: second light-emitting layer, 710a: hole-transport layer, 710b: light-emitting layer, 710c: electron-transport layer, 712: third light-emitting layer, 712a: hole-transport layer, 712b-1: light-emitting layer, 712b-2: light-emitting layer, 712c: electron-transport layer, 712d: electron-injection layer, 714: first intermediate layer, 714a: electron-injection buffer layer, 714b: electron-relay layer, 714c: charge-generation layer, 716: second intermediate layer, 716a: electron-injection buffer layer, 716b: electron-relay layer, 716c: charge-generation layer.

This application is based on Japanese Patent Application serial no. 2011-063867 filed with Japan Patent Office on Mar. 23, 2011, the entire contents of which are hereby incorporated by reference.

The invention claimed is:
1. A light-emitting element comprising:
a light-transmitting electrode;
a first light-emitting layer over the light-transmitting electrode;
a first intermediate layer over the first light-emitting layer;
a second light-emitting layer over the first intermediate layer;

a second intermediate layer over the second light-emitting layer;

a third light-emitting layer over the second intermediate layer; and a light-reflecting electrode over the third light-emitting layer, wherein a peak of a spectrum of light emitted from the first light-emitting layer is located on a longer wavelength side as compared to a peak of a spectrum of light emitted from the second light-emitting layer and a peak of a spectrum of light emitted from the third light-emitting layer, wherein the peak of the spectrum of light emitted from the second light-emitting layer is located on a shorter wavelength side as compared to the peak of the spectrum of light emitted from the first light-emitting layer and the peak of the spectrum of light emitted from the third light-emitting layer, wherein an optical path length between the light-reflecting electrode and the first light-emitting layer is three fourths of a peak wavelength of light emitted from the first light-emitting layer, wherein an optical path length between the light-reflecting electrode and the second light-emitting layer is three fourths of a peak wavelength of light emitted from the second light-emitting layer, and wherein an optical path length between the light-reflecting electrode and the third light-emitting layer is one fourth of a peak wavelength of light emitted from the third light-emitting layer.

2. The light-emitting element according to claim 1, wherein the first light-emitting layer includes a light-emitting substance that emits light with a peak in a yellow to orange wavelength range, and the light-emitting substance is a phosphorescent compound.

3. The light-emitting element according to claim 1, wherein the second light-emitting layer includes a light-emitting substance that emits light with a peak in a blue wavelength range, and the light-emitting substance is a fluorescent compound.

4. The light-emitting element according to claim 1, wherein the third light-emitting layer includes a light-emitting substance that emits light in a wavelength shorter than or equal to the wavelength of light emitted from the first light-emitting layer.

5. The light-emitting element according to claim 1, wherein a total thickness of the first light-emitting layer, the second light-emitting layer, the third light-emitting layer, the first intermediate layer, and the second intermediate layer is 400 nm or less.

6. The light-emitting element according to claim 1, wherein the light-reflecting electrode serves as a cathode.

7. The light-emitting element according to claim 1, wherein the first light-emitting layer comprises a yellow to orange emission light-emitting substance, the second light-emitting layer comprises a blue emission light-emitting substance, and the third light-emitting layer comprises a yellow to orange emission light-emitting substance.

8. A lighting device including the light-emitting element according to claim 1.

9. The light-emitting element according to claim 1, a thickness of the first light-emitting layer is larger than a thickness of the second light-emitting layer.

10. A light-emitting element comprising:
a light-transmitting electrode;
a first light-emitting layer over the light-transmitting electrode;
a first intermediate layer over the first light-emitting layer;
a second light-emitting layer over the first intermediate layer;
a second intermediate layer over the second light-emitting layer;
a third light-emitting layer over the second intermediate layer; and
a light-reflecting electrode over the third light-emitting layer, wherein a peak of a spectrum of light emitted from the first light-emitting layer is located on a longer wavelength side as compared to a peak of a spectrum of light emitted from the second light-emitting layer and a peak of a spectrum of light emitted from the third light-emitting layer, wherein the peak of the spectrum of light emitted from the second light-emitting layer is located on a shorter wavelength side as compared to the peak of the spectrum of light emitted from the first light-emitting layer and the peak of the spectrum of light emitted from the third light-emitting layer, wherein the light-emitting element exhibits white emission, wherein an optical path length between the light-reflecting electrode and the first light-emitting layer is three fourths of a peak wavelength of light emitted from the first light-emitting layer, wherein an optical path length between the light-reflecting electrode and the second light-emitting layer is three fourths of a peak wavelength of light emitted from the second light-emitting layer, wherein an optical path length between the light-reflecting electrode and the third light-emitting layer is one fourth of a peak wavelength of light emitted from the third light-emitting layer, and wherein each of the first intermediate layer, and the second intermediate layer include any one selected in a group of molybdenum oxide, vanadium oxide, rhenium oxide and ruthenium oxide.

11. The light-emitting element according to claim 10, wherein the first light-emitting layer includes a light-emitting substance that emits light with a peak in a yellow to orange wavelength range, and the light-emitting substance is a phosphorescent compound.

12. The light-emitting element according to claim 10, wherein the second light-emitting layer includes a light-emitting substance that emits light with a peak in a blue wavelength range, and the light-emitting substance is a fluorescent compound.

13. The light-emitting element according to claim 10, wherein the third light-emitting layer includes a light-emitting substance that emits light in a wavelength shorter than or equal to the wavelength of light emitted from the first light-emitting layer.

14. The light-emitting element according to claim 10, wherein a total thickness of the first light-emitting layer, the second light-emitting layer, the third light-emitting layer, the first intermediate layer, and the second intermediate layer is 400 nm or less.

15. The light-emitting element according to claim 10, wherein the light-reflecting electrode serves as a cathode.

16. The light-emitting element according to claim 10, wherein the first light-emitting layer comprises a yellow to orange emission light-emitting substance, the second light-emitting layer comprises a blue emission light-emitting substance, and the third light-emitting layer comprises a yellow to orange emission light-emitting substance.

17. A lighting device including the light-emitting element according to claim 10.

18. A light-emitting element comprising:
a light-transmitting electrode;
a first light-emitting layer over the light-transmitting electrode;
a first intermediate layer over the first light-emitting layer;
a second light-emitting layer over the first intermediate layer;
a second intermediate layer over the second light-emitting layer;
a third light-emitting layer over the second intermediate layer; and
a light-reflecting electrode over the third light-emitting layer,
wherein a peak of a spectrum of light emitted from the first light-emitting layer is located on a longer wavelength side as compared to a peak of a spectrum of light emitted from the second light-emitting layer and a peak of a spectrum of light emitted from the third light-emitting layer,
wherein the peak of the spectrum of light emitted from the second light-emitting layer is located on a shorter wavelength side as compared to the peak of the spectrum of light emitted from the first light-emitting layer and the peak of the spectrum of light emitted from the third light-emitting layer,
wherein an optical path length between the light-reflecting electrode and the first light-emitting layer is three fourths of a peak wavelength of light emitted from the first light-emitting layer,
wherein an optical path length between the light-reflecting electrode and the second light-emitting layer is three fourths of a peak wavelength of light emitted from the second light-emitting layer,
wherein an optical path length between the light-reflecting electrode and the third light-emitting layer is one fourth of a peak wavelength of light emitted from the third light-emitting layer, and
wherein each of the first intermediate layer, and the second intermediate layer include any one selected in a group of molybdenum oxide, vanadium oxide, rhenium oxide and ruthenium oxide.

19. The light-emitting element according to claim 18, wherein the first light-emitting layer includes a light-emitting substance that emits light with a peak in a yellow to orange wavelength range, and the light-emitting substance is a phosphorescent compound.

20. The light-emitting element according to claim 18, wherein the second light-emitting layer includes a light-emitting substance that emits light with a peak in a blue wavelength range, and the light-emitting substance is a fluorescent compound.

21. The light-emitting element according to claim 18, wherein the third light-emitting layer includes a light-emitting substance that emits light in a wavelength shorter than or equal to the wavelength of light emitted from the first light-emitting layer.

22. The light-emitting element according to claim 18, wherein a total thickness of the first light-emitting layer, the second light-emitting layer, the third light-emitting layer, the first intermediate layer, and the second intermediate layer is 400 nm or less.

23. The light-emitting element according to claim 18, wherein the light-reflecting electrode serves as a cathode.

24. The light-emitting element according to claim 18, wherein the first light-emitting layer comprises a yellow to orange emission light-emitting substance, the second light-emitting layer comprises a blue emission light-emitting substance, and the third light-emitting layer comprises a yellow to orange emission light-emitting substance.

25. A lighting device including the light-emitting element according to claim 18.

* * * * *